United States Patent [19]
Maenishi et al.

[11] Patent Number: 5,018,050
[45] Date of Patent: May 21, 1991

[54] SOLID STATE RELAY

[75] Inventors: Kozo Maenishi, Nagaokakyo; Makoto Watanabe, Takatsuki, both of Japan

[73] Assignee: Omron Tateisi Electronics Co., Kyoto, Japan

[21] Appl. No.: 271,220

[22] Filed: Nov. 14, 1988

[30] Foreign Application Priority Data

| Nov. 17, 1987 | [JP] | Japan | 62-289847 |
| Nov. 19, 1987 | [JP] | Japan | 62-176807[U] |
| Nov. 24, 1987 | [JP] | Japan | 62-179248[U] |
| Nov. 24, 1987 | [JP] | Japan | 62-179249[U] |
| Nov. 26, 1987 | [JP] | Japan | 62-180174[U] |
| Nov. 26, 1987 | [JP] | Japan | 62-180175[U] |
| Nov. 26, 1987 | [JP] | Japan | 62-180176[U] |
| Nov. 26, 1987 | [JP] | Japan | 62-180177[U] |
| Nov. 26, 1987 | [JP] | Japan | 62-298200 |
| Nov. 30, 1987 | [JP] | Japan | 62-182540[U] |
| Nov. 30, 1987 | [JP] | Japan | 62-183576[U] |
| Nov. 30, 1987 | [JP] | Japan | 62-304366 |

[51] Int. Cl.$^5$ .................................................. H05K 7/20
[52] U.S. Cl. ................................... 361/386; 335/202; 361/383; 361/391
[58] Field of Search ............... 335/17, 131, 132, 202; 361/380, 383–384, 386, 388–389, 391–392, 394, 395, 399

[56] References Cited

U.S. PATENT DOCUMENTS

| 4,345,225 | 8/1982 | Lemmer | 335/202 |
| 4,620,263 | 10/1986 | Ito | 361/383 |
| 4,769,557 | 9/1988 | Houf et al. | 361/383 |

FOREIGN PATENT DOCUMENTS

| 2736546 | 2/1979 | Fed. Rep. of Germany | 361/380 |
| 8704499 | 9/1987 | Sweden . | |

OTHER PUBLICATIONS

International Patent Application (PCT) WO 86/02496, Publication Date 4/24/86.

Primary Examiner—Gregory D. Thompson
Attorney, Agent, or Firm—Dickstein, Shapiro & Morin

[57] ABSTRACT

A solid state relay comprises a radiator, a control circuit block and a power circuit cartridge. The radiator has a base portion and a plurality of fins extending from the base portion. The control circuit block has a pair of input terminals and a pair of load terminals and is attached to a front surface of the base portion of the radiator. The power circuit cartridge includes therein a power semiconductor element which is turned on or off by a control circuit in the control circuit block, an absorber which is connected between the pair of load terminals, and a heat radiating plate to radiate heat of the power semiconductor element. The power circuit cartridge is detachably attached to the control circuit block so as to be electrically connected thereto. A through space is formed in the control circuit block so as to pierce from a front surface of the control circuit block to the front surface of the base portion of the radiator. The power circuit cartridge is inserted into the through space. The heat radiating plate of the power circuit cartridge is joined to a portion of the base portion front surface of the radiator.

23 Claims, 52 Drawing Sheets

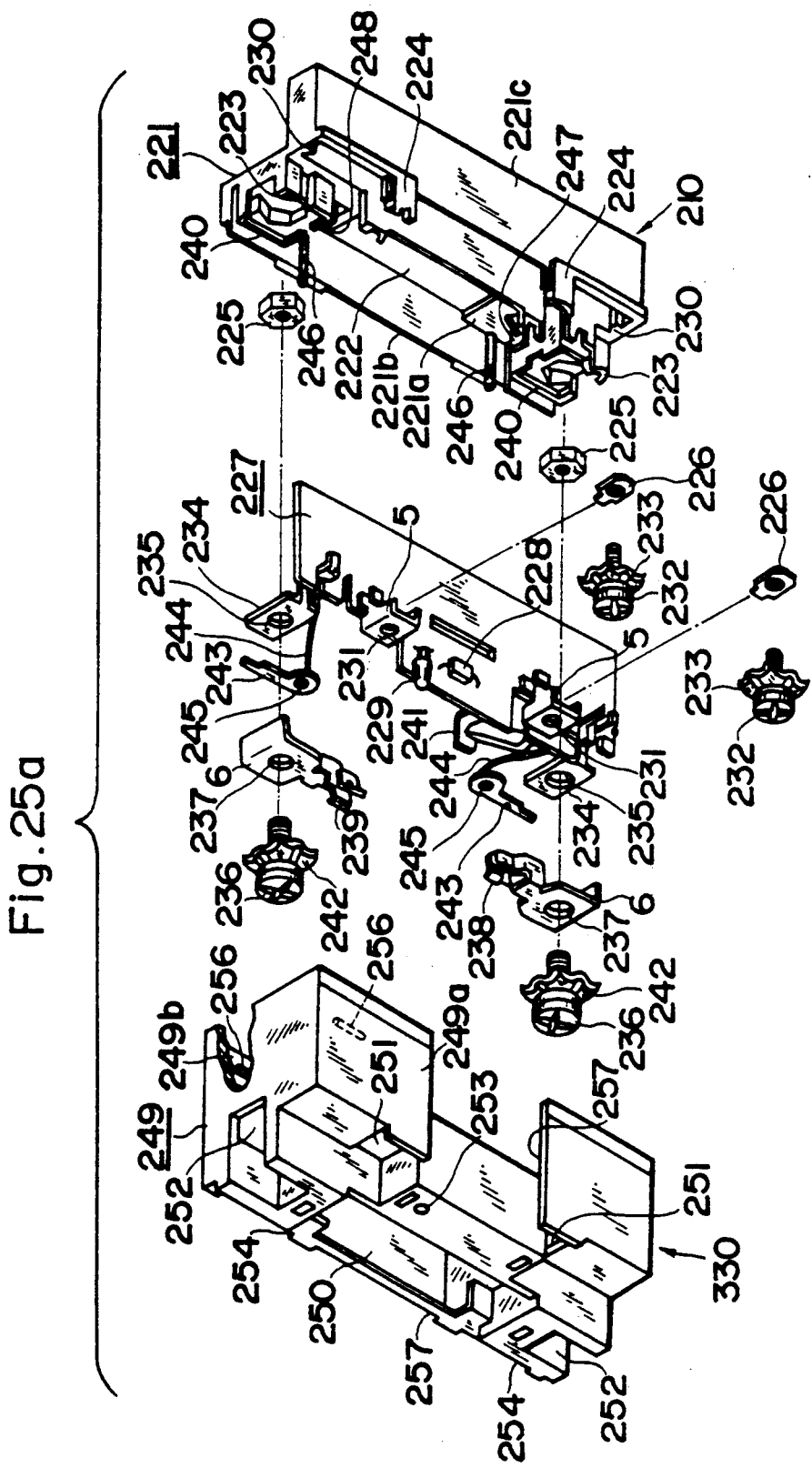

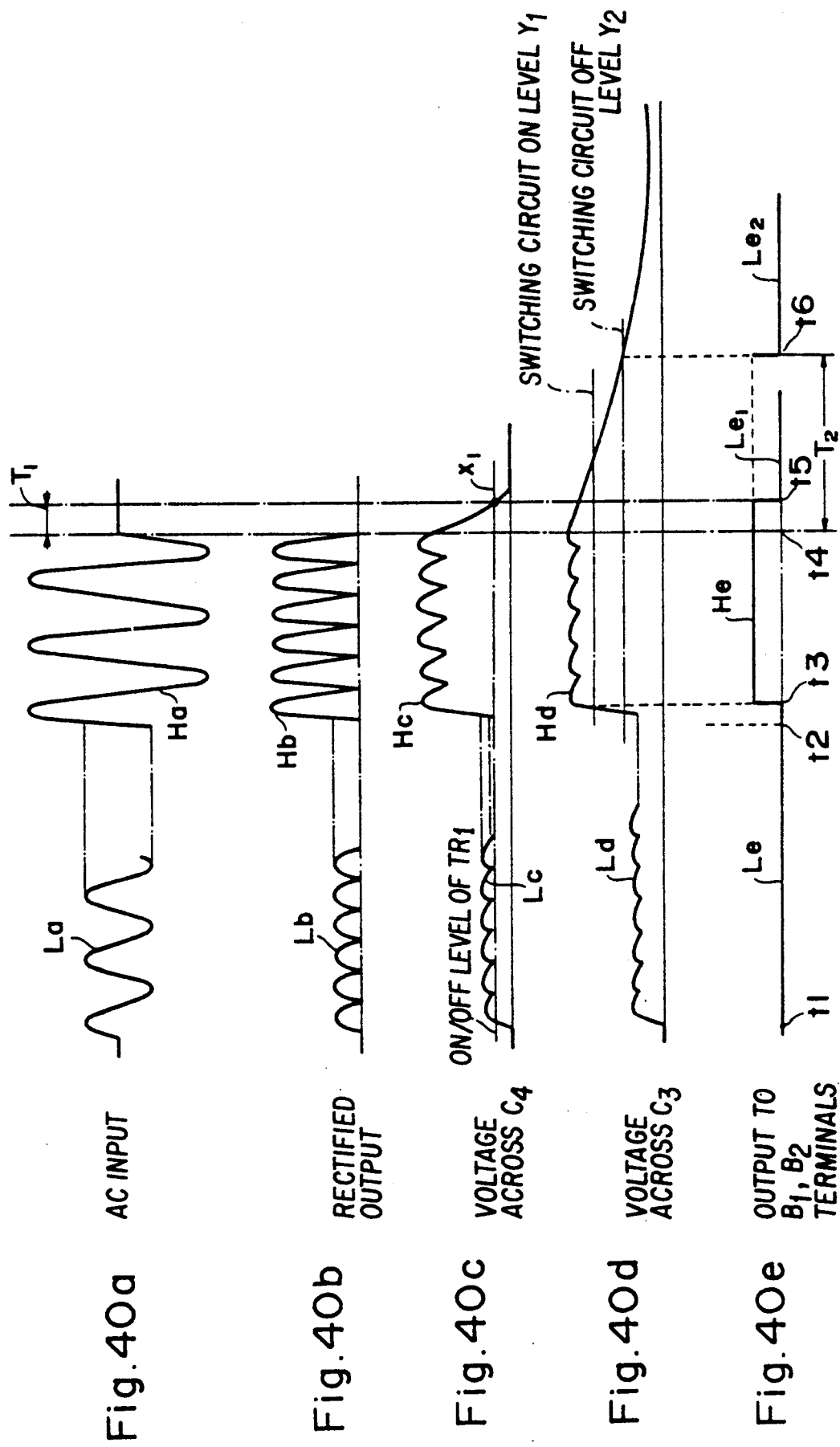

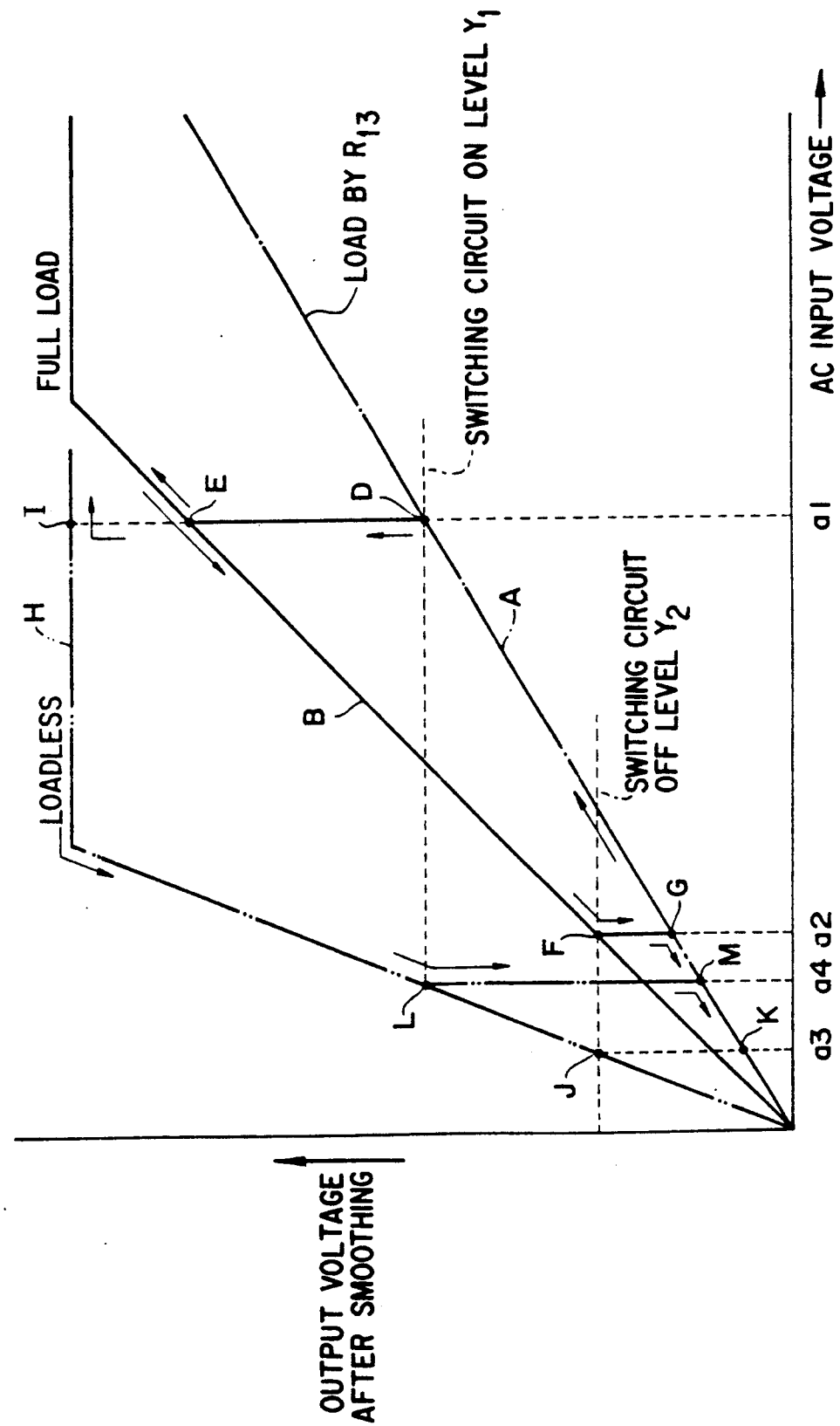

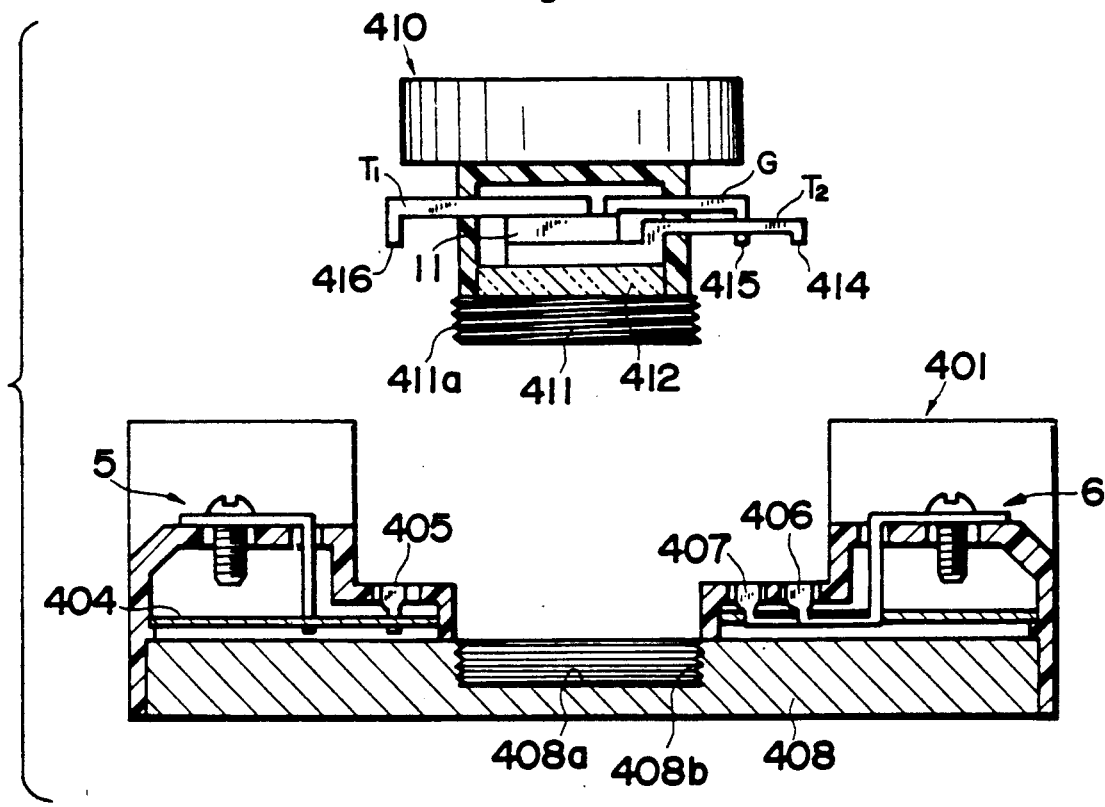
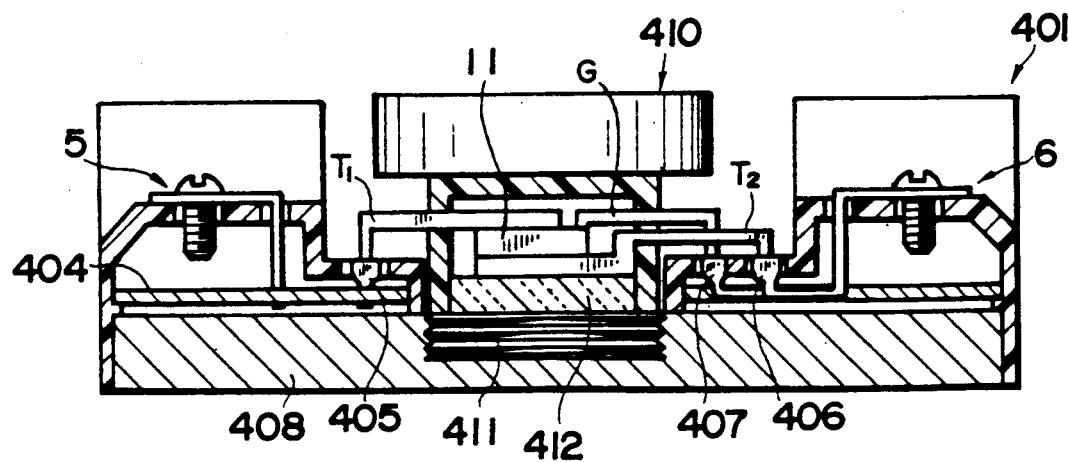

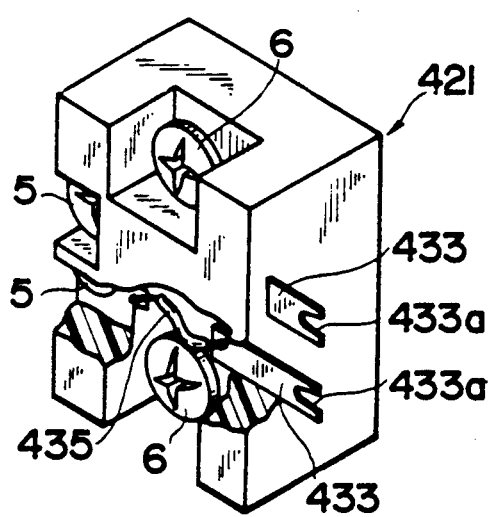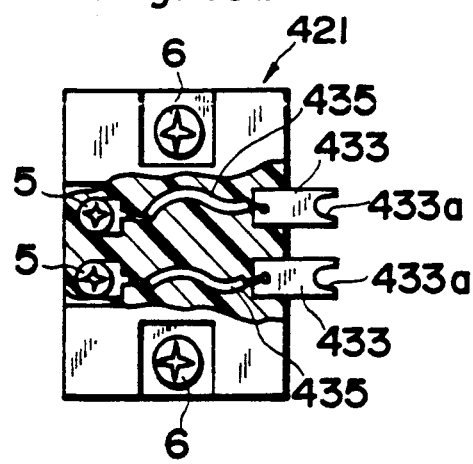

SOLID STATE RELAY

BACKGROUND OF THE INVENTION

1. Field of the Invention

The present invention relates to a solid state relay in which the on/off switching operation of a power source is executed by a semiconductor power element (solid state semiconductor switching element) such as thyristor or triac and a load is turned on or off.

2. Prior Art Statement

Until now, a solid state relay as shown in FIG. 53 has been known as such a kind of solid state relay. In the diagram, reference numeral 511 denotes a control circuit and 512 indicates a power circuit. A series circuit of a light emitting element L such as a light emitting diode and a resistor $R_{41}$ is connected between a pair of input terminals $I_1$ and $I_2$ in the control circuit 511.

Further first and second electrodes $T_1$ and $T_2$ of a semiconductor power element Q, e.g., triac are connected between power source terminals $P_1$ and $P_2$ in the power circuit 512. An anode and a cathode of a photo sensing element J, e.g., a photo thyristor are connected between a trigger terminal G of the triac Q and the first electrode $T_1$ through a resistor $R_{42}$. Further, a resistor $R_{43}$ is connected between the second electrode $T_2$ of the triac and the trigger terminal G.

In addition, a series circuit consisting of a resistor $R_{44}$ for surge prevention and a capacitor C and an absorber consisting of a varistor Ba are connected in parallel between the first and second electrodes $T_1$ and $T_2$ of the triac Q. A series circuit consisting of an AC power source E and a load Z is connected between the power source terminals $P_1$ and $P_2$.

In the above construction, an input signal is applied between the input terminals $I_1$ and $I_2$. The photo sensing element J receives the light from the light emitting element L and is made operative. The photo sensing element J applies a trigger signal to the triac Q. Due to the activation of the triac Q, a current is supplied to the load Z through the triac Q.

Next, when the supply of the input signal is stopped and the light emitting element L is lit off, the photo sensing element J is made inoperative. No trigger signal is applied to the triac Q. The triac Q is turned off at the zero-cross point of a power source voltage, thereby stopping the current supply to the load Z.

In this manner, the on/off switching operation of the load current is performed by the triac Q in a contactless manner.

However, during the current supply to the load Z, if the portion between the power source terminals $P_1$ and $P_2$ is short-circuited due to an unexpected accident, an abnormal current flows through the triac Q, so that the triac Q is broken. In addition, even when a rated current is supplied, there is a case where the triac Q deteriorates over a period of time and is broken due to heat generation caused by a large current flowing through the triac Q.

Furthermore, in the conventional solid state relay, as shown in FIG. 54, the triac Q is fixed through an electric insulative plate 503 onto a heat radiating plate 502 fixed to a terminal base 501. Each terminal of the triac Q is electrically connected and fixed to a printed board 506 on which the control circuit 511 and power circuit 512 are assembled and to external terminals 507 and 508. Therefore, it is extremely difficult to replace only the triac Q and as a result, the whole assembly must be replaced which is uneconomical.

The power semiconductor element can be easily broken by the short-circuit accident or abnormal increase in temperature. The absorber element also deteriorates over a period of time. Therefore, when the power semiconductor element fails, it is important to exchange both the semiconductor element and the absorber for the purpose of improving reliability.

However, in the conventional relay, not only the power semiconductor element but also the absorber are assembled together with the other circuits on, for instance, the same circuit board. Therefore, when either one of them needs replacing, the whole assembly including the input circuit and the like must be replaced which is uneconomical. Also, even during replacement, detaching all of the wires can be complicated. Thus, there is a fear that erroneous wiring may be performed unless careful attention is paid to the rewiring work upon repair.

On the other hand, as shown in FIG. 55, there has been known a power source apparatus in which an AC input applied between a pair of input terminals is rectified by a rectifier and its output is smoothed by a smoothing circuit and is output to an output terminal. In the diagram, a rectifier 521 has a diode bridge circuit 522. One of AC terminals of the bridge circuit 522 is connected to an input terminal $A_1$ through a parallel circuit of capacitors $C_{51}$ and $C_{52}$. The other AC terminal of the bridge circuit 522 is connected to the other input terminal $A_2$ through a parallel circuit of resistors $R_{51}$ and $R_{52}$.

The varistor Ba is connected in parallel between the pair of input terminals $A_1$ and $A_2$. The varistor Ba constructs the absorber to absorb the surge. Zener diodes $ZD_{21}$ and $ZD_{22}$ are connected in parallel between DC output terminals of the rectifier 522. The Zener diodes $ZD_{21}$ and $ZD_{22}$ construct a clipper circuit to prevent the voltage which is full wave rectified and exceeds a specified value. Resistors $R_{53}$ and $R_{54}$ are respectively serially connected to these Zener diodes. Currents flowing through these Zener diodes are distributed with a good balance. The rectifier 521 is constructed in this manner.

A smoothing capacitor $C_{53}$ is connected in parallel between the output terminals of the rectifier 521 and constructs a smoothing circuit 523 to smooth the output. The DC output smoothed by the smoothing circuit 523 is output to a pair of output terminals $B_1$ and $B_2$ to which the load Z is connected.

In the above construction, when an AC input is applied between the input terminals $A_1$ and $A_2$, the AC input is full wave rectified by the rectifier 521. The DC output of the rectifier 521 is smoothed by the smoothing circuit 523 and a current is supplied to the load Z through the output terminals $B_1$ and $B_2$.

However, according to this construction, if a smoothing efficiency of the output voltage of the smoothing circuit 523 is intended to be improved, the capacity of the capacitor $C_{53}$ needs to be enlarged in association with the improvement of the smoothing efficiency. Therefore, the response speed of the output to the input in this kind of power source apparatus becomes slow. For instance, in the case of driving the load Z such as a solid state relay or the like in which a triac is assembled, there is a drawback such that the load Z cannot be switched on or off at a high speed.

On the other hand, since the response speed of the power source apparatus depends on an impedance of the load Z, there is a drawback such that the response speed of the power source apparatus must be individually measured for every load Z that is connected.

Further, since the smoothed output voltage includes a ripple component and changes in an analog-wise manner when the AC input is turned on or off, there is a drawback such that when the valley of the ripple of (minimum of) the changed output voltage is within an allowable voltage range of the load Z, the operation of the load Z becomes unstable and this may cause a malfunction or an unexpected accident.

As an example of using the solid state relay, there is a case where a three-phase load is controlled as shown in FIG. 56. That is, $M_1$, $M_2$ and $M_3$ denote three solid state relays. A three-phase power source 533 is connected to one of the pair of load terminals 6 of each of the solid state relays $M_1$ to $M_3$. A heater 534 as a load is connected to the other load terminals 6. In the case of controlling the heater 534 by one input operating control circuit 530 having a DC power source 531 and an operating switch 532, the input operating control circuit 530 is connected in parallel to each input terminal 5 of the relays $M_1$ to $M_3$. However, in the foregoing conventional construction, the input operating control circuit 530 must be individually wired to each input terminal 5 of the relays $M_1$ to $M_3$ by lead wires. The wiring works are complicated and large enough wiring work space or the like must be provided.

On the other hand, as shown in FIG. 57, in the case where a plurality of loads, e.g., a first load circuit 560 having an AC power source 561, a switch 562 and a heater 563, a second load circuit 550 having a DC power source 551, a switch 552 and a lamp 553, and a third circuit consisting of the three-phase AC power source 533 and a motor 540 are switched on or off controlled by the single input operating control circuit 530 through the solid state relays $M_1$, $M_2$, $M_3$ and $M_4$, the wiring works upon installation are also complicated as mentioned above.

In such solid state relays, there is a case where a functional circuit such as an AC/DC converter, voltage detecting circuit, etc. is added as an input circuit to the preceding stage of the input terminal 5. If such a functional circuit is included in the relay main body, a variety of types of relays must be prepared for various requirements of the users. Further, the added functional circuit becomes unnecessary or it is difficult to detach at the time of maintenance or the like. On the other hand, when various kinds of functional circuits are individually constructed as the units, the complicated wiring works must be executed upon installation. For instance, as shown in FIG. 58, there is an arrangement such that the 3-phase AC power source 533 is connected to one load terminal 6 of each of three solid state relays $M_1$, $M_2$ and $M_3$ each having the pair of input terminals 5 and a pair of load terminals 6 and the motor 540 is connected to the other load terminals 6, respectively. In this arrangement, when an AC/DC converter unit 571 and a voltage detecting circuit unit 572 which are connected to the input operating control circuit 530 having an AC power source 531A and the switch 532 are added, as well as the wiring between the AC/DC converter unit 571 and the voltage detecting circuit unit 572, the input terminals 5 of the solid state relays $M_1$ to $M_3$ must be connected in parallel with the output side of the voltage detecting circuit unit 572, respectively. Thus, the wiring works are complicated and the space for wiring is large.

SUMMARY OF THE INVENTION

It is an object of the present invention to provide a solid state relay in which a power circuit having a power semiconductor element and an absorber can be integrally exchanged, it becomes economical, the assembling working efficiency upon repair or the like can be improved, and the heat radiating effect is high.

Another object of the invention is to provide a solid state relay in which a power circuit having a power semiconductor element and an absorber can be integrally exchanged, it becomes economical, the assembling working efficiency upon repair or the like can be improved, and the miniaturization can be realized.

Still another object of the invention is to provide a terminal apparatus in which when apparatuses such as solid sate relays are electrically connected, they are connected without attaching other separate members to terminals, the number of wiring steps can be reduced, an amount of wiring material can be reduced, and the cost can be remarkably reduced.

Still another object of the invention is to provide a power source apparatus in which the response speed of the on/off switching operation of a load is high and there is no fear of occurrence of a malfunction.

Still another object of the invention is to provide a solid state relay which can easily exchange a semiconductor power element such as a triac and is very economical.

Still another object of the invention is to provide a switching apparatus in which the troublesomeness of the wiring works on the input operating circuit side can be fairly reduced and a small space can be realized.

Still another object of the invention is to provide a switching apparatus in which a functional circuit can be arbitrarily selected and added as an input circuit to the preceding stage of an apparatus main body, the troublesomeness of the wiring works can be reduced, and an installation space can be also reduced.

According to the invention, the above objects are accomplished by a solid state relay comprising: (a) a heat radiator having a base portion and fins extending from the base portion; (b) a control circuit block which has a pair of input terminals and a pair of load terminals and is attached to the front surface of the base portion of the heat radiator; and (c) a power circuit cartridge having therein a power semiconductor element which is turned on or off by a control circuit provided in the control circuit block, an absorber which is connected between the pair of load terminals, and a heat radiating plate to radiate the heat of the power semiconductor element, this cartridge being detachably attached to the control circuit block so as to be electrically connected, wherein a through space which pierces from the front surface of the control circuit block to the front surface of the base portion of the heat radiator is formed in the control circuit block, the power circuit cartridge is inserted in the through space, and the heat radiating plate of the power circuit cartridge is joined to the portion of the front surface of the base portion of the heat radiator.

According to the invention, the power circuit cartridge having therein at least the power semiconductor element and absorber is detachably attached to the control circuit block. Therefore, if the power semiconductor element is broken or any one of the parts of the absorber deteriorates, by merely exchanging the power circuit cartridge, the other circuits can be used without changing them. This method is economical. Moreover, the wiring works are unnecessary and the repairing work can be easily performed. Particularly, since the heat radiating plate in the power circuit cartridge is joined to the portion of the front surface of the base portion of the heat radiator, the heat radiating efficiency can be improved. Further, the assembling efficiency of the power circuit cartridge can be also improved by the guide operation of the through space.

According to the invention, those objects are accomplished by a solid state relay comprising: (a) a heat radiator having a base portion and fins extending from the base portion; (b) a control circuit block which has a printed circuit board provided with a pair of input terminals, a pair of load terminals and a control circuit and which is attached to a front surface of the base portion of the heat radiator; and (c) a power circuit cartridge having therein a power semiconductor element which is turned on or off by a control circuit provided in the control circuit block, an absorber which is connected between the pair of load terminals, and a heat radiating plate to radiate the heat of the power semiconductor element, this cartridge being detachably attached to the heat radiator so as to be electrically connected to the control circuit block, wherein the control circuit block has a box-shaped enclosing portion to enclose the printed circuit board, at least two groove portions are formed on the front surface of the base portion of the heat radiator, the box-shaped enclosing portion is inserted into one of the groove portions, the printed circuit board is vertical to the front surface of the base portion in this inserted state, and the power circuit cartridge is inserted into the other groove portion.

According to the invention, the power circuit cartridge having therein at least the power semiconductor element and absorber is detachably attached to the heat radiator. Therefore, if the power semiconductor element is broken or any one of the parts of the absorber deteriorates, by merely exchanging the power circuit cartridge, the other circuits can be used without changing them. This method is economical. The wiring works are unnecessary and the repairing work can be easily performed. In particular, the base plate enclosing portion in the control circuit block and the power circuit cartridge are inserted in at least a pair of grooves formed on the front surface of the base portion of the heat radiator. Thus, the assembling efficiency of them is improved and the apparatus can be made thin due to the effective use of the space, and the like.

According to the invention, those objects are accomplished by a terminal apparatus comprising: a terminal member having a screw hole; a coupling terminal having an adjusting long hole in which an arm for connection is projected from one end; and a terminal screw to which a terminal washer is attached so as to be freely inserted, wherein the terminal screw is attached to the screw hole of the terminal member through the adjusting long hole of the coupling terminal and the coupling terminal is rotatably attached to the terminal member, thereby enabling the connecting arm of the coupling terminal to be freely joined to a terminal of an another apparatus and to be fixedly connected thereto by the threading operation of the terminal screw.

That is, in the terminal apparatus according to the invention, the terminal screw to which the terminal washer is attached so as to be freely inserted is inserted to the adjusting long hole of the coupling terminal in which the connecting arm is projected from one side and is attached to the screw hole of the terminal member. Therefore, the coupling terminal can be rotatably attached to the terminal member, so that the connecting arm of the coupling terminal can be freely joined to the terminal of the another apparatus. Also, the coupling terminal is fastened to the terminal member by the threading operation of the terminal screw, thereby connecting and fixing the connecting arm to the terminal of the another apparatus.

Therefore, according to the invention, when apparatuses are electrically connected, they can be connected without complicatedly attaching other separate parts such as crossover or the like to the respective terminals. Thus, the number of wiring steps can be reduced, an amount of wiring material can be reduced, and the cost can be remarkably reduced.

According to the invention, a power source apparatus comprises: an output circuit for turning on or off a DC output smoothed through a smoothing circuit by a semiconductor switching element and for outputting to a pair of output terminals; a switching circuit for turning on the semiconductor switching element when the output voltage of the smoothing circuit reaches a specified value; and a voltage detecting circuit which is connected in parallel between output terminals of the rectifier and detects the outputs of the rectifier with a time constant smaller than a time constant of the smoothing circuit and applies this detection output to the switching circuit, thereby turning off the semiconductor switching element.

In the above construction, there is provided a switching circuit which outputs the output voltage when the smoothed output voltage reaches the specified value. Therefore, even if a ripple component exists in the smoothed output voltage, the output voltage which is generated across the output terminals digitally changes. Moreover, since the lower limit value of the return voltage of the switching circuit is determined by the voltage detecting circuit, even below an allowable voltage range of the load, the operation of the load becomes stable and a malfunction or an unexpected accident can be effectively prevented.

On the other hand, since the switching circuit is turned on or off by the voltage detecting circuit having a short time constant, the return time of the switching circuit is remarkably reduced as compared with the return time in the case where the voltage detecting circuit is not arranged. Therefore, the turning on/off operation can be performed at a high speed.

Further, when the input voltage reaches a predetermined value, the return voltage of the switching circuit is decided by the internal resistor and is not influenced by the load impedance. Consequently, the return voltage of the switching circuit is always held to be constant. It is unnecessary to individually measure the response speed of the power source apparatus every load to be connected as in the conventional apparatus.

According to the invention, there is provided a solid state relay comprising: a terminal base having input terminals and load terminals and including a control circuit and a power circuit; and a power element unit detachably attached to the terminal base and having therein a semiconductor power element which is separated from the power circuit, wherein the power element unit is detachably attached to the terminal base and the semiconductor power element is electrically connected to the power circuit.

As mentioned above, the semiconductor power element is separated from the power circuit provided to the terminal base, the power element unit having therein the separated semiconductor power element is detachably attached to the terminal base, and the semiconductor power element is electrically connected to the power circuit. If the semiconductor power element unit is damaged, it is sufficient to exchange and assemble only the semiconductor power element unit with the terminal base held as it is. Therefore, the number of vain parts is reduced and the apparatus is very economical and cheap.

According to the invention, there is provided a switching apparatus including an apparatus main body having a pair of input terminals and a pair of load terminals wherein the apparatus main body is provided with a pair of coupling terminals which are respectively electrically connected to the input terminals and are detachably attached to the pair of input terminals of another apparatus main body so as to be electrically connected thereto.

According to the invention, in the case of controlling a load by using a plurality of switching apparatuses, by connecting a pair of coupling terminals to a pair of input terminals of the adjacent switching apparatus, the wiring between the input terminals of the switching apparatuses becomes unnecessary. Therefore, the complicated wiring works between the input operating circuit and the input terminals are eliminated. Also, the space for the wiring works between the switching apparatuses is also unnecessary and the space can be effectively used.

According to the invention, there is provided a switching apparatus comprising: an apparatus main body having a pair of input terminals and a pair of load terminals; and a functional circuit unit which is constructed as an input circuit of the apparatus main body and has a pair of input terminals and a pair of output terminals, wherein the pair of output terminals of the functional circuit unit are constructed as the coupling terminals which are detachably attached to the pair of input terminals of the apparatus main body or of another functional circuit unit so as to be electrically connected.

According to the invention, since the functional circuits are constructed as the units, a desired functional circuit can be selectively used and the generality can be widened. Moreover, the functional circuit unit can be detachably coupled with another functional circuit unit or the apparatus main body. Therefore, the troublesomeness of the wiring works is remarkably reduced and there is no need to provide a large space for the wiring works.

BRIEF DESCRIPTION OF THE DRAWINGS

FIGS. 25a, 25b, and 25c are exploded perspective views of the whole solid state relay;

FIGS. 40a to 40e are voltage waveform diagrams for explaining the operations;

FIG. 41 is a characteristic diagram of the power source apparatus;

FIGS. 43a and 44a are exploded cross sectional views showing other different modifications of a solid state relay, respectively;

FIGS. 43b and 44b are cross sectional views showing a state in which the solid state relay is assembled;

FIGS. 45a and 45b are a perspective view with a part cut away and a front view with a part cut away showing an example in which a switching apparatus according to the invention is applied to a solid state relay, respectively;

DETAILED DESCRIPTION OF THE PREFERRED EMBODIMENTS

An embodiment of the present invention will be described hereinbelow with reference to the drawings.

Figure 1:
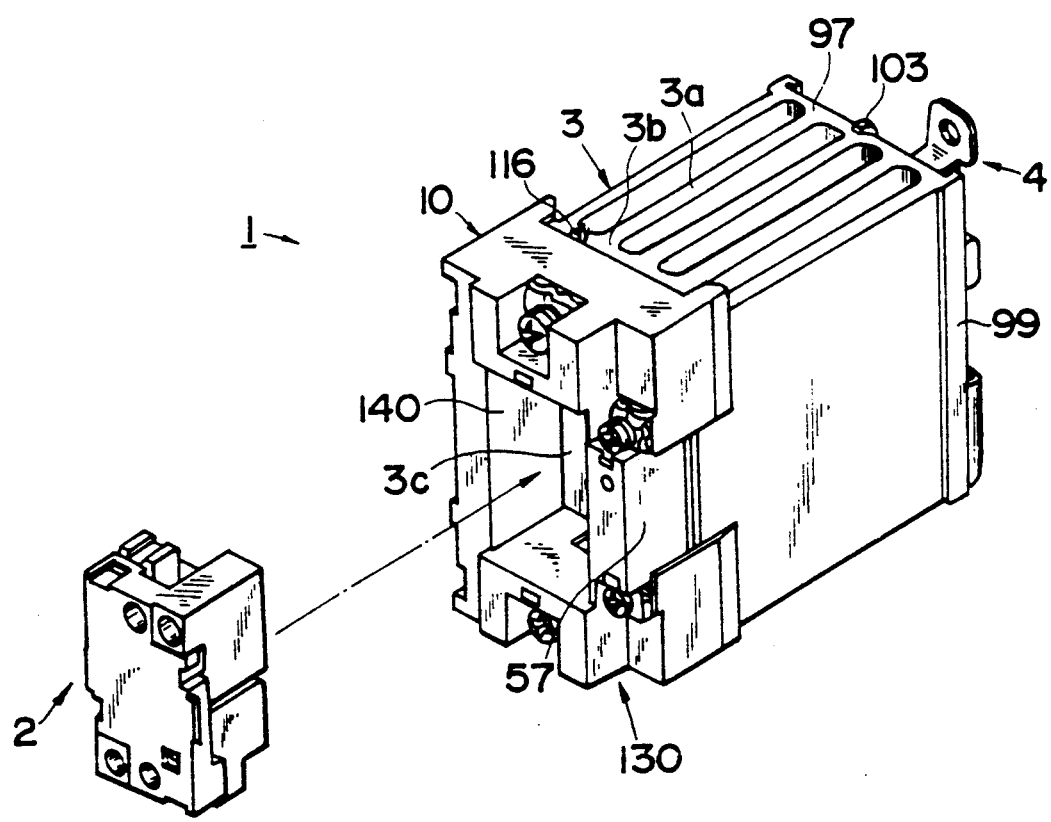
FIG. 1 is a perspective view of an embodiment of a solid state relay showing a state in which a power circuit cartridge is detached from the relay.
Figure 2:
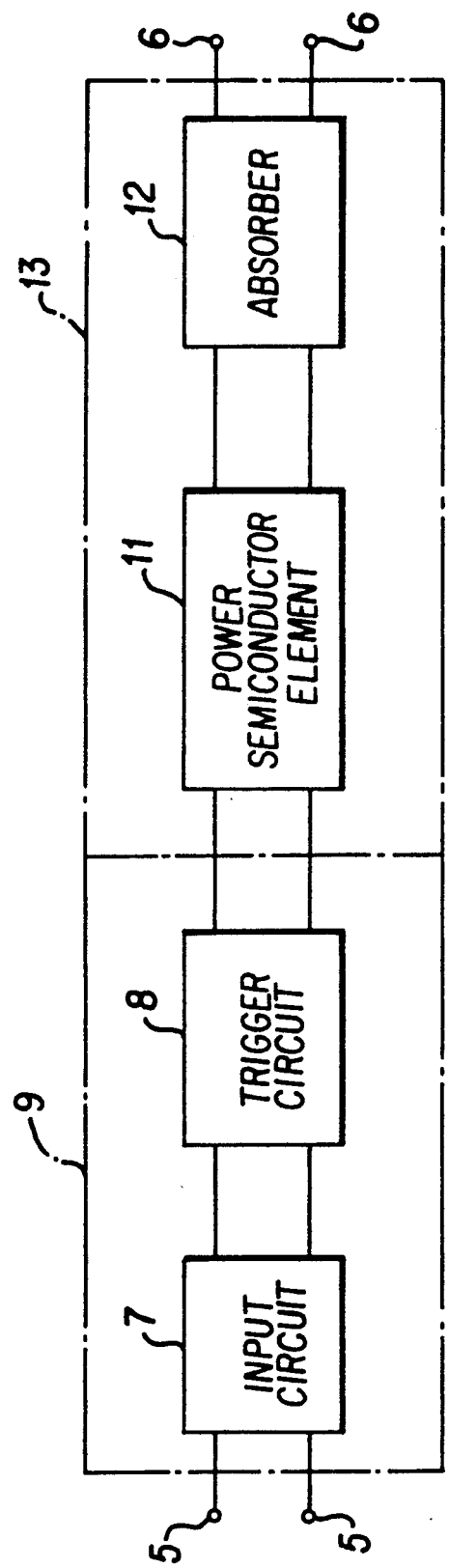
FIG. 2 is a block diagram showing an electrical arrangement of the solid state relay.

FIGS. 1 and 2 are a perspective view showing an example of a solid state relay according to the invention and an electric circuit block diagram, respectively.

In the diagram, reference numeral 1 denotes a relay main body; 2 is a power circuit cartridge; 3 a heat radiator having a fin portion 3a; and 4 an attaching device which is attached on the front edge side of the fin portion 3a. The relay main body 1 has a pair of input terminals 5 and a pair of load terminals 6 and comprises: a control circuit block 10 having therein a control circuit 9 consisting of an input circuit 7 and a trigger circuit 8; and the heat radiator 3. The control circuit block 10 is attached to the side of a front surface 3c of a base portion 3b of the heat radiator 3. The power circuit cartridge 2 includes a power circuit 13 having a power semiconductor element, e.g., a triac 11 and an absorber 12 for surge absorption. The triac 11 is driven by the trigger circuit 8 and switches on or off a load (not shown). The power circuit cartridge 2 is detachably attached to the relay main body 1 so as to be electrically connected thereto.

When considering from a different view point, the relay main body 1 is constructed by the control circuit block 10 and the power circuit cartridge 2. The relay main body 1 is attached to the base portion 3b of the radiator 3. In this case, it is considered that the cartridge 2 is detachably attached to the control circuit block 10.

Figure 3A:
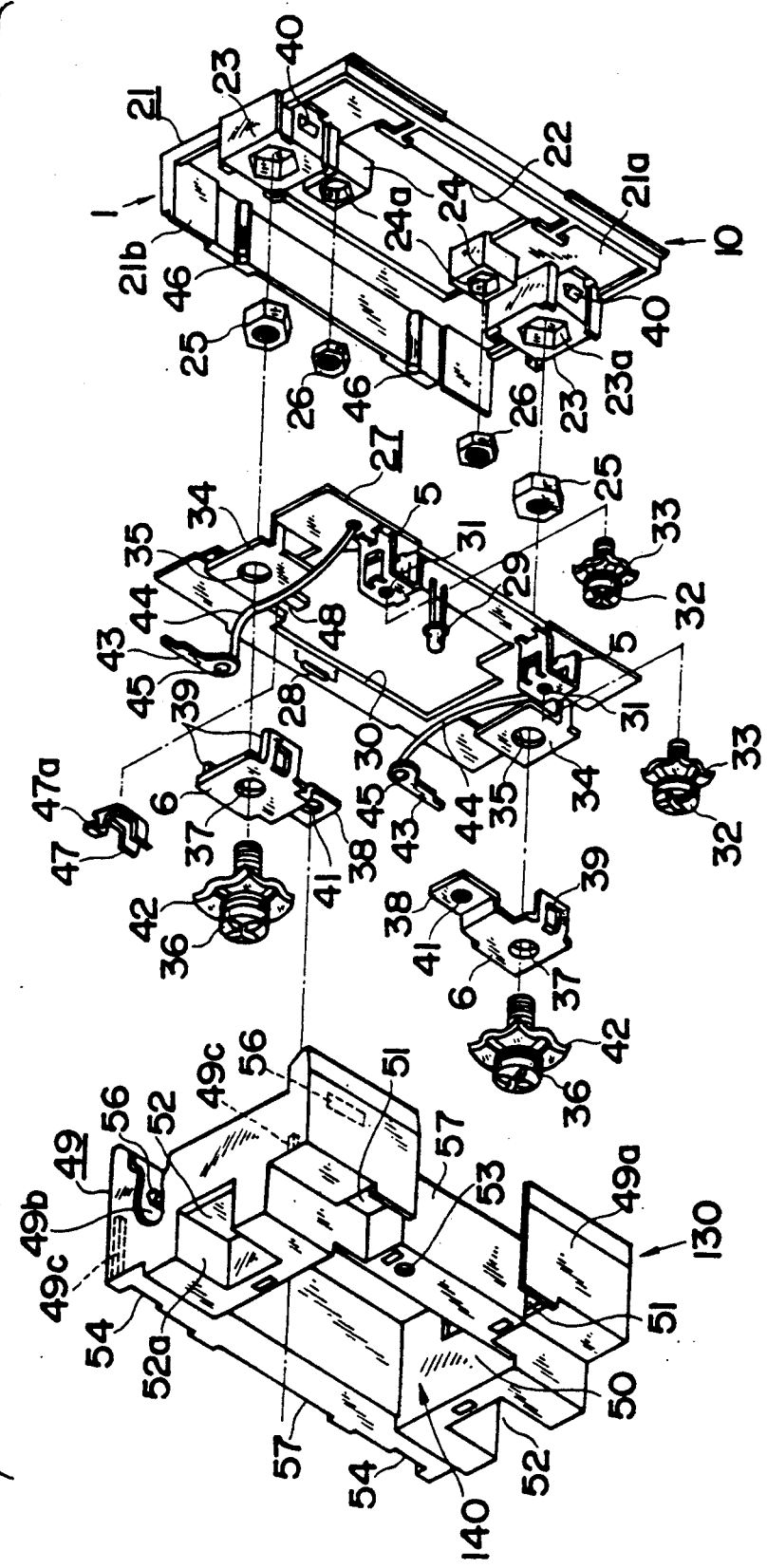
FIGS. 3a, 3b, and 3c are exploded perspective views of the whole solid state relay.
Figure 3B:
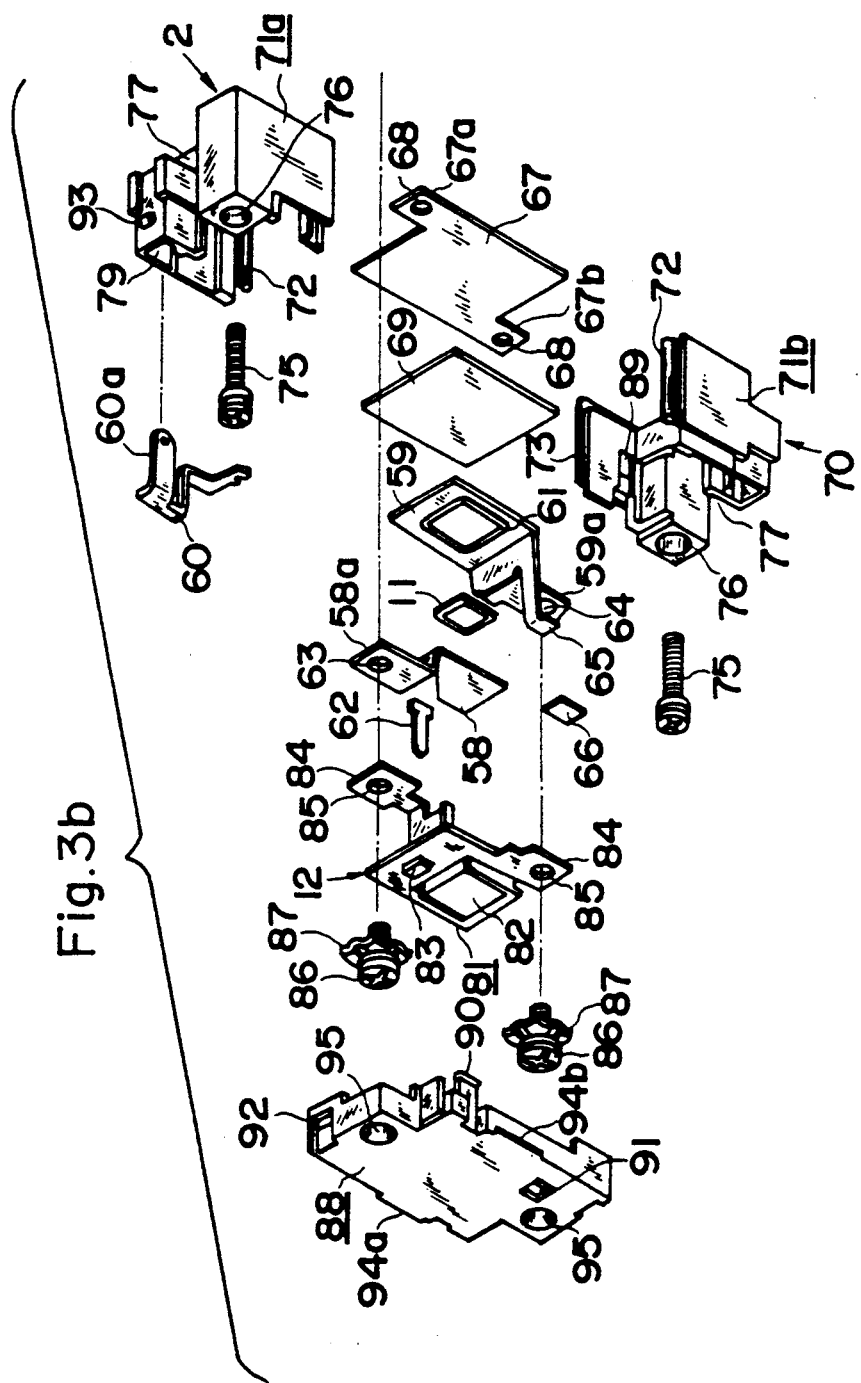
Figure 3C:
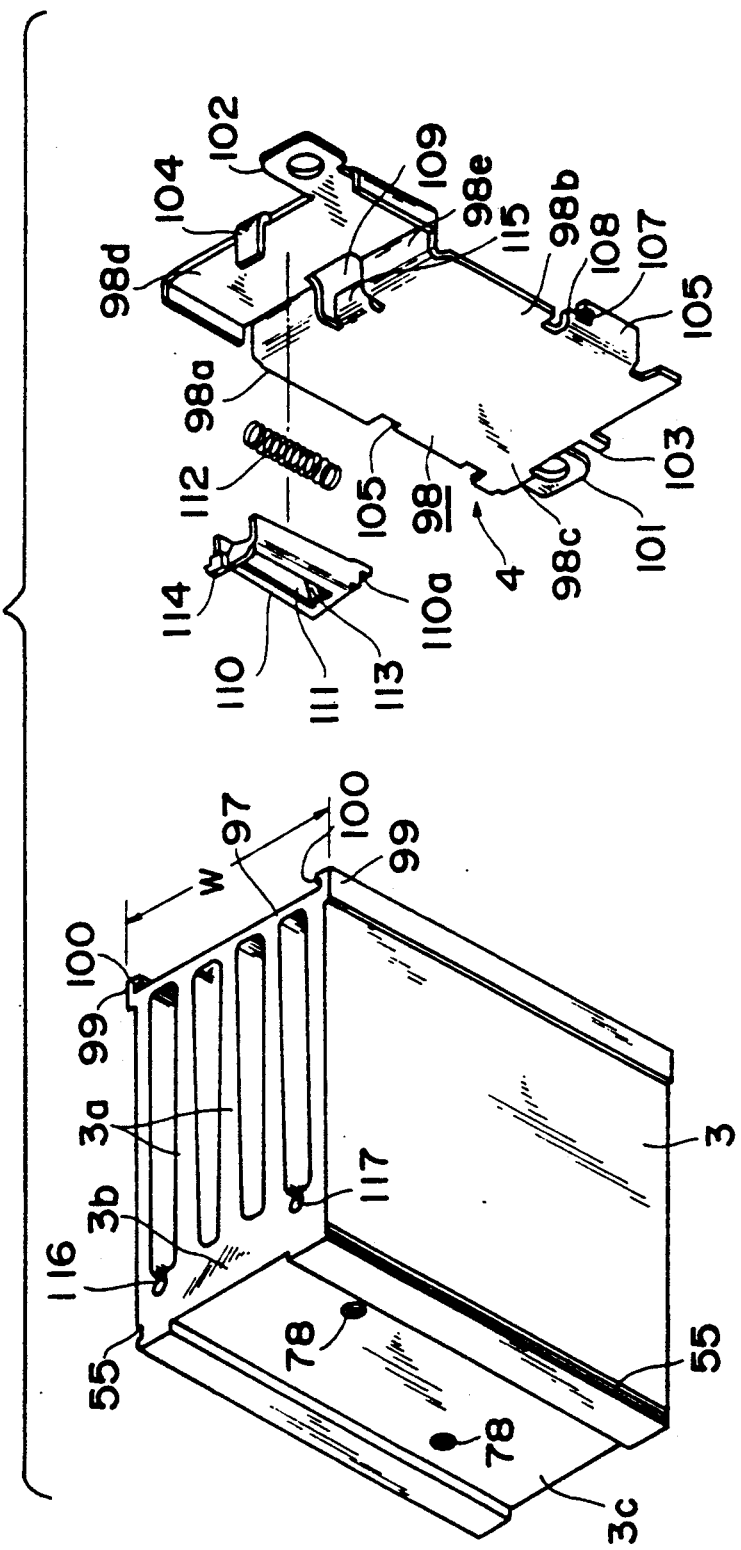

The solid state relay will be described in detail. FIGS. 3a to 3c are exploded perspective views of the solid state relay.

In the diagram, reference numeral 21 denotes a base made of an insulative synthetic resin in the control circuit block 10. An opening 22 is formed in almost the central portion of a rectangular bottom wall portion 21a. A vertical wall 21b is formed at one end in the width direction (lateral direction). Further, base-shaped nut holding portions 23 and 24 serving as boss portions to set terminals are formed on both end sides in the longitudinal direction (vertical direction), respectively. Nuts 25 for the load terminals are inserted into concave portions 23a of the nut holding portions 23, respectively. Nuts 26 for the cartridge are inserted into concave portions 24a of the nut holding portions 24, respectively.

Figure 4:
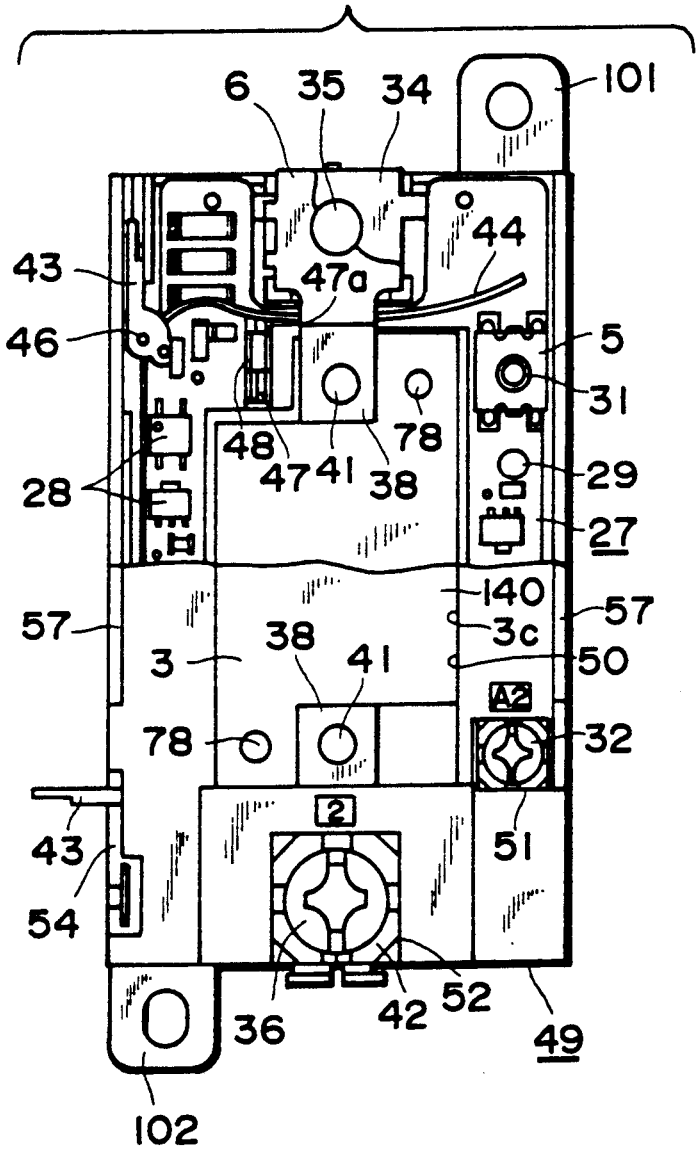
FIG. 4 is a front view with a part cut away of the solid state relay showing a state in which the power circuit cartridge is detached from the relay.

Reference numeral 27 denotes a printed circuit board arranged over the bottom wall portion 21a of the base 21. As shown in FIG. 4, a component element 28 of the control circuit 9 and a light emitting element 29 to display the operation and the like are attached onto the board 27. An opening 30 is formed in correspondence to the opening 22 of the base 21. The input terminals 5 are made of U-shaped metal fittings and are fixed to predetermined positions of the printed circuit board 27 by a solder or the like and are electrically connected to the input circuit 7. Screw holes 31 are formed in the input terminals 5. Screws 32 for the input terminals are threadably inserted into the screw holes 31 through washers 33, respectively. Terminal plates 34 for a trigger signal which are made of a pair of thin metal plates to obtain a trigger signal for the triac 11 are electrically connected and fixed to both end portions in the longitudinal direction of the printed circuit board 27 by soldering. Holes 35 are formed in the terminal plates 34 in correspondence to the nuts 25 for the load terminals, respectively.

The load terminals 6 are disposed over the terminal plates 34. Through holes 37 of screws 36 for the load terminals are formed in the load terminals 6. Connecting members 38 of the terminals $T_1$ and $T_2$ of the triac 11 are integrally formed to the terminals 6, respectively. Hooks 39 are continuously formed to the load terminals 6 toward the side of the base 21 (rear side) and are come into engagement with projections 40 on the outside surfaces of the nut holding portions 23. Reference numeral 41 denotes a screw through hole formed in each terminal member 38 and 42 denotes washers for the load terminals.

A coupling terminal member 43 is electrically connected to each input terminal 5 through a lead wire 44. A shaft hole 45 formed in each base end portion is rotatably come into engagement with each of supporting pins 46 formed on the vertical wall portion 21b of the base 21 as shown in FIG. 4, respectively. When a plurality of solid state relays are arranged and used, the terminal members 43 are projected so as to be enclosed from the side surface in the width direction of the control circuit block 10 and can be connected to the input terminals of the relay adjacent thereto. Reference numeral 47 denotes a socket for a gate signal of the triac 11. The socket 47 is inserted and attached to a notched portion 48 of the printed circuit board 27. A connecting member 47a continuously formed to one end side is connected and fixed to the board 27 by soldering (refer to FIG. 4).

Figure 5:
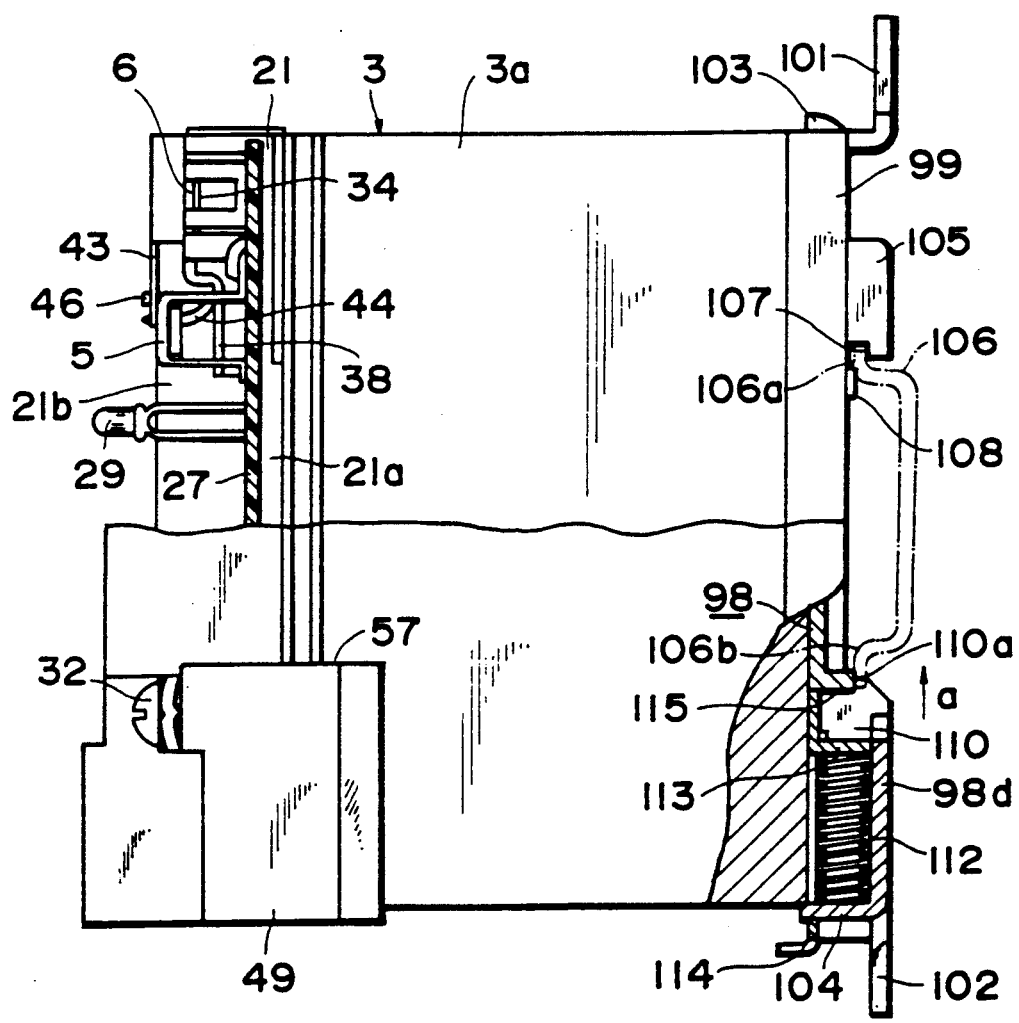
FIG. 5 is a side elevational view with a part cut away of the solid state relay showing a state in which a casing of a control circuit block is detached from the relay.
Figure 6:
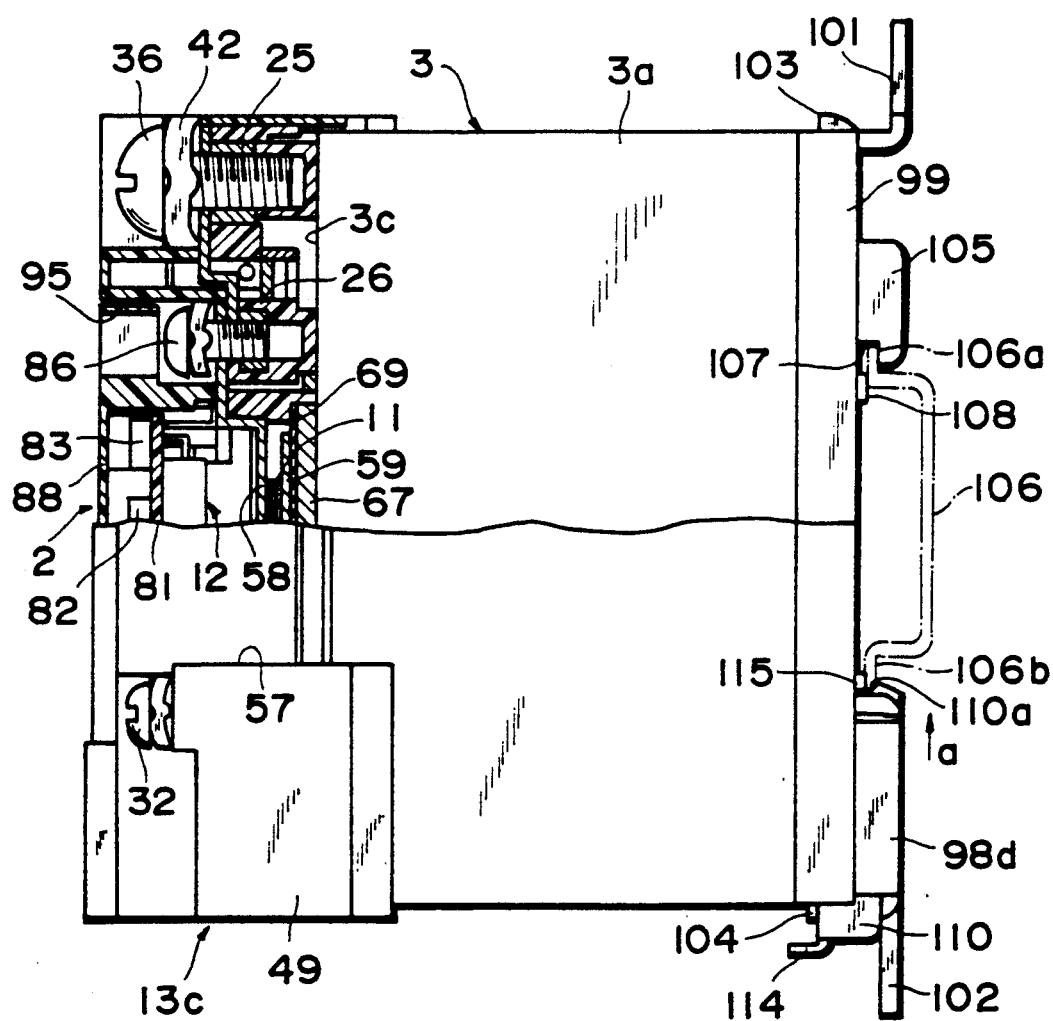
FIG. 6 is a side elevational view with a part cut away of the solid state relay showing a state in which the power circuit cartridge is attached to the relay.

Reference numeral 49 denotes an almost box-shaped casing made of a synthetic resin. The casing 49 has an open rear end and is attached to the outside of the base 21. The casing 49 constructs a housing 130 of the control circuit block together with the base 21. A hollow portion 50 is formed in the central portion of the casing 49 in correspondence to the openings 22 and 30. The hollow portion 50 pierces from the front surface side of the casing 49 to the rear side and constructs a through hole 140 together with the openings 22 and 30. Further, an input terminal exposed window 51, a load terminal exposed window 52, an operation display window 53, output/input holes 54 (FIG. 4) for the coupling terminal members 43, etc. are formed in the casing 49. A side wall 52a of the window 52 functions as a pressing portion of the load terminal 6. On the other hand, engaging projecting portions 56 adapted to be come into engagement with engaging grooves 55 (concave engaging portions) formed along the longitudinal direction (pulling-out forming direction) on both side surfaces in the width direction of the base portion 3b of the radiator 3 are formed on the inner surfaces of both side walls 49a and 49b in the width direction of the casing 49. As shown in FIGS. 4 to 6, concave notched portions 57 (which are used as ventilating grooves as will be explained hereinlater) are formed in the central portions of both side walls 49a and 49b along the front to back direction, respectively. Base plate contact members 49c are formed on the inner surfaces on both sides in the longitudinal direction of the casing 49.

Figure 7A:
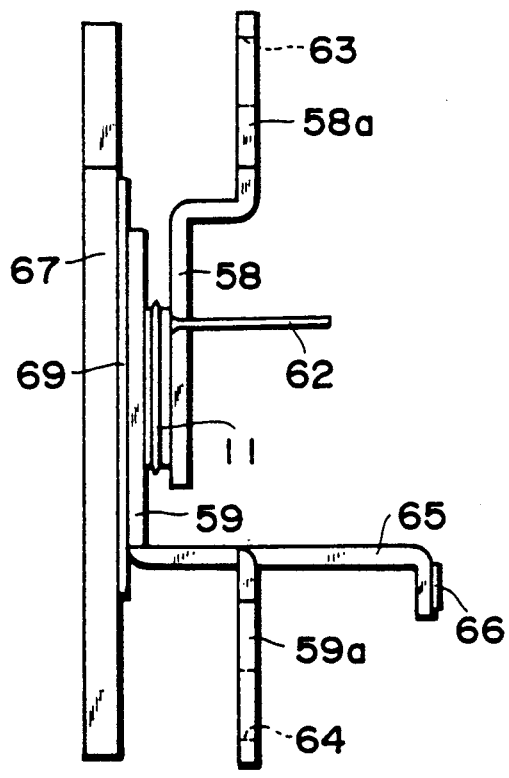
FIGS. 7a and 7b are a side elevational view and a front view showing a triac in the power circuit cartridge and its peripheral portion.
Figure 7B:
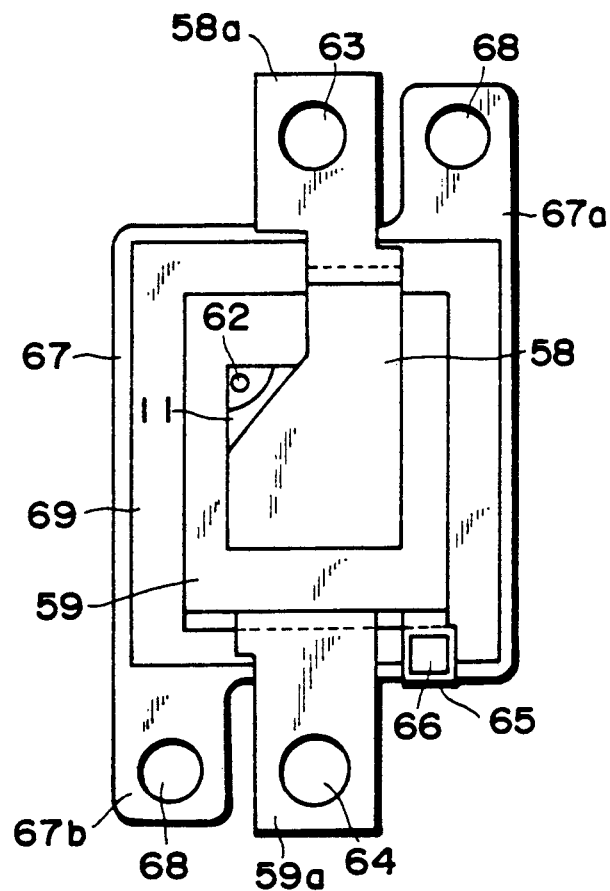

Reference numerals 58, 59, and 60 denote a $T_1$ terminal, a $T_2$ terminal, and a gate terminal of the triac 11 in the power circuit cartridge 2. The triac 11 is formed like a thin plate. As shown in FIGS. 7a and 7b, the triac 11 is sandwiched and attached between the $T_1$ terminal 58 and the $T_2$ terminal 59 and joined and fixed by a solder or the like. Each area of the $T_1$ and $T_2$ terminals 58 and 59 is set to a wide area in order to reduce the thermal resistance for the heat generation of the triac 11. A square-shaped small groove 61 is formed so as to surround an element setting surface of the $T_2$ terminal 59 and prevents the unnecessary outflow of the solder. A gate wire 62 is soldered to a gate of the triac 11 and is connected to the gate terminal 60 by soldering. Screw through holes 63 and 64 are formed in outer end portions 58a and 59a of the $T_1$ and $T_2$ terminals 58 and 59, respectively. As shown in FIG. 7a, a projecting member 65 is formed on the $T_2$ terminal 59 so as to be extended toward the front side. A thermolabel 66 to display a temperature of the triac 11 is adhered to the front edge bent surface of the projecting member 65.

Reference numeral 67 denotes a heat radiating plate to propagate the heat generation of the triac 11 to the radiator 3. Screw through holes 68 are formed in the projecting portions 67a and 67b existing at the diagonal positions, respectively. An insulative plate 69 is interposed between the heat radiating plate 67 and the $T_2$ terminal 59 and is provided to assure the electric insulation between the triac 11 and the heat radiating plate 67. The region of the insulative plate 69 corresponding to the $T_2$ terminal 59 is metallized.

Figure 8:
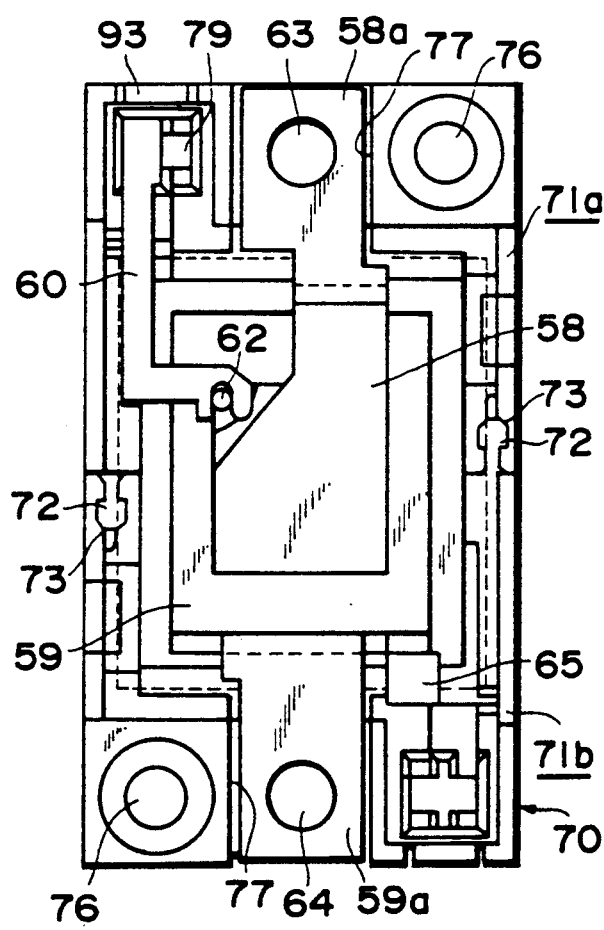
FIGS. 8 and 9 are a front view and a side elevational view with a part cut away showing the power circuit cartridge in which an absorber is not assembled.
Figure 9:
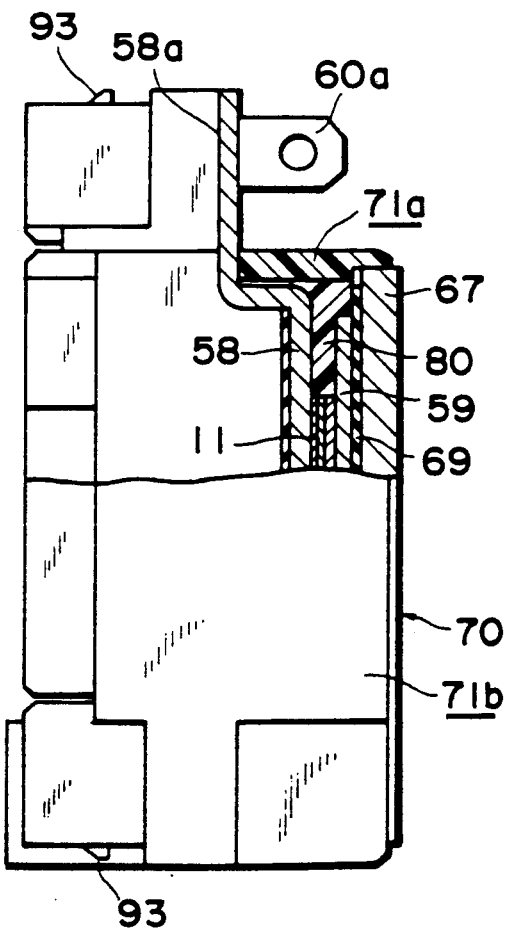

Reference numeral 70 denotes a casing of the power circuit cartridge 2. The casing 70 consists of half bodies 71a and 71b which are divided and whose rear surface sides are open. As shown in FIG. 8, an engaging projecting portion 72 and an engaging groove portion 73 which are come into engagement by the slide operation from the front to back direction are formed in the confronting edge portions of the half bodies 71a and 71b. In the coupling state of the half bodies 71a and 71b, the heat radiating plate 67 is joined to the rear edge side as shown in FIG. 9. Holding hole portions 76 of cartridge attaching screws 75 are formed in the cartridge casing 70 in correspondence to the screw through holes 68. Further, spaces 77 for the outer end portions 58a and 59a of the $T_1$ and $T_2$ terminals 58 and 59 are formed in the cartridge casing 70. The attaching screws 75 are threadably inserted into screw holes 78 formed in the front surface 3c of the base portion 3b of the radiator 3. In correspondence to the socket 47 for a gate signal, as shown in FIG. 8, a gate terminal holding portion 79 is formed in the half body 71a. A lead member 60a which is formed on the gate terminal 60 and projects toward the rear direction is inserted with a pressure into the gate terminal holding portion 79 so as to pierce. The gate terminal 60 is accurately positioned with respect to the socket 47. As shown in FIG. 9, the triac 11 enclosed in the cartridge casing 70 is covered by a silicon rubber 80 so as to prevent an influence by the outside atmosphere and foreign matters.

Figure 10:
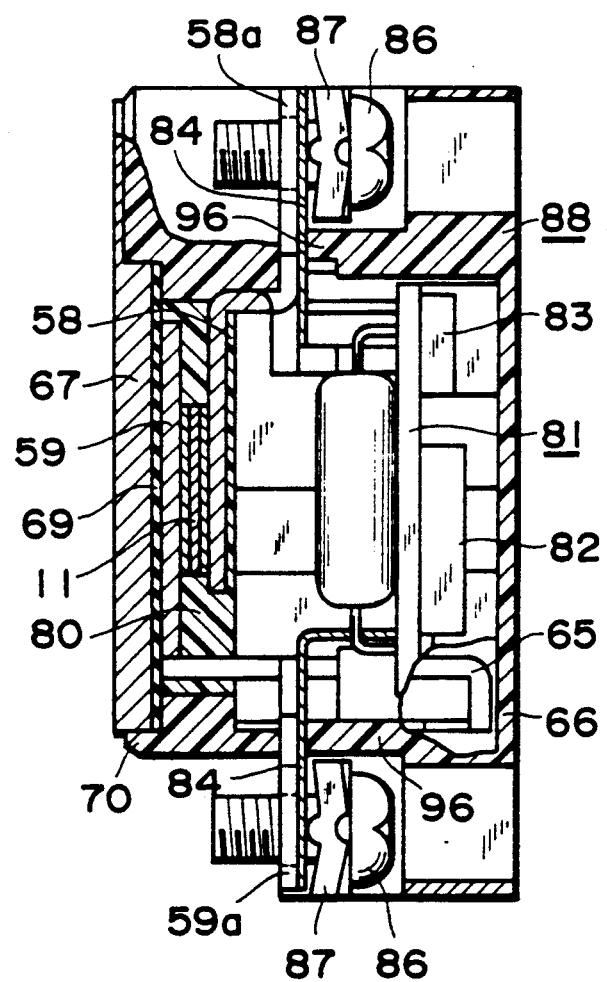
FIG. 10 is a side sectional view of the power circuit cartridge.

Reference numeral 81 denotes a printed circuit board to set the absorber. A high voltage chip varistor 82, a chip capacitor 83, and the like are installed on the board 81. Further, as shown in FIG. 10, a pair of absorber terminals 84 which are electrically joined with the $T_1$ and $T_2$ terminals 58 and 59 are attached to the board 81. Screw through holes 85 are formed in the terminals 84. Reference numeral 86 denotes absorber side connecting screws to connect the absorber terminals 84 and the $T_1$ and $T_2$ terminals 58 and 59 to the terminal connecting members 38 on the load terminal side. The screws 86 are threadably inserted into the cartridge nuts 26, respectively. Reference numeral 87 denotes washers.

Figure 11:
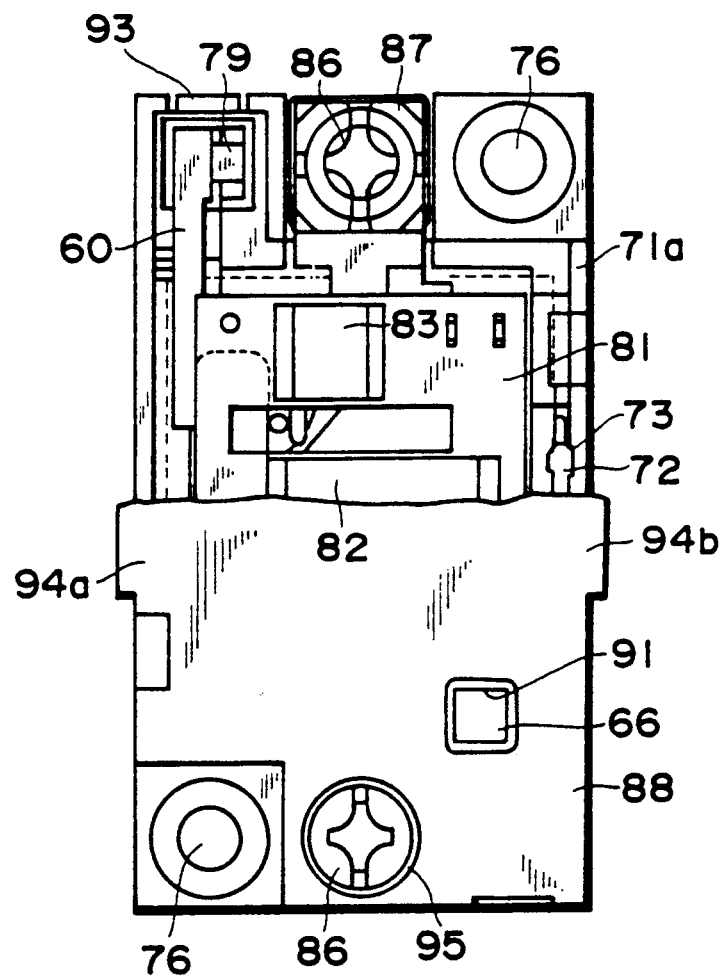
FIG. 11 is a front view showing the power circuit cartridge with a cover cut away.

A cartridge cover 88 is made of a synthetic resin and is attached to the front surface side of the cartridge casing 70. An elastic engaging member 90 adapted to become into engagement with an engaging concave portion 89 on the cartridge casing 70 is projected. An observing window 91 (FIG. 11) of the thermolabel 66 is formed in the front surface of the cover 88. An engaging hole 92 is formed in the side surface of the cartridge cover 88 and is come into engagement with an engaging projection 93 of the cartridge casing 70. Stoppers 94a and 94b are formed on both sides in the width direction of the cartridge cover 88. When the cartridge 2 is inserted into the hollow portion 50 of the casing 49, the stoppers 94a and 95b are come into contact with the casing 49. An operation window 95 of the absorber side connecting screws 86 is formed in the front surface of the cartridge cover 88. On the other hand, as shown in FIG. 10, terminal pressing members 96 are projected backward on the inner surface of the cartridge cover 88.

Reference numeral 97 denotes a coupling member portion to integrally couple the front edges of a number of fins constructing the fin portion 3a of the radiator 3. The coupling member portion 97 is formed by a pulling-out molding process of the radiator 3 and serves as an attaching setting wall. Rib walls 99 are formed in the longitudinal direction so as to face the coupling member portion 97 at the positions of both ends in the width direction of the radiator 3. Grooves 100 to insert both end portions 98a and 98b in the width direction of an attaching substrate 98 are formed on the opposite inner surfaces of the rib walls 99 by the pulling-out molding process of the radiator 3.

The attaching base plate 98 is formed by press-molding an almost rectangular metal plate. Attaching members 101 and 102 are integrally projected to both ends in the longitudinal direction. The attaching members 101 and 102 are used when a control panel or the like (not shown) is attached with screws. A fixing member 103 is projected on one end in the longitudinal direction of the attaching base plate 98 and is caulked on one end surface side of the coupling member portion 97. The fixing member 103 functions to prevent that the attaching base plate 98 is pulled out to one side in the longitudinal direction. Reference numeral 104 denotes a restricting member which is formed on the other end in the longitudinal direction of the attaching base plate 98 by being bent to the front side, that is, to the side of the radiator 3. The restricting member 104 comes into contact with the other end surface of the coupling member portion 97 and functions as a stopper to prevent the plate 98 from moving to the other side in the longitudinal direction.

A pair of vertical wall members 105 are bent and formed on both sides in the width direction at the position on the side of one end portion 98c in the longitudinal direction of the attaching base plate 98 so as to be vertically projected from the surface of the setting wall 97, that is, from the attaching base plate surface, respectively. As shown in FIGS. 5 and 6, an inserting groove 107 and a supporting projecting portion 108 are formed on each of the vertical wall members 105. One rail member portion 106a of a rail member 106 is inserted into the groove 107. The supporting projecting portion 108 supports the rail member portion 106a so as to be away from the rib walls 99.

The other end portion 98d in the longitudinal direction of the attaching base plate 98 is formed like a stairway. A notched hole 109 is formed in a height difference portion 98e. Reference numeral 110 denotes a fixture rail made of a metal plate and formed so as to have an almost U-shaped cross sectional view. The fixture rail 110 is arranged in the space between the other end portion 98d and the coupling member portion 97. The fixture rail 110 is set so as to be movable forward and backward in the longitudinal direction of the attaching base plate 98. An engaging portion 110a adapted to be come into engagement with the other rail member portion 106b of the rail member 106 is integrally formed on one end side of the fixture rail 110 so as to be projected from the notched hole 109.

A long hole 111 is formed in the fixture rail 110 and pierces the restricting member 104. The movement of the fixture rail 110 is guided by both of the long hole 111 and restricting member 104. A coil spring 112 is arranged between a spring seat member 113 formed on the fixture rail 110 by being bent and the restricting member 104. The coil spring 112 applies a spring force to the fixture rail 110 in its progressing direction (indicated by an arrow a). Reference numeral 114 denotes an operating member for disengagement which is bent to the other end side of the fixture rail 110. Reference numeral 115 denotes a supporting member which is formed on the inner wall of the notched hole 109 of the attaching base plate 98 and supports the other rail member portion 106b of the rail member 106.

Hole-shaped portions to fix the attaching members, for instance, groove holes 116 and 117 each having a $\Omega$-shaped cross sectional view are formed on the base portion 3b of the radiator 3 at the positions of both end surfaces in the pulling-out molding direction (longitudinal direction) of the radiator 3. For example, tap screws are threadably inserted into the groove holes 116 and 117.

The assembling procedure of the solid state relay will now be explained hereinbelow.

The load terminal nuts 25 are inserted and held into the nut holding portions 23 of the base 21. The cartridge nuts 26 are inserted and held into the nut holding portions 24. Thereafter, the printed circuit board 27 on which the control circuit component element 28, input terminals 5, terminal plates 34, etc. are installed is arranged on the main surface side of the base 21 (refer to FIGS. 4 and 5). The pair of load terminals 6 are attached onto the terminal plates 34 and the hooks 39 are held to the projections 40 on the side of the nut holding portions 23 by pressing, respectively. Next, the coupling terminal members 43 are come into engagement with the supporting pins 46 of the base 21. In this state, the base 21 is inserted from the rear end opening of the casing 49. The pair of input terminals 5 are exposed to the exposed window 51. Further, the pair of load terminals 6 are exposed to the exposed windows 52. Thus, the control circuit block 10 is constructed (refer to FIG. 6).

On the other hand, the triac 11 is sandwiched and fixed between the $T_1$ terminal 58 and the $T_2$ terminal 59 (refer to FIGS. 7a and 7b). On the other hand, the gate terminal 60 is connected through the gate wire 62. In the confronting edge portion of the half bodies 71a and 71b, the engaging projecting portion 72 and engaging groove portion 73 are inserted and coupled in the front to back direction, thereby constructing the cartridge casing 70. The heat radiating plate 67 is attached to the rear side of the casing 70. The block of the triac 11 is joined to the inner surface of the plate 67 through the insulating plate 69. The gate terminal 60 and the gate wire 62 are connected. The lead member 60a of the terminal 60 is pierced to the gate terminal holding portion 79 of the half body 71a. Thereafter, silicon rubber 80 is injected into the casing 70 to thereby cover the triac 11 and the like (refer to FIG. 9). The printed circuit board 81 onto which the absorber component parts 82 and 83 and the like are installed is enclosed into the cartridge casing 70. The absorber terminals 84 are joined with the outer end portions 58a and 59a of the $T_1$ and $T_2$ terminals 58 and 59. The absorber side connecting screws 86 are inserted into the screw through holes 85 (and 63 and 64). In this state, the elastic engaging member 90 of the cartridge cover 88 is inserted into the cartridge casing 70 and is held to the engaging concave portion 89. On the other hand, the engaging hole portion 92 is held to the engaging projection 93 of the cartridge casing 70. Thus, the cover 88 is attached to the cartridge casing 70 and the power circuit cartridge 2 is constructed (FIG. 10). At this time, the thermolabel 66 adhered to the projecting member 65 of the $T_2$ terminal 59 is set so as to face the observing window 91.

Figure 16:
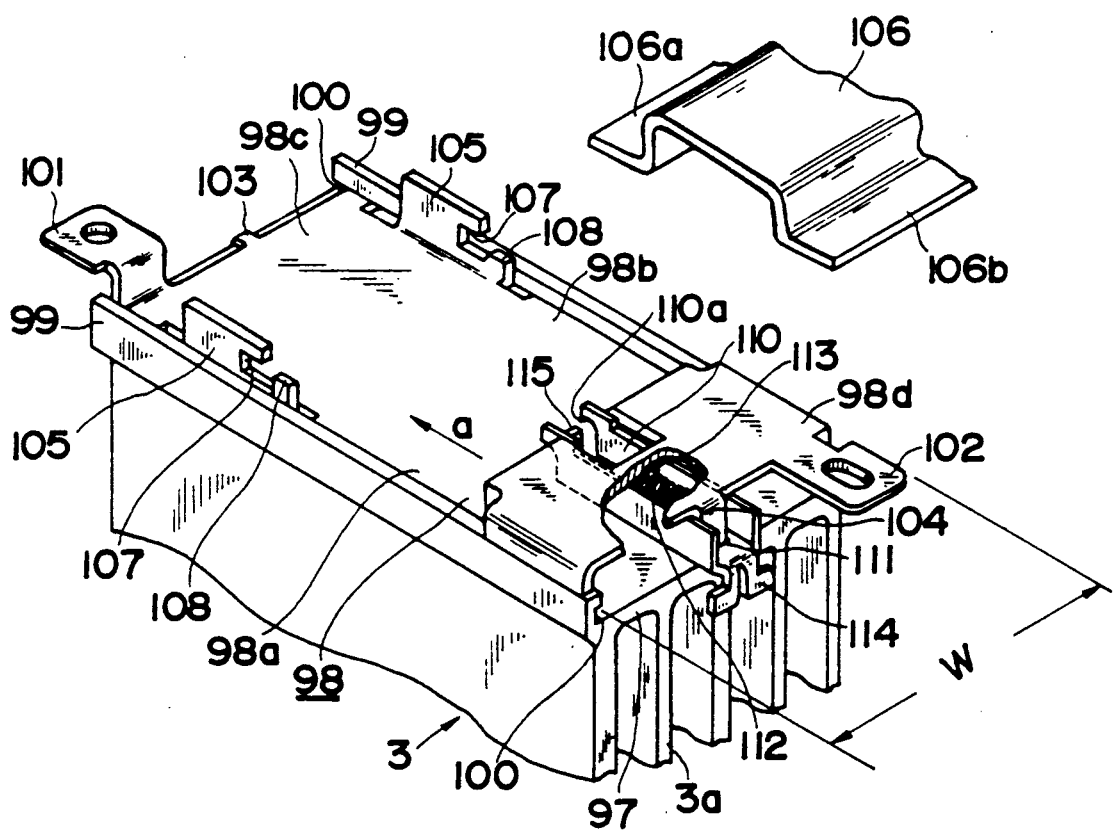
FIG. 16 is a perspective view with a part cut away showing a construction of an attaching device in an assembling state.

On the other hand, as shown in FIG. 16, the fixture rail 110 is assembled to the attaching base plate 98 together with the coil spring 112. Thereafter, the attaching plate 98 is inserted between the grooves 100 on the side of the radiator 3. The fixing member 103 is caulked to the coupling member portion 97, thereby fixing the attaching base plate 98 to the radiator 3.

By pushing the control circuit block 10 into the front surface side of the base portion 3b of the radiator 3, the engaging projecting portions 56 of the casing 49 are held into the engaging groove 55 of the radiator 3, so that the control circuit block 10 is fixed to the radiator 3. In this state, the base 21 is sandwiched between the base portion 3b of the radiator 3 and the casing 49.

The input terminal screws 32 are threadably inserted into the screw holes 31 of the input terminals 5. The load terminal screws 36 are threadably inserted into the load terminal nuts 25 through the screw through holes 37 of the load terminals 6, respectively.

Finally, the power circuit cartridge 2 is inserted into the hollow portion 50 of the casing 49 of the control circuit block 10. That is, the cartridge 2 is inserted into the through hole 140. The attaching screws 75 are inserted into the holding hole portions 76 and threadably inserted into the screw holes 78 of the radiator 3, respectively. Thus, the cartridge 2 is attached to the relay main body 1. The lead member 60a of the gate terminal 60 is also coupled with the socket 47 for the gate signal. By threadably inserting the absorber side connecting screws 86 into the cartridge nuts 26, the $T_1$ and $T_2$ terminals 58 and 59 and the absorber terminals 85 are electrically connected in parallel with the load terminals 6, respectively, (refer to FIG. 6).

In the above construction, when the relay is attached for use, the attaching device 4 is used. In the case of attaching the relay to a panel surface or the like (not shown), the attaching members 101 and 102 of the attaching base plate 98 are screwed to the panel surface. On the other hand, in the case of attaching the relay to the rail member 106, the rail member portions 106a and 106b are inserted between the engaging portion 110a on the front edge side of the fixture rail 110 and the engaging groove 107.

When the pair of load terminals 6 are connected to a load (not shown) and an input signal is applied between the pair of input terminals 5, the light emitting element 29 is lit on and this state can be observed through the operation display window 53 by the eyes. By applying the input signal, the trigger circuit 8 is made operative through the input circuit 7, the triac 11 is made conductive, and an electric power is supplied to the load.

When the triac 11 generates the heat due to the operation thereof, the heat is radiated by the radiator 3 through the heat radiating plate 67. On the other hand, when a temperature of the triac 11 increases due to the heat generation, the thermolabel 66 changes the color. This color change can be observed through the observing window 91 of the cartridge side cover 88 by the eyes. Therefore, the heat generating state of the triac 11 can be easily checked.

If the triac 11 is broken due to a short-circuit accident, abnormal heat generation, or the like, it is sufficient to exchange the power circuit cartridge 2. That is, the absorber side connecting screws 86 are released, the attaching screws 75 are removed, the power circuit cartridge 2 is detached from the relay main body 1, and a new power circuit cartridge 2 is attached. In this case, since the power circuit cartridge 2 can be attached or detached by the attaching screws 75, the exchanging work can be rapidly performed.

By exchanging the power circuit cartridge 2, the absorber circuit parts which easily deteriorate can be also simultaneously exchanged, so that the lives of them become long and the high reliability is obtained.

Moreover, since the connecting state of the load terminals 6 does not need to be changed, the exchanging work can be made fast and a fear of occurrence of the erroneous wiring upon repair or the like is also eliminated.

On the other hand, the joined position of the heat radiating plate 67 of the power circuit cartridge 2 and the front surface 3c of the radiator 3 largely relates to the heat radiating efficiency. With respect to this point, in the above construction, the through hole 140 is formed in the control circuit block 10 in correspondence to the almost central portion of the front surface 3c of the radiator 3. Therefore, by inserting the power circuit cartridge 2 into the through hole 140, the heat radiating plate 67 is inevitably joined to almost the central portion of the front surface 3c of the radiator 3. Thus, the good heat radiating effect is obtained, in other words, the radiator 3 can be also miniaturized.

Moreover, when the power circuit cartridge 2 is attached, the through hole 140 functions as an inserting guide to thereby easily insert the cartridge 2. Also, as compared with the type in which the power circuit cartridge 2 is attached by, e.g., a superposed structure, there are advantages such that there is no fear of shaking of the cartridge 2 in its attached state and that the cartridge 2 is stably held. The shape of the through hole 140 may be also arbitrarily changed in accordance with the outer shape of the power circuit cartridge 2.

Figure 12:
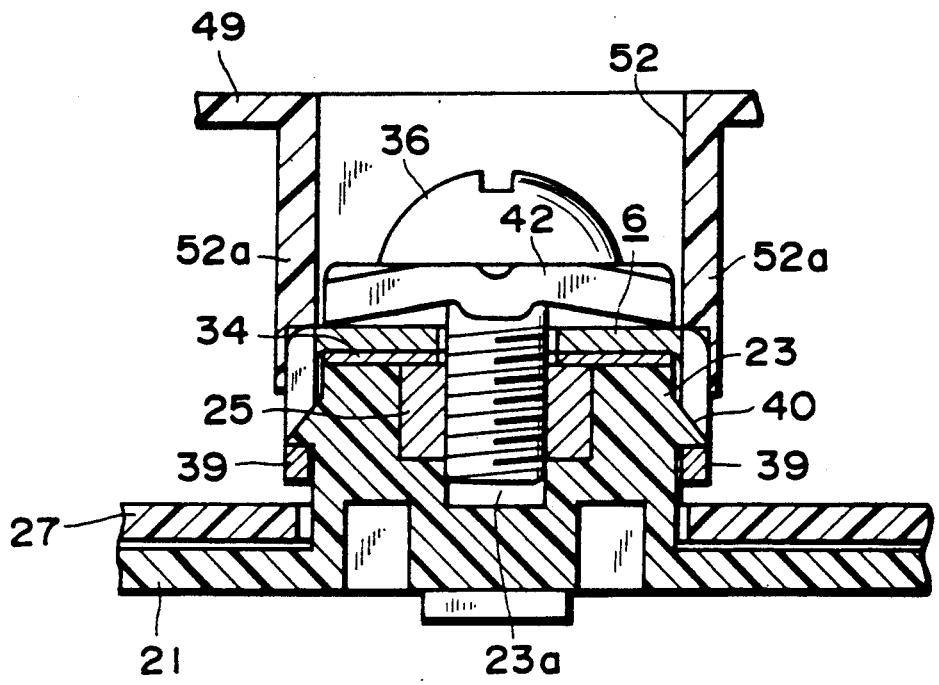
FIG. 12 is a cross sectional view showing enlargedly an attaching portion of a load terminal.

Since load side cables (not shown) are connected to the pair of load terminals 6, relatively large external stresses are concentrated thereto. However, according to the above construction, the load terminals 6 are positioned and arranged so as to ride over the nut holding portions, i.e., the boss portions 23 and, at the same time, as shown in FIG. 12, the hooks 39 are stopped to the projections 40 of the boss portions 23. Therefore, the load terminals 6 are strictly held to the boss portions 23 without a fear of positional deviation of the load terminals 6. Thus, there is not a fear such that the load terminals drop from the casing 49 due to the influence of the external stresses.

Moreover, in this embodiment, since the peripheral portions of the load terminals 6 are pressed by the window frame member portions (side walls) 52a of the load terminal exposed windows 52, the holding strengths of the load terminals 6 are further enhanced.

On the other hand, the load terminals 6 and printed circuit board 27 are electrically connected through the separate terminal plates 34 which are positioned to the boss portions 23. Therefore, if the terminal plates 34 and printed circuit board 27 are previously constructed as a single unit, the wiring works upon assembly can be omitted. In addition, the external stresses to the load terminals 6 are absorbed between them and the terminal plates 34 and are hardly directly transferred to the printed circuit board 27, so that a disconnection accident or the like hardly occurs.

Figure 13:
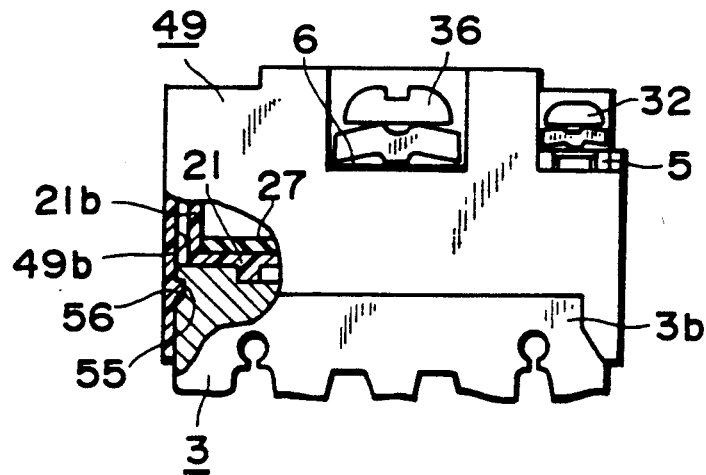
FIG. 13 is a top view with a part cut away showing a fixed state of a casing of a control circuit block and a heat radiator.

By pressing the casing 49 of the control circuit block 10 from the front side to the base portion 3b of the radiator 3, the engaging projecting portion 56 of the casing 49 is come into engagement with the engaging groove 55 of the radiator 3 as shown in FIG. 13. Namely, the control circuit block 10 can be coupled with the radiator 3 by the single-touch pushing operation. Accordingly, the assembling efficiency is remarkably improved as compared with the structure such that the control circuit block 10 is, for instance, fixed with screws.

Moreover, in this embodiment, the printed circuit board 27 of the control circuit block 10 is held to the casing 49 and base 21 so as to be parallel with the front surface of the base portion 3b of the radiator 3. In the coupling state to the radiator 3, the printed circuit board 27 is sandwiched by the base plate contact member 49c of the casing 49 and the base 21. Consequently, the rigid fixed state is maintained without using any special fixing means such as a resin mold or the like. In other words, the number of assembling steps is small and the production cost can be also reduced.

In the embodiment, as an engaging portion of both of the control circuit block 10 and the radiator 3, the engaging groove 55 is formed on the radiator 3 by the pulling-out molding process and the engaging projecting portion 56 is formed on the casing 49. However, the opposite structure can be also used.

On the other hand, the arranging orientation of the printed circuit board 27 is not limited to the foregoing example but it is sufficient to use a construction such that the board 27 is held between the casing 49 and the base 21.

When the attaching device 4 is attached to the front edge side of the fin portion 3a of the radiator 3, the front edges of a plurality of fins constructing the fin portion 3a are integrally coupled by the coupling member portion 97, so that the attaching device 4 can be strictly attached. That is, since the fin portion 3a is set to the center impeller supporting state due to the coupling member portion 97, even in the case of performing the pulling-out molding process, the accuracy of the dimensions W (FIG. 3) of the attaching portion to the attaching apparatus 4 is raised.

On the other hand, since the heat radiating area of the radiator 3 is also widened due to the coupling member portion 97, the heat radiating effect can be improved. In addition, by making the attaching device 4 from metal, the contact area of the radiator 3 and attaching device 4 increases through the coupling member portion 97, so that the heat radiating function can be also provided for the attaching device 4.

Figure 14:
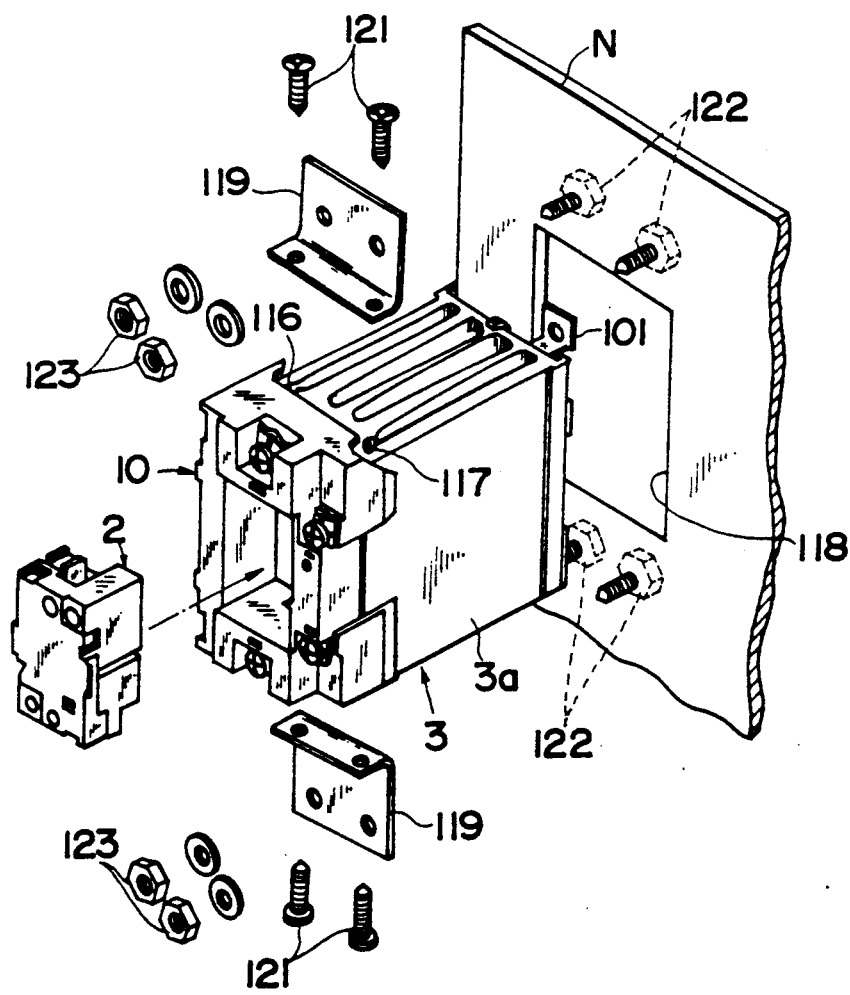
FIGS. 14 and 15 are an exploded perspective view and a side elevational view with a part cut away showing another attaching state of the solid state relay, respectively.
Figure 15:
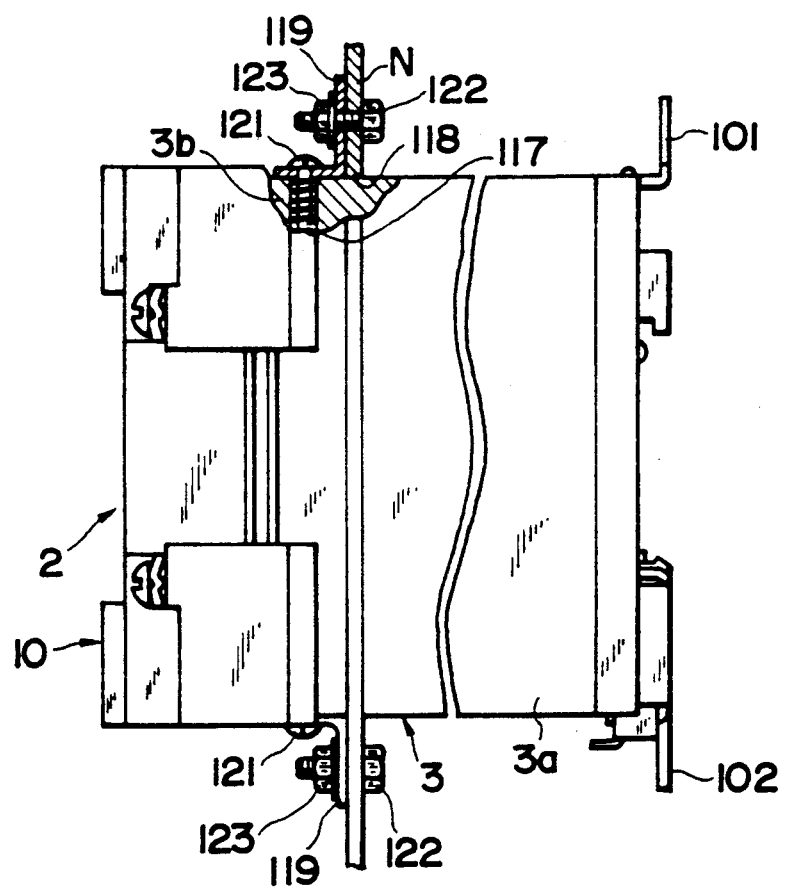

A control panel N is generally screwed by using the attaching members 101 and 102 of the attaching apparatus 4. However, in its attaching state, if an adverse influence is exerted on other apparatuses due to the heat radiation of the radiator 3, as shown in FIG. 15, the fin portion 3a of the radiator 3 must be attached behind the control panel N. In this case, the groove holes 116 and 117 formed in the base portion 3b of the radiator 3 are used. For instance, as shown in FIGS. 14 and 15, a fin portion through hole 118 is formed in the control panel N and L-shaped attaching metal fittings 119 are prepared. Tap screws 121 each of which pierces one end portion of each of the L-shaped metal fittings 119 are threadably inserted into the groove holes 116 and 117, thereby fixing the metal fittings 119 to the radiator 3. Further, the other end portions of the metal fittings 119 are fixed to the control panel N by using bolts 122 and nuts 123. Namely, since the groove holes 116 and 117 are previously formed in the base portion 3b of the radiator 3, by preparing the L-shaped attaching metal fittings 119 or the like, the radiator can be rapidly attached at any time.

Although the embodiment has been described with respect to the example in which the L-shaped attaching metal fittings 119 are fixed into the groove holes 116 and 117, other attaching members may be also used. Moreover, the groove holes 116 and 117 have been shown as an example of the hole portions but their shapes and the number of groove holes can be arbitrarily changed.

On the other hand, if the size of radiator 3 or the like enlarges due to an increase in capacity of the solid state relay, there is a fear of strength if the attaching portion to the rail member 106 or the like is made of a synthetic resin.

However, in the above construction, since the metal attaching base plate 98 is caulked to the radiator 3, the coupling relation between the radiator 3 and the plate 98 is rigid. Moreover, the forces which are applied to the vertical wall members 105 which are bent and formed on the attaching base plate 98 and have the engaging groove 107 adapted to be come into engagement with the rail member portion 106a of the rail member 106 are applied in the direction perpendicular to the plate thickness. The fixture rail 110 having the engaging portion 110a adapted to be come into engagement with the other rail member portion 106b also has a U-shaped cross sectional view, so that its mechanical strength is strong. Consequently, this structure can sufficiently endure the large size and heavy weight of the radiator 3 or the like and the high vibration resistant performance is obtained.

Particularly, by using the attaching base plate 98 made of a metal and made independently from the relay main body 1, the engaging structure of the rail member 106 can be freely formed without being influenced by the shape of the relay main body 1 or the like. The attaching base plate 98 and fixture rail 110 can be formed by pressing means. Thus, they can be easily manufactured.

On the other hand, the supporting projecting portion 108 and supporting member 115 to support the rail member portions 106a and 106b of the rail member 106 at positions remote from the rib walls 99 are formed to the attaching base plate 98, so that even if there are dimensional errors between the attaching base plate 98 and the grooves 100 or the like, the relay can be accurately attached to the rail member 106 irrespective of those errors.

The caulking fixing means for caulking the attaching base plate 98 to the radiator 3 is not limited to the means for caulking the fixing member 103.

Figure 18:
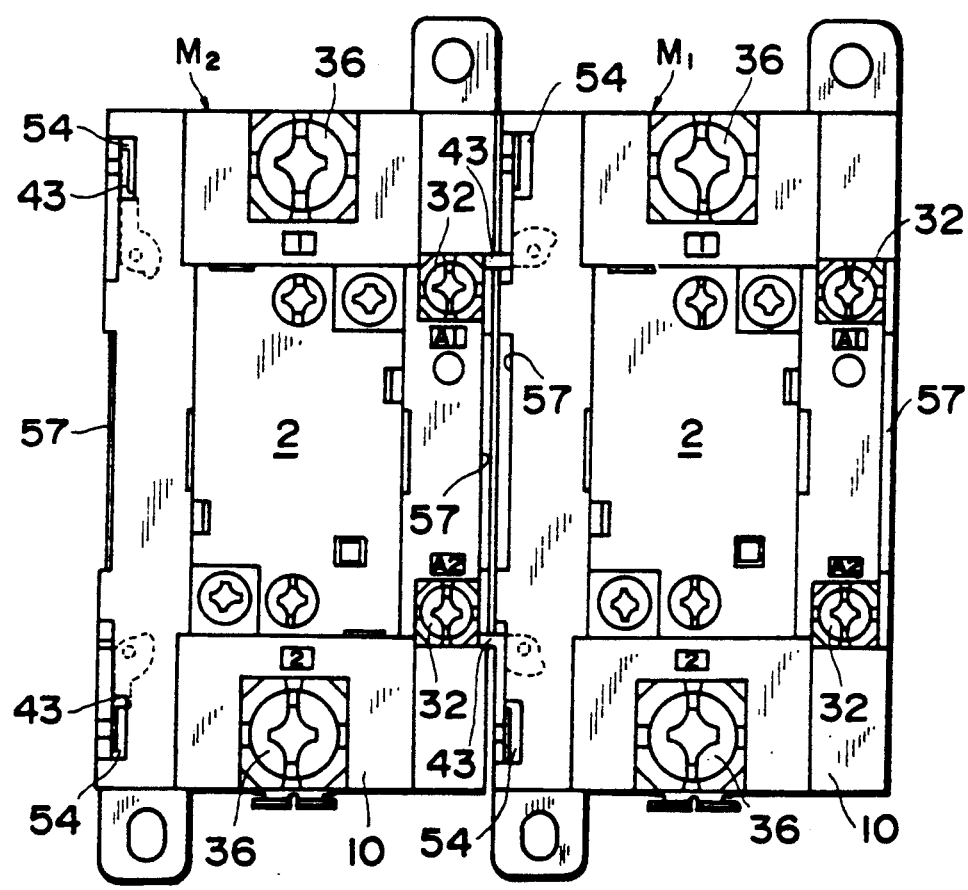
FIG. 18 is an explanatory diagram in the case where a plurality of solid state relays are arranged and used.

Further, the attaching base plate 98 is inserted between the pair of rib walls 99 formed on both ends in the width direction of the fin portion 3a of the radiator 3 and caulked. The attaching members 101 and 102 are respectively projected on both of the front and rear edges in the longitudinal direction of the attaching base plate 98, that is, in the pulling-out molding direction of the radiator 3. Therefore, as will be explained hereinlater, in the case of connecting a plurality of relays as shown in FIG. 18, the attaching members 101 and 102 do not become obstacles and the dimension W (FIGS. 3 and 16) in the width direction can be reduced. Therefore, solid state relays $M_1$ and $M_2$ can be closely attached and the attaching space can be reduced.

In the above embodiment, since the front edge side of the fin portion 3a of the radiator 3 is coupled by the coupling member portion 97 as mentioned above, the holding strength to the attaching base plate 98 is enhanced.

Figure 17:
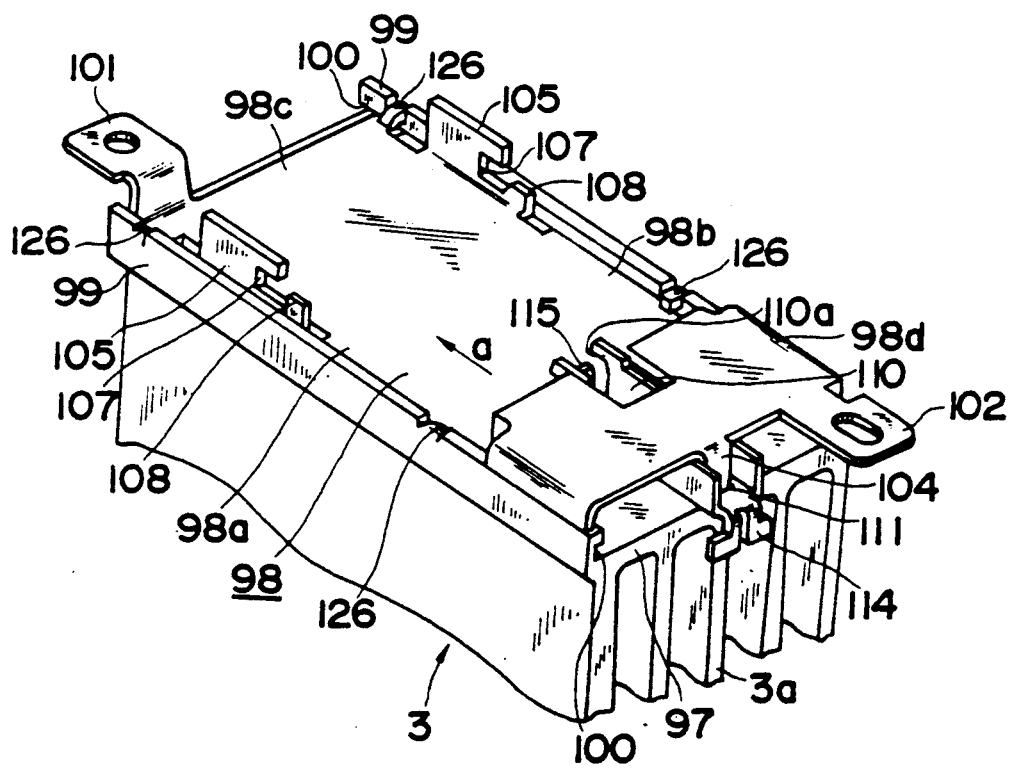
FIG. 17 is a perspective view showing a modification of caulking means of an attaching base plate in the solid state relay.

On the other hand, in the embodiment, as a fixing method of the attaching base plate 98, the fixing member 103 of the base plate 98 is caulked to the radiator 3. However, as shown in FIG. 17, by respectively inwardly caulking parts 126 of the rib walls 99, the attaching base plate 98 inserted between the grooves 100 of the rib walls 99 can be rigidly fixed irrespective of the dimensional errors of the grooves 100 or the like.

In the case of arranging a plurality of solid state relays $M_1$ and $M_2$ in the width direction and using as shown in FIG. 18, the pair of coupling terminal members 43 of the solid state relay $M_1$ are pulled out of the output/input holes 54 by the rotating operation and projected to the side and are screwed by using the input terminal screws 32 of the adjacent solid state relay $M_2$. Thus, the input terminals 5 of the solid state relay $M_1$ are electrically connected in parallel with the input terminals 5 of the adjacent solid state relay $M_2$ through the coupling terminal members 43.

In the case of arranging a plurality of relays and using, if the solid state relays $M_1$ and $M_2$ are closely arranged, the heat radiating functions of the radiators 3 of these relays are not effected. However, in the above construction, since the ventilating grooves 57 are formed on the outer surfaces on both sides of the casing 49 of the housing 130, the air flows through the ventilating grooves 57 in the front to back direction. Therefore, even if the solid state relays $M_1$ and $M_2$ are closely arranged, the heat radiating function of each radiator 3 is properly maintained. Even if the relays are used at the positions adjacent to the other apparatuses, the heat radiating performance can be improved.

In the above example, the base 21 is enclosed in the casing 49. Therefore, the ventilating grooves 57 are formed on the outer surface on both sides of the casing 49. However, in the case of attaching the base 21 at a position out of the casing 49, it is sufficient to form the ventilating grooves 57 on the base 21.

In the foregoing example, the power circuit cartridge 2 can be detachably attached to the relay main body 1 by using the attaching screws 75. However, this detachable structure is not limited to the structure using the screws.

Moreover, the electrical connection between the power circuit cartridge 2 and the control circuit block 10 is not limited to the type using the screws 86 or the like. Various modification means can be also used.

With reference to FIGS. 19 to 23, an explanation will now be made with respect to a solid state relay having a structure such that the unexpected projection to the outside of the coupling terminal members 43 can be prevented.

Figure 19:
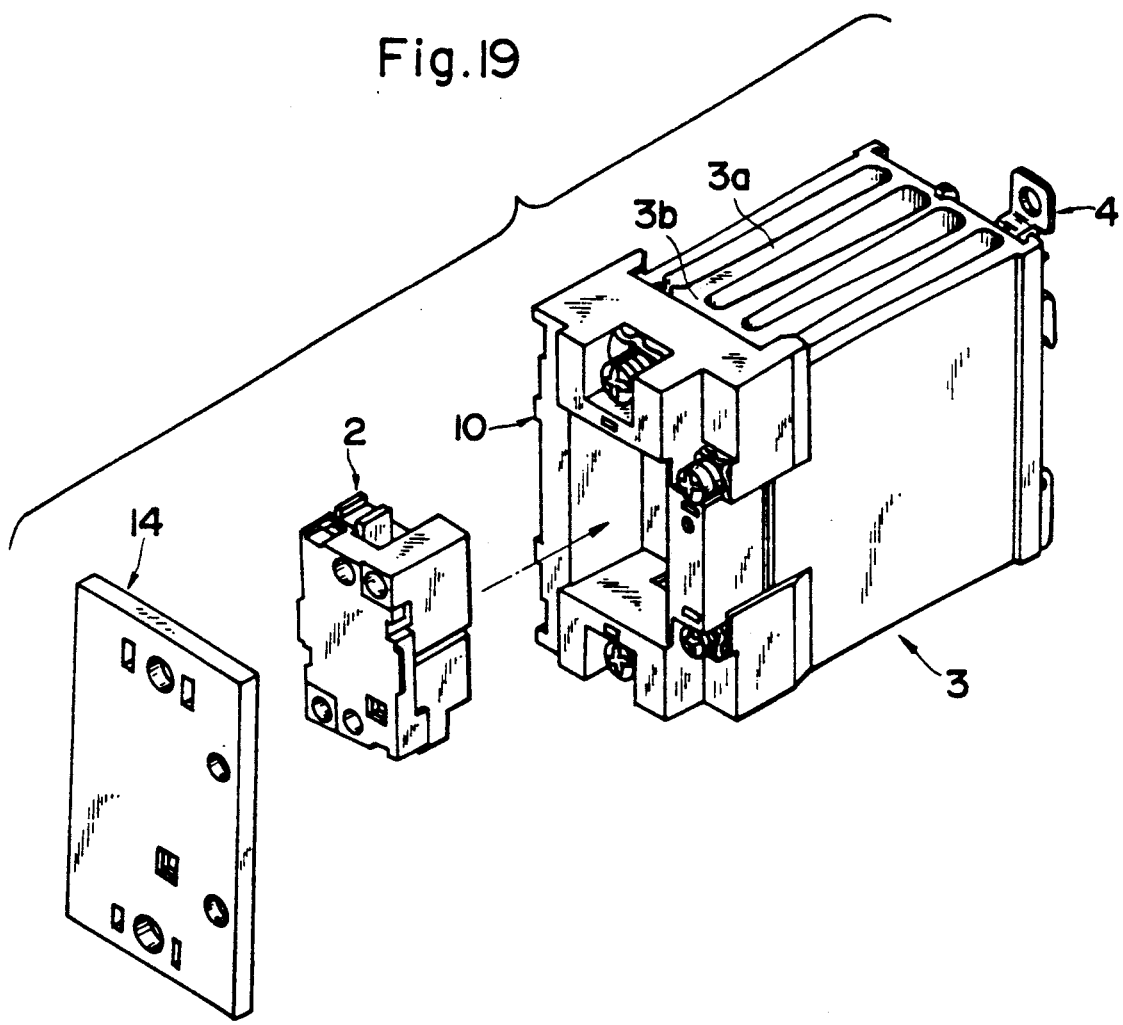
FIG. 19 is a perspective view showing a solid state relay having a terminal cover.
Figure 20:
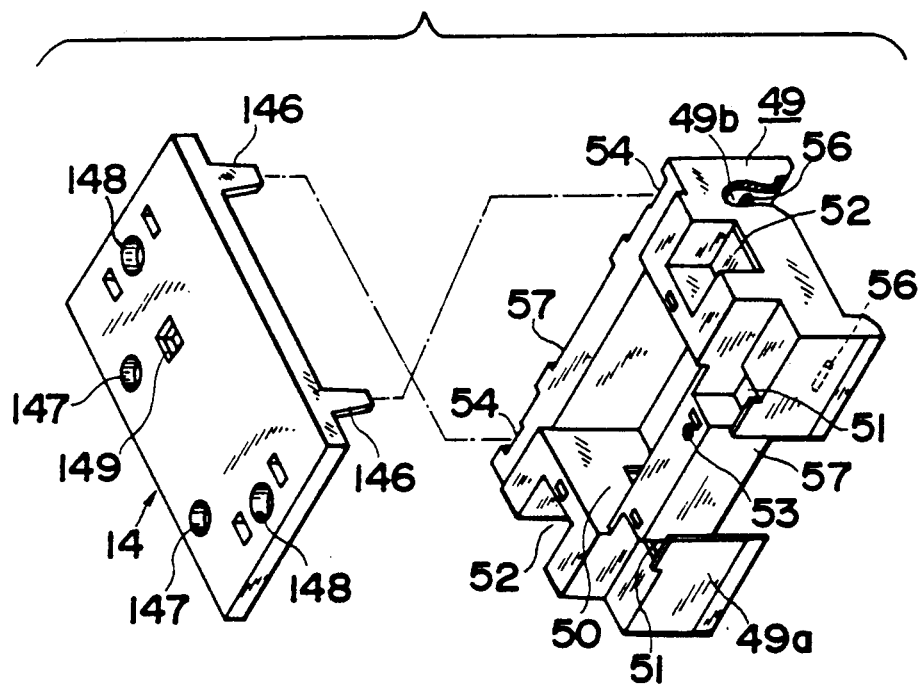
FIG. 20 is an exploded perspective view showing an attaching state of the terminal cover.
Figure 21:
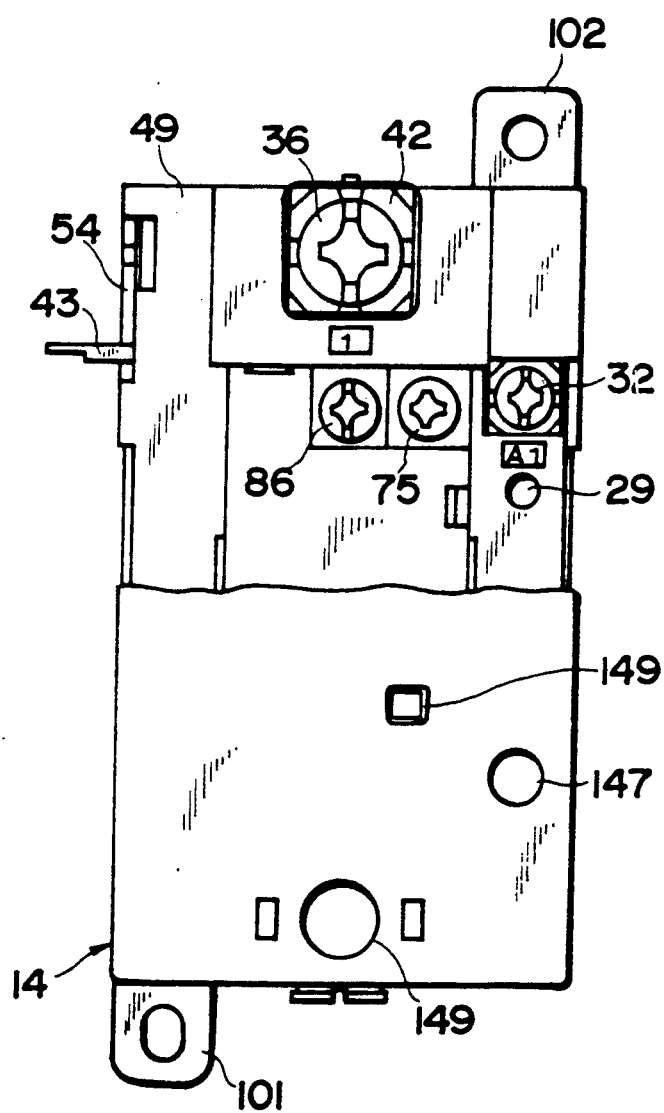
FIG. 21 is a front view with a part cut away of the solid state relay showing a state in which the terminal cover is attached to the relay.

FIG. 19 is a whole perspective view corresponding to FIG. 1. FIG. 20 is a diagram showing a part of the assembling diagram of FIG. 3. FIG. 21 is a front view with a part cut away of the solid state relay showing a state in which the terminal cover is attached.

Figure 22:
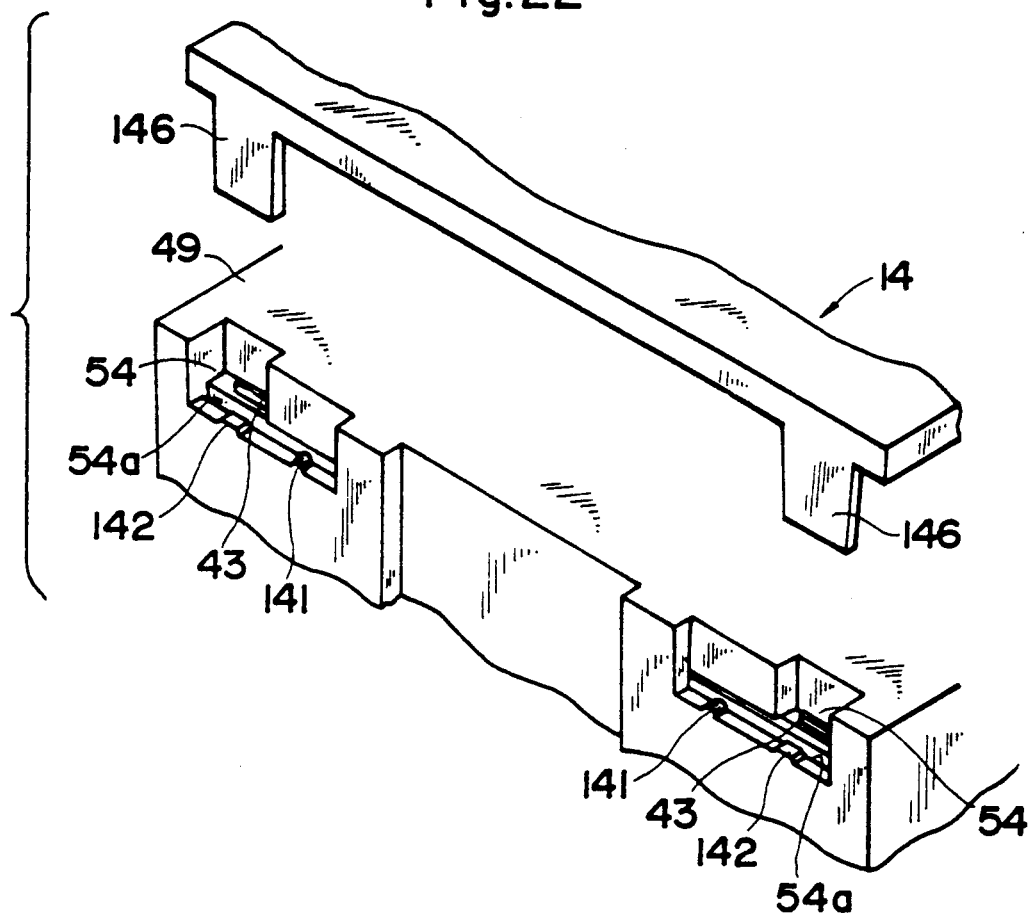
FIG. 22 is a perspective view of the solid state relay showing a state in which a coupling terminal member is enclosed.
Figure 23:
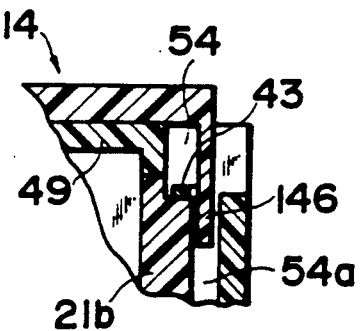
FIG. 23 is a cross sectional view showing the enclosing state in FIG. 22.

Referring now to these diagrams, a terminal cover 14 is attached to the relay main body 1. As shown in FIGS. 22 and 23, thin grooves 54a are formed at the position of the output/input holes 54 in the front to back direction. Each thin groove 54a is formed by a gap between the thin portion of the vertical wall 21b of the base 21 and the inner surface of the side wall 49b of the casing 49.

The terminal cover 14 is made of an electrically insulative synthetic resin or the like and is formed like a rectangle of a size enough to substantially cover the front surface of the casing 49. Stopper members 146 are integrally formed. Each stopper member 146 is located at one end in the width direction corresponding to the output/input hole 54 and is pressure inserted into the thin groove 54a. The stopper members 146 are set such that the coupling terminal members 43 enclosed in the output/input holes 54 are held at the enclosing positions. Through holes 147 corresponding to the input terminal screws 32, through holes 148 corresponding to the load terminal screws 36, a window hole 149 corresponding to the thermolabel 66 and the like are formed in the terminal cover 14, respectively.

In FIG. 22, reference numerals 141 and 142 denote click projections formed on the casing 49 so as to be located in the opening edge portion of the output/input hole 54. These projections correspond to the coupling terminal member projecting position and enclosing position.

The terminal cover 14 is attached to the front surface side of the casing 49 as necessary.

When the coupling terminal members 43 are not used, the coupling terminal members 43 are enclosed into the output/input holes 54 as shown in FIG. 22, the stopper members 146 of the terminal cover 14 are pressure inserted into the thin grooves 54a and the cover 14 is attached to the front surface of the casing 49, so that the unnecessary projection of the coupling terminal members 43 can be blocked. In other words, if the coupling terminal members 43 are completely enclosed in the output/input holes 54, the coupling terminal members 43 are held at the enclosing positions by the stopper members 146 as shown in FIG. 23. Therefore, even if the relay is installed near the other apparatuses, the coupling terminal members 43 do not come into contact with these apparatuses, so that a fear of breakage of the power source on the input signal side is also eliminated.

In this example, since almost of the whole region of the front surface of the casing 49 is covered by the terminal cover 14, the hand of a worker does not carelessly touch the load terminal screws 36 and the work can be safely performed. Further, the input terminal screws 32 and load terminal screws 36 and the like can be operated through the through holes 147 and 148 formed in the terminal cover 14.

As shown in FIG. 18, even in the case of arranging a plurality of relays, a plurality of terminal covers 14 can be attached and used.

Although the embodiment has been described with respect to an example of the terminal cover 14 in which the stopper members 116 are pressure inserted into the thin grooves 54a, if the terminal cover 14 is attached to the casing 49 by another means, there is no need to pressure insert the stopper members 116 into the thin grooves 54a. On the other hand, the holding structure for the coupling terminal members 43 can be also realized by other modification means.

In the embodiment, the power circuit cartridge 2 is detachably attached to the control circuit block 10. However, the invention is not limited to this construction but can be also applied to a structure such that the relay main body 1 has the coupling terminal members 43.

Another embodiment will now be described with reference to FIGS. 24 to 36b.

Figure 24:
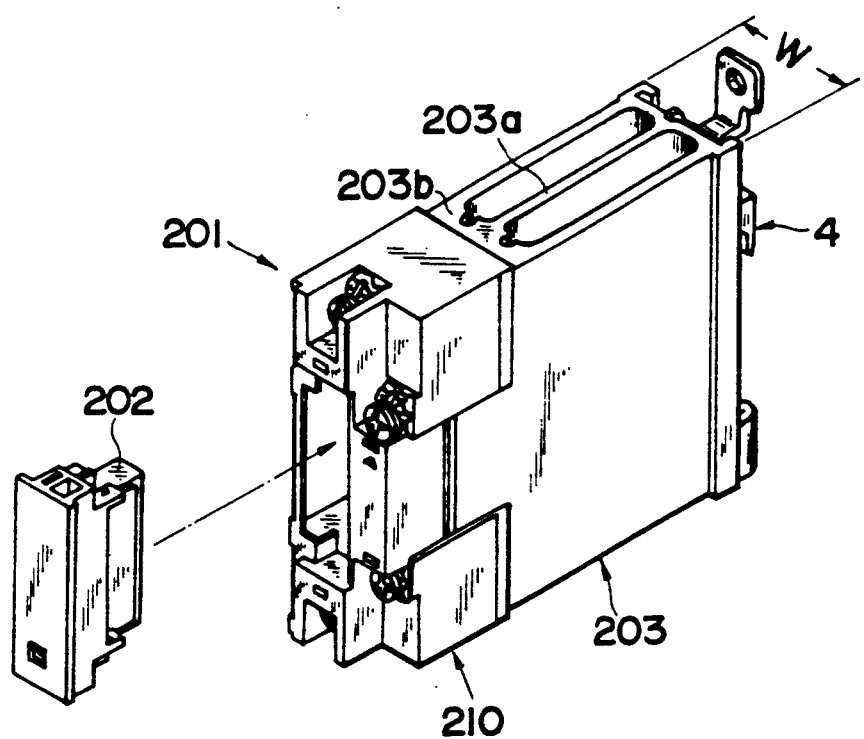
FIG. 24 is a perspective view of another embodiment of a solid state relay according to the invention showing a state in which a power circuit cartridge is detached from the relay.

FIG. 24 is a perspective view of a solid state relay. The electric circuit included in this solid state relay is the same as that shown in FIG. 2.

In the diagram, reference numeral 201 denotes a relay main body; 202 is a power circuit cartridge; 203 a radiator having a fin portion 203a; and 204 is an attaching device which is attached to the front edge side of the fin portion 203a. The relay main body 201 has a pair of input terminals 5 and a pair of load terminals 6. The relay main body 201 comprises: a control circuit block 210 having therein the control circuit 9 consisting of the input circuit 7 and trigger circuit 8; and the radiator 203. The control circuit block 210 is attached to a front surface 203c of a base portion 203b of the radiator 203. The power circuit cartridge 202 includes the power circuit 13 having therein a power semiconductor element, e.g., triac 11 and the absorber 12 to absorb the surge. The triac 11 is driven by the trigger circuit 8 and on/off switched a load (not shown). The power circuit cartridge 202 is detachably attached to the relay main body 201 so as to be electrically connected.

Figure 25B:
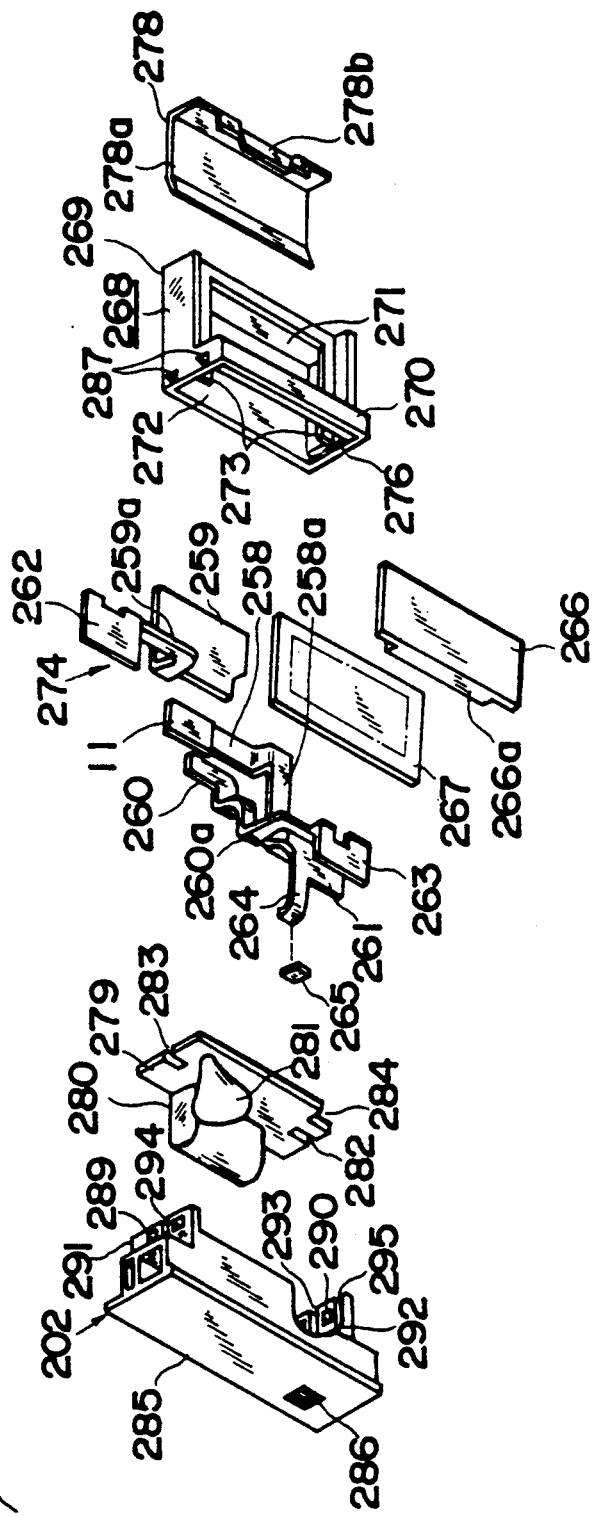
Figure 25C:
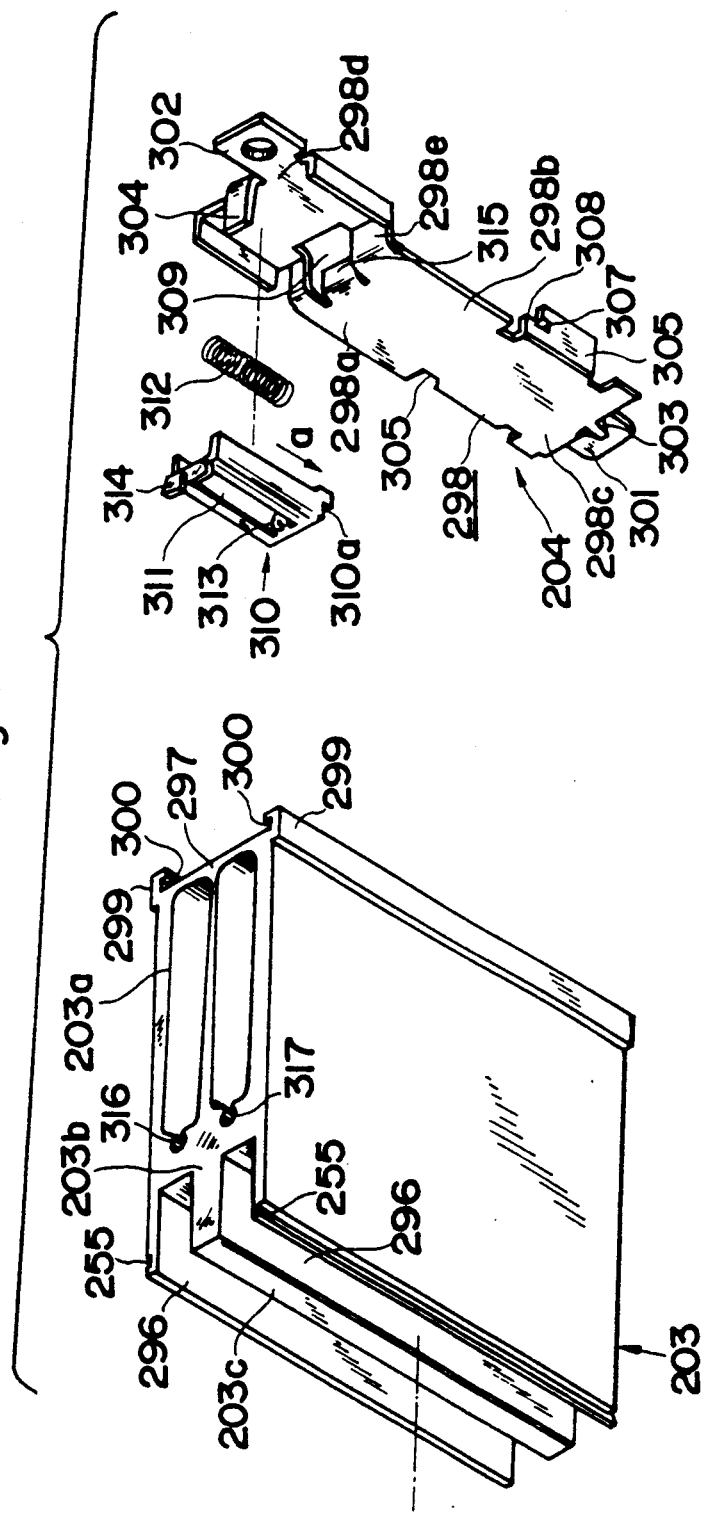

This solid state relay will be described in detail hereinbelow. FIGS. 25a to 25c are exploded perspective views of the solid state relay.

Figure 26:
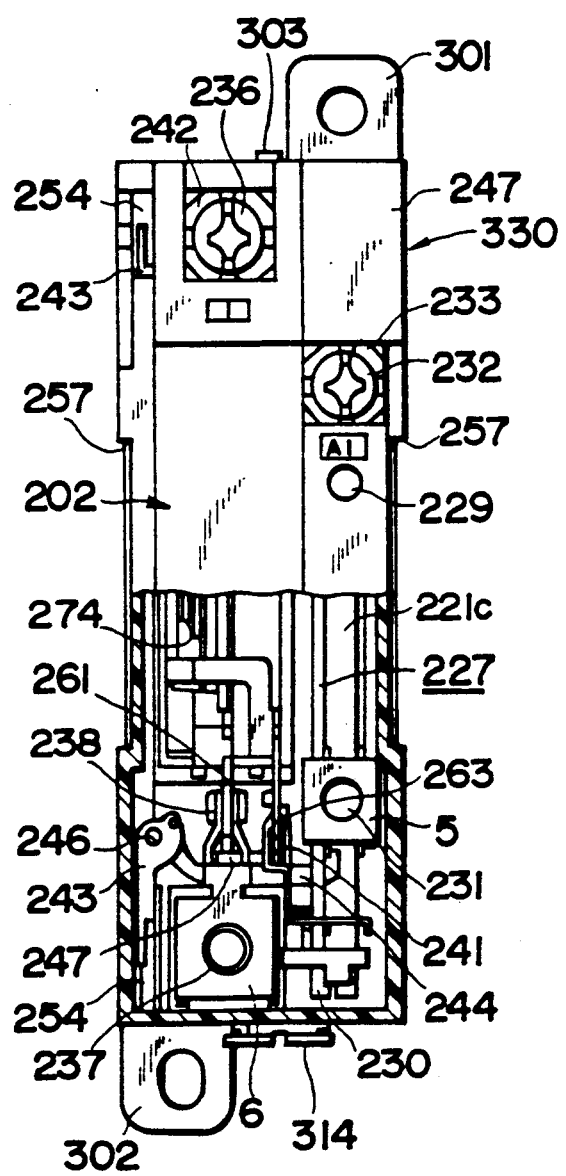
FIGS. 26 and 27 are a front view with a part cut away and a side elevational view with a part cut away of the solid state relay showing a state in which the power circuit cartridge is attached to the relay, respectively.
Figure 27:
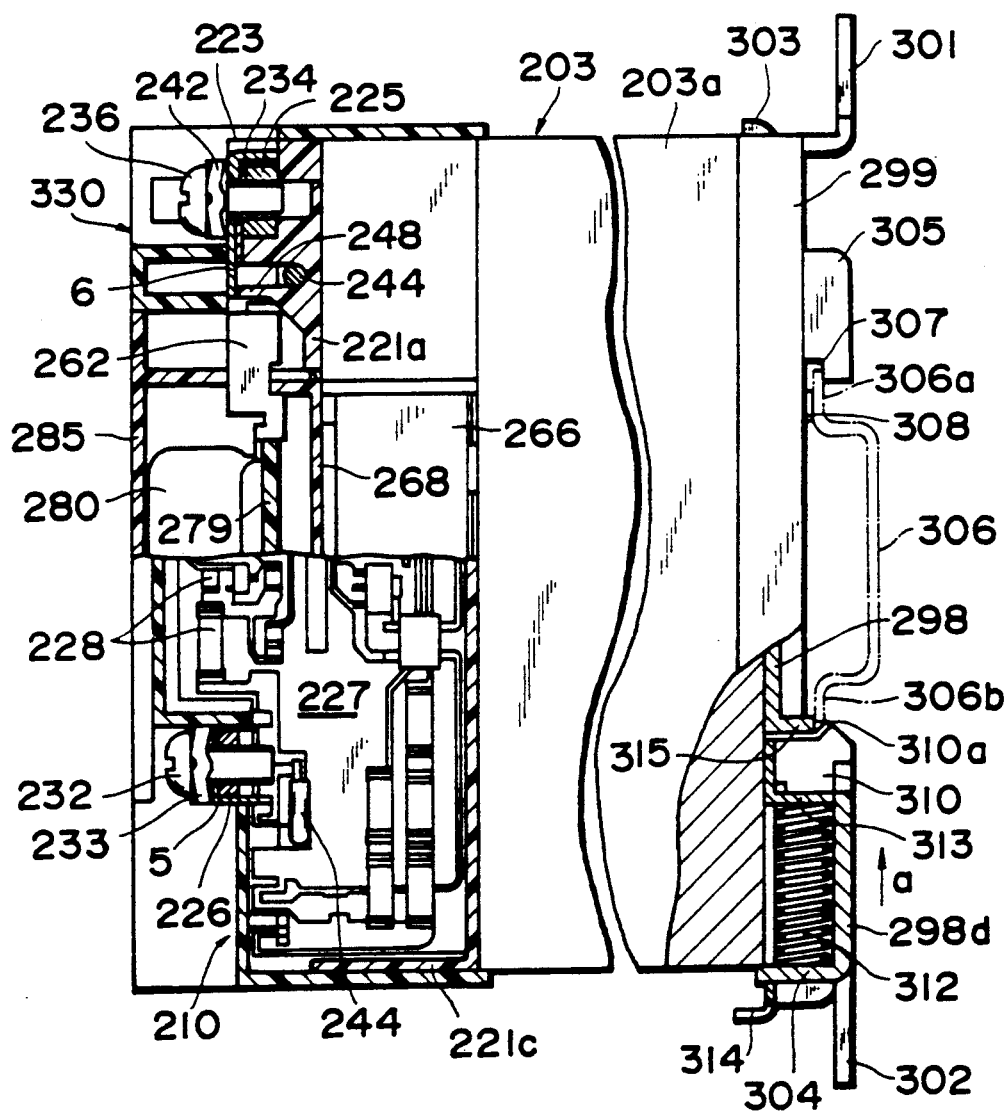

In the diagrams, reference numeral 221 denotes a base made of an insulative synthetic resin of the control circuit block 210 mentioned above. An opening 222 is formed in almost the central portion of a rectangular bottom wall portion 221a. A vertical wall 221b is formed at one end in the width direction (lateral direction). A box-shaped base plate enclosing portion 221c which projects backward is continuously formed so as to be adjacent to the other end in the width direction of the bottom wall portion 221a. Further, nut holding portions 223 are respectively formed in the bottom wall portion 221a so as to be located at both ends in the longitudinal direction. Input terminal holding portions 224 are projected on the opening end portion of the enclosing portion 221c. Load terminal nuts 225 are inserted into the nut holding portions 223. Input terminal nuts 226 are held in the input terminal holding portions 224. Reference numeral 227 denotes a printed circuit board enclosed in the enclosing portion 221c in such an orientation that the board is directed in the front to back direction, that is, in the orientation perpendicular to the base portion front surface 203c of the radiator 203 as shown in FIGS. 26 and 27. A control circuit component element 228 and a light emitting element 229 to display the operation and the like are attached onto the printed circuit board 227. A board inserting guide groove 230 is formed on the inner wall of the enclosing portion 221c. This guide groove also has a positioning function.

The input terminals 5 are made of U-shaped metal fittings and are fixed to predetermined positions of the printed circuit board 227 by a solder or the like and are electrically connected to the input circuit 7. At the enclosing position of the printed circuit board 227, the input terminal nuts 226 are sandwiched between the input terminals 5 and the input terminal holding portions 224. Screw through holes 231 are formed in the input terminals 5. Input terminal screws 232 are threadably inserted into the input terminal nuts 226. Reference numerals 233 denote washers.

Terminal plates 234 for a trigger signal which are made of a pair of thin metal plates are electrically connected and fixed to both end portions in the longitudinal direction of the printed circuit board 227 by soldering in order to obtain a trigger signal for the triac 11 from the load lines. In correspondence to the load terminal nuts 225, holes 235 are formed in the terminal plates 234, respectively.

The load terminals 6 are arranged over the terminal plates 234. Through holes 237 of load terminal screws 236 are formed in the load terminals 6. Further, sockets 238 and 239 to connect the $T_1$ and $T_2$ terminals of the triac 11 are continuously formed to the load terminals 6, respectively. Frame portions 240 to position the load terminals are formed in the nut holding portions 223. A gate socket 241 is electrically connected and fixed to the printed circuit board 227 in parallel with the $T_1$ terminal connecting socket 238 by a solder or the like as shown in FIG. 26. Reference numeral 242 denotes washers for the load terminals.

Coupling terminal members 243 are electrically connected to the input terminals 5 through lead wires 244. Shaft holes 245 formed in the base end portions of the coupling terminal members 243 are rotatably come into engagement with supporting pins 246 formed on the vertical wall portions 221b of the base 221 as shown in FIG. 26, respectively. When a plurality of solid state relays are arranged and used, the coupling terminal members 243 are projected from the side surface in the width direction of the control circuit block 210 and can be connected to the input terminals of the adjacent relays. Reference numerals 247 and 248 denote positioning walls of the sockets 238 and 239. These walls are formed on the bottom wall portion 221a of the base 221.

Reference numeral 249 denotes a substantially box-shaped casing made of a synthetic resin having an open rear end which is attached to the outside of the base 221. The housing 330 of the control circuit block 210 is constructed by both of the casing 249 and the base 221. In correspondence to the opening 222, a through hole 250 which pierces from the front surface side to the rear side is formed in the casing 249. Further, input terminal exposed windows 251, load terminal exposed windows 252, an operation display window 253, output/input holes 254 (FIG. 26) of the coupling terminal members 243, etc. are formed in the casing 249.

Engaging projecting portions 256 are formed on the inner surfaces of both side walls 249a and 249b in the width direction of the casing 249. The engaging projecting portions 256 are come into engagement with engaging grooves 255 formed along the longitudinal direction on both side surfaces in the width direction of the base portion 203b of the radiator 203. Concave notched portions (ventilating grooves) 257 are formed on the outside of the central portions of the side walls 249a and 249b in the front to back direction, respectively.

Figure 28A:
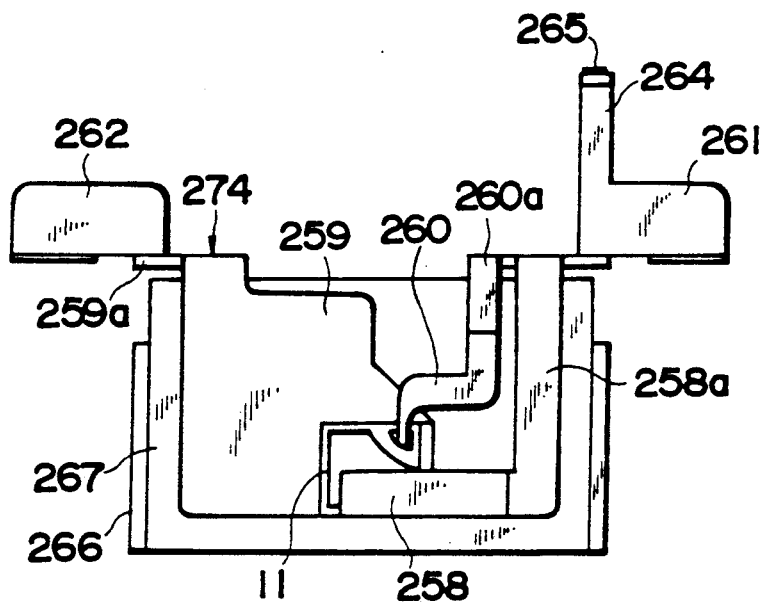
FIGS. 28a, 28b, and 28c are a side elevational view, a bottom view, and a rear view showing a triac block in the power circuit cartridge, respectively.
Figure 28B:
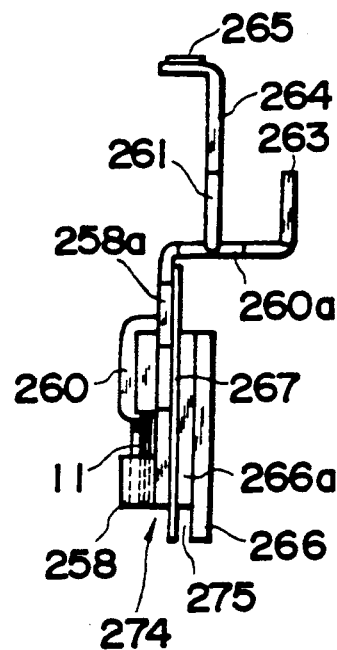
Figure 28C:
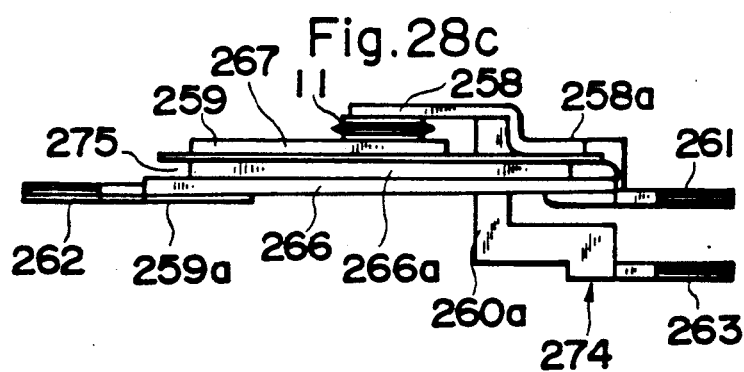

Reference numerals 258, 259, and 260 denote a $T_1$ terminal, a $T_2$ terminal, and a gate terminal of the triac 11 of the power circuit cartridge 202, respectively. The triac 11 is formed like a thin plate and is sandwiched between the $T_1$ terminal 258 and the $T_2$ terminal 259 as shown in FIGS. 28a to 28c and is joined and fixed by a solder or the like. An area of the $T_2$ terminal 259 s set to a wide area in order to reduce the thermal resistance for the heat generation of the triac 11. Reference numerals 261 and 262 denote square connecting blade members serving as external connecting terminal members which are formed to the $T_1$ and $T_2$ terminals 258 and 259 and are led out to the positions corresponding to the sockets 238 and 239 through lead portions 258a and 259a, respectively. Reference numeral 263 denotes a gate terminal connecting blade member serving as an external connecting terminal member which is formed to the gate terminal 260 and is led out to the position corresponding to the gate terminal socket 241 through the lead portion 260a, that is, to the position where the blade member 263 is arranged in parallel with the blade member 261. A projecting member 264 which projects to the front side is formed on the connecting blade member 261. A thermolabel 265 to display a temperature of triac 11 is adhered to the front edge bent curved surface of the projecting member 264.

Reference numeral 266 denotes a heat radiating plate to transfer the heat of the triac 11 to the radiator 203. A convex portion 266a is integrally formed on the surface of the plate 266 on the side of the triac 11. An insulative plate 267 is inserted between the heat radiating plate 266 and the $T_2$ terminal 259, thereby assuring the insulation between the triac 11 and the heat radiating plate 266. The region of the insulative plate 267 corresponding to the $T_2$ terminal 259 is metallized.

Figure 29:
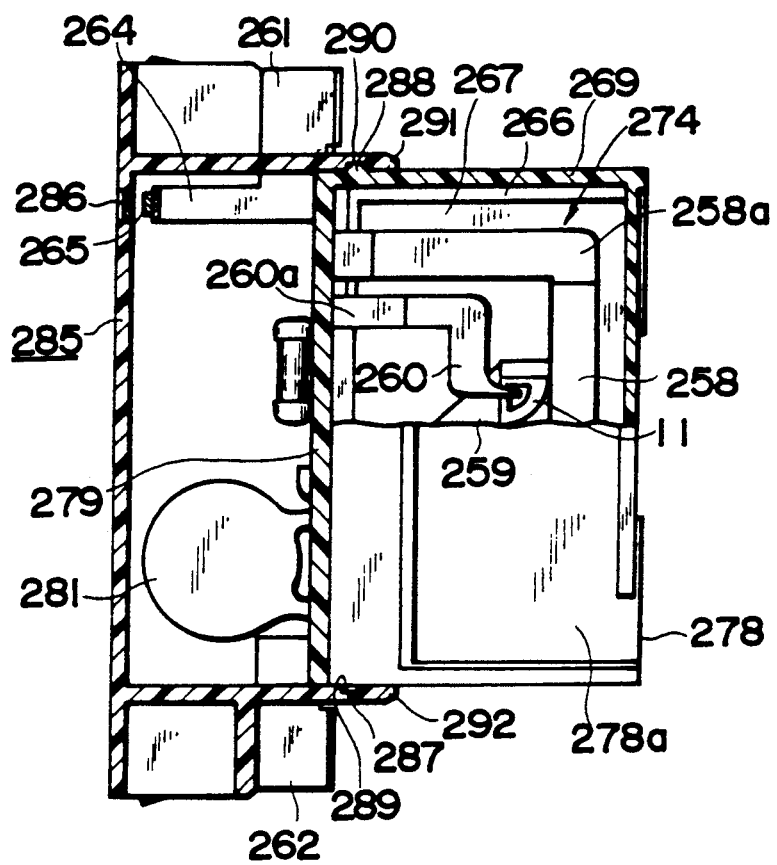
FIGS. 29 and 30 are side elevational view with a part cut away and a bottom cross sectional view showing the power circuit cartridge, respectively.
Figure 30:
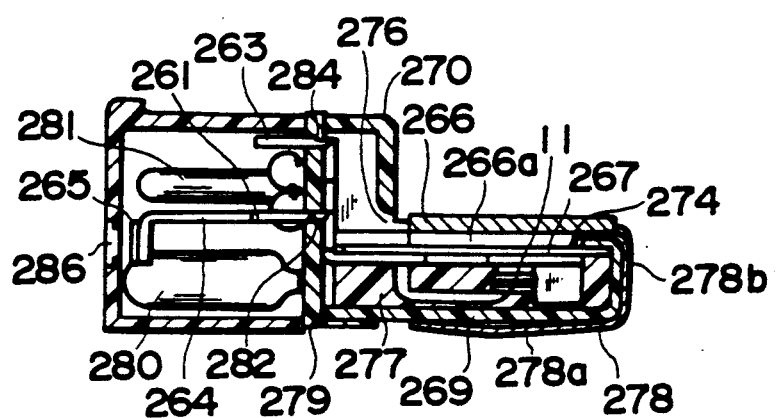

Reference numeral 268 denotes an electrical insulative casing of the power circuit cartridge 202. As shown in FIGS. 29 and 30, the casing 268 comprises a terminal enclosing portion 269 and a base plate setting portion 270 which is continuously formed on the front portion side of the terminal enclosing portion 269. The casing 268 is formed like an almost L-shaped box as a whole. An opening (hole for exposing the heat radiating plate) 271 is formed on one side wall of the terminal enclosing portion 269. Reference numeral 272 denotes an opening of the base plate setting portion 270 and 273 indicates a bridge-shaped portion which is constructed by the side wall of the terminal enclosing portion 269 along the front to back direction. When a triac block 274 containing the triac 11 and the like is enclosed into the casing 268, the bridge-shaped portion 273 enters a gap 275 (FIG. 28c) between the periphery of the heat radiating plate 266 and the periphery of the insulative plate 267, thereby guiding. A heat radiating plate inserting hole 276 is formed in the bottom wall of the base plate setting portion 270. The triac block 274 enclosed in the terminal enclosing portion 269 is covered by a silicon rubber 277 as shown in FIG. 30 so as not to be influenced by the outside atmosphere or foreign matters.

Reference numeral 278 denotes a leaf spring made of metal to press the heat radiating plate. A portion 278a of the leaf spring 278 corresponding to the outer surface of the other side wall of the terminal enclosing portion 269 is slightly bent so as to be elastically deformed. A holding member 278b which is continuously formed at the rear edge is come into engagement with the bottom wall of the terminal enclosing portion 269.

Reference numeral 279 denotes a printed circuit board to set the absorber. A high voltage chip varistor 280, a chip capacitor 281, etc. are installed on the board 279. The printed circuit board 279 is arranged on the base plate setting portion 270. Reference numerals 282 and 283 denote notched grooves (inserting portions) which are formed on the board 279 and into which the root portions of the connecting blade members 261 and 262 for the $T_1$ and $T_2$ terminals are inserted and positioned, respectively. A notched portion (inserting portion) 284 is formed on the board 279. The root portion of the connecting blade member 263 for the gate terminal is inserted into the notched portion 284 and positioned. The connecting blade members 261, 262 and 263 are electrically connected to the circuit board 279 by soldering.

A cartridge cover 285 is made of a synthetic resin and is attached to the front surface side of the cartridge casing 268. An observing window 286 of the thermolabel 265 is formed on the front surface. Further, as shown in FIG. 29, elastic members 291 and 292 having engaging holes 289 and 290 adapted to be come into engagement with engaging projections 287 and 288 formed on the cartridge casing 269 are projected on the cartridge cover 285. First and second slits 293 and 294 are formed in the elastic members 292 and 291, thereby restricting the positions of the front edges of the connecting blade members 261 and 262, respectively. A third slit 295 is formed in the elastic member 292 and restricts the position of the front edge of the connecting blade member 262 for the gate terminal.

A plurality of groove portions 296 are formed on the front surface 203c of the bas portion 203b of the radiator 203 in the longitudinal direction by the pulling-out molding process. One groove portion 296 is set as an inserting concave portion of the enclosing portion 221c of the base 221 of the control block 210. The other groove portion 296 is set as an inserting concave portion of the terminal enclosing portion 269 of the power circuit cartridge 202. Reference numeral 297 denotes a coupling member portion to integrally couple the front edge of the fin portion 203a of the radiator 203. The coupling member portion 297 is formed by the pulling-out molding process of the radiator 203. Rib walls 299 along the longitudinal direction are formed on the coupling member portion 297 so as to face each other at the positions of both ends in the width direction of the radiator 203. Grooves 300 into which both end portions 298a and 298b in the width direction of an attaching base plate 298 are inserted are formed on the opposite surfaces of the rib walls 299 by the pulling-out molding process of the radiator 203. Attaching groove holes 316 and 317 are also formed in the base portion 203b.

The attaching base plate 298 is formed by pressing a substantially rectangular metal plate. Attaching members 301 and 302 for screwing are integrally projected at both ends in the longitudinal direction of the attaching base plate 298 and are used when attaching a control panel or the like (not shown) with screws. A fixing member 303 is projected at one end in the longitudinal direction of the attaching base plate 298 and is caulked to one edge surface side of the coupling member portion 297. The fixing member 303 functions to prevent that the attaching base plate 298 is pulled out to one side in the longitudinal direction of the attaching base plate 298. Reference numeral 304 denotes a restricting member which is formed at the other end in the longitudinal direction of the attaching base plate 298 by being bent to the front side, that is, toward the radiator 203. The restricting member 304 comes into contact with the other end surface of the coupling member portion 297 and functions as a stopper to prevent the attaching base plate 298 from moving to the other side in the longitudinal direction.

Integrated vertical wall members 305 are formed on both sides in the width direction at the positions on the side of one end portion 298c in the longitudinal direction of the attaching base plate 298 by being bent so as to be vertically set on the attaching base plate surface, respectively. As shown in FIG. 27, an inserting groove 307 and a supporting projection 308 are formed on each vertical wall member 305. One rail member portion 306a of a rail member 306 is inserted into the inserting groove 307. The supporting projection 308 supports the rail member portion 306a so as to be away from the rib walls 299.

The other end portion 298d in the longitudinal direction of the attaching base plate 298 is formed like a stairway. A notched hole 309 is formed in this height difference portion 298e. A fixture rail 310 is made of a metal plate and is formed so as to have an almost U-shaped cross sectional view. The fixture rail 310 is arranged in the space between the other end portion 298d and the coupling member portion 297 and is set so as to be movable forward and backward in the longitudinal direction of the attaching base plate 298. An engaging portion 310a is integrally formed on one end side of the fixture rail 310. The engaging portion 310a is projected from the notched hole 309 and is come into engagement with the other rail member portion 306b of the rail member 306.

A long hole 311 is formed in the fixture rail 310. The restricting member 304 is pierced in the long hole 311. The movement of the fixture rail 310 is guided by both of the long hole 311 and the restricting member 304. A coil spring 312 is interposed between a spring seat member 313 which is bent and formed on the fixture rail 310 and the restricting member 304 and applies a spring force to the fixture rail 310 in the progressing direction (indicated by an arrow a). Reference numeral 314 denotes an operating member for disengagement which is formed by being bent to the other end side of the fixture rail 310. A supporting member 315 is formed on the inner wall of the notched hole 309 of the attaching base plate 298 and supports the other rail member portion 306b of the rail member 306.

The assembling procedure of the solid state relay will now be described.

The load terminal nuts 225 are inserted into the nut holding portions 223 of the base 221. The input terminal nuts 226 are attached to the nut holding portions 224. The printed circuit board 227 on which the control circuit component element 228, input terminals 5, terminal plates 234, etc. are installed is inserted into the base plate inserting grooves 230 and enclosed into the enclosing portion 221c as shown in FIGS. 26 and 27. Thus, the input terminal nuts 226 are sandwiched between the nut holding portions 224 and the input terminals 5. The terminal plates 234 are arranged so as to face the load terminal nuts 225. Next, the pair of load terminals 6 are set over the terminal plates 234 as shown in FIG. 26.

On the other hand, after the fixture rail 310 is assembled to the attaching base plate 298 together with the coil spring 312, the attaching base plate 298 is inserted between the grooves 300 on the side of the radiator 203. The fixing member 303 is caulked to the coupling member portion 297, thereby fixing the attaching base plate 298 to the radiator 203.

On the other hand, the enclosing portion 221c of the base 221 is attached to one groove portion 296 on the side of the radiator 203. Further, the coupling terminal members 243 engage engagement with the supporting pins 246 on the side of the base 221. In this state, the casing 249 of the control circuit block is attached to the outside of the base 221. The engaging projections 256 of the casing 249 are fitted into the engaging grooves 255 of the radiator 203, respectively. Thus, the base 221 is sandwiched between the casing 249 and the radiator 203. The pair of input terminals 5 are exposed from the exposed windows 251. The pair of load terminals 6 are exposed from the exposed windows 252. Next, the input terminal screws 232 are threadably inserted into the input terminal nuts 226, thereby threadably attaching the load terminal screws 236 to the load terminal nuts 225.

Figure 33:
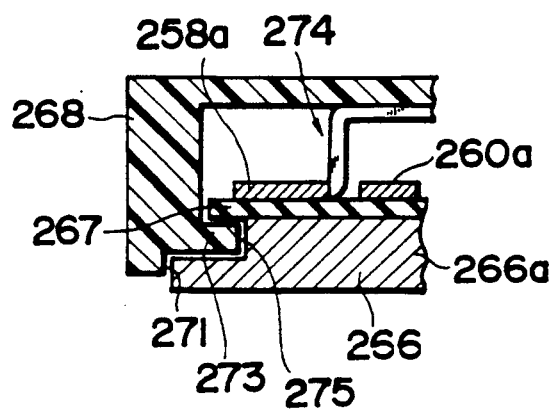
FIG. 33 is a partial cross sectional view showing an inserting guide structure of a power semiconductor element block.
Figure 34:
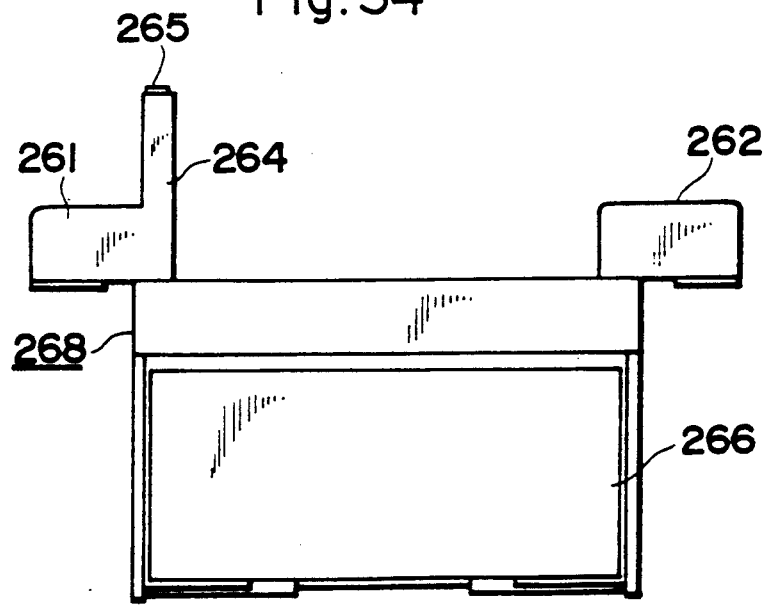
FIG. 34 is a diagram showing a state in which the power semiconductor element block is enclosed in a casing.

On the other hand, the triac 11 is fixed by soldering or the like so as to be sandwiched between the $T_1$ terminal 258 and the $T_2$ terminal 259. The gate terminal 260 is also connected to the triac 11. Further, the heat radiating plate 266 is joined to the opposite surface of the $T_2$ terminal 258 through the insulative plate 267, thereby constructing the triac block 274 shown in FIGS. 28a to 28c. The gap 275 between the periphery of the insulative plate 267 of the block 274 and the periphery of the heat radiating plate 266 is inserted and guided into the bridge-shaped portion 273 of the cartridge casing 268 as shown in FIG. 33. The heat radiating plate 266 is inserted into the inserting hole 276. Thus, the heat radiating plate 266 is joined to the outer surface of the bridge-shaped portion 273 so as to close the opening 271 and the triac 11 and the like are enclosed into the terminal enclosing portion 269. At this time, the connecting blade members 261 and 263 are projected from one side portion opposite to the opening edge portion of the casing 268 and the connecting blade member 262 is projected from the other side portion and set as shown in FIG. 34. The triac 11 and the like are protected by injecting the silicon rubber 277 into the terminal enclosing portion 269. The leaf spring 278 is also attached to the outer surface of the terminal enclosing portion 269.

Figure 35:
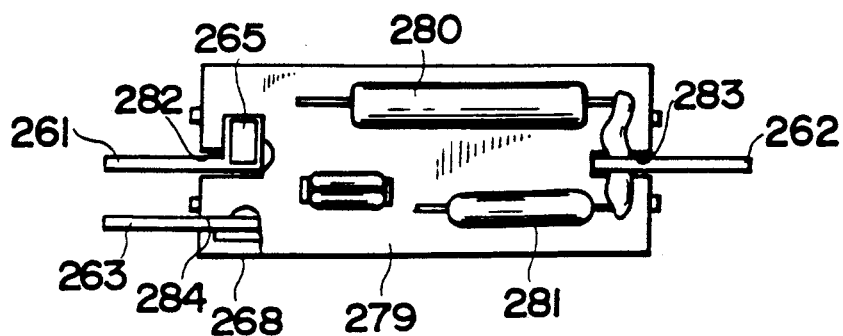
FIG. 35 is a front view of the power circuit cartridge showing a state before a cover is attached.
Figure 36A:
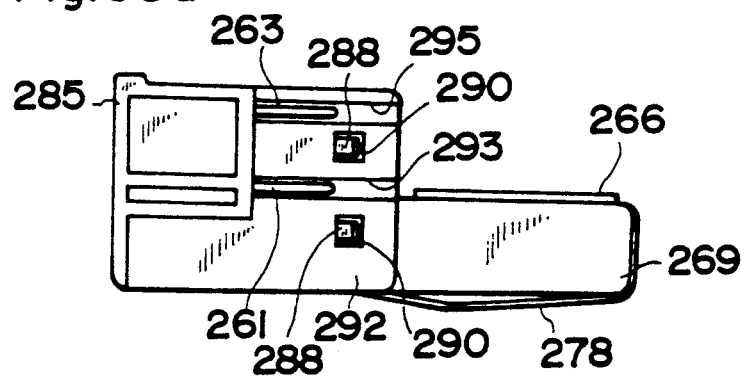
FIGS. 36a and 36b are explanatory diagrams of an engaging state of a connecting blade member and a slit in the power circuit cartridge when the cover is attached.
Figure 36B:
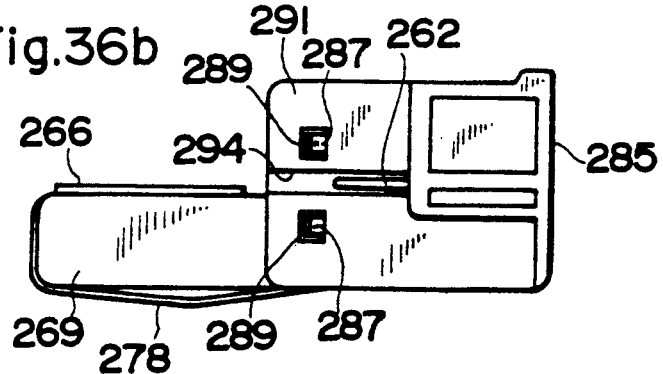

Thereafter, the printed circuit board 279 on which the absorber circuit component parts 280, 281, etc. are attached is set onto the cartridge casing 268. As shown in FIG. 35, the connecting blade members 261 and 262 are inserted into the notched grooves 282 and 283 and the connecting blade member 263 is inserted into the notched portion 284, respectively. After that, the connecting blade members 261, 262 and 263 are electrically connected to the printed circuit board 279 by soldering. Next, the connecting blade members 261, 262 and 263 are inserted into the first, second and third slits 293, 294, and 295 of the cover 285, respectively. As shown in FIGS. 36a and 36b, the engaging holes 289 and 290 of the cover 285 are come into engagement with the engaging projections 287 and 288 of the casing 268. Thus, as shown in FIGS. 29 and 30, the casing 268 and cover 285 are coupled so as to sandwich the printed circuit board 279. Consequently, the thermolabel 265 is set in correspondence to the observing window 286 and the power circuit cartridge 202 is assembled.

Finally, the power circuit cartridge 202 is inserted into the through hole 250 of the casing 249 of the control circuit block 210. The terminal enclosing portion 269 is inserted into the other groove portion 296 of the radiator 203 by piercing the opening 222 of the base 221. Thus, the spring force of the leaf spring 278 acts, thereby allowing the heat radiating plate 266 come into pressure contact with the inner wall surface of the groove portion 296. At this time, the connecting, blade members 261, 262 and 263 engage with the sockets 238, 239 and 241, respectively. The $T_1$ and $T_2$ terminals 258 and 259 are electrically connected to the pair of load terminals 6 and the gate terminal 260 is also connected to a predetermined circuit.

In the above construction, when the relay is attached for use, the attaching device 204 is used. When attaching the relay to a panel surface or the like (not shown), the attaching members 301 and 302 of the attaching base plates 298 are screwed to the panel surface. On the other hand, in the case of attaching the relay to the rail member 306, the rail member portions 306a and 306b are inserted between the engaging portion 310a on the front edge side of the fixture rail 310 and the engaging groove 307.

When a load (not shown) is connected to the pair of load terminals 6 and an input signal is applied between the pair of input terminals 5, the light emitting element 229 is lit on. This state can be observed through the operation display window 253 by the eyes. By applying the input signal, the trigger circuit 8 operates through the input circuit 7, the triac 11 is made conductive, and an electric power is supplied to the load.

When the triac 11 generates the heat due to the operation thereof, this heat is radiated by the radiator 203 through the heat radiating plate 266. On the other hand, if a temperature of triac 11 increases due to the heat generation, the thermolabel 265 changes the color. This color change can be observed through the observing window 286 of the cover 285 on the side of the cartridge by the eyes. Therefore, the heat generating state of the triac 11 can be easily checked.

If the triac 11 is broken due to a short-circuit accident, abnormal heat generation, or the like, it is sufficient to exchange the power circuit cartridge 202. That is, by pulling out the power circuit cartridge 202 to the front side, the connecting blade members 261, 262 and 263 are detached from the sockets 238, 239 and 241. Therefore, the power circuit cartridge 202 is removed from the relay main body 201 and a new power circuit cartridge 202 is attached by inserting. In this case, since the power circuit cartridge 202 can be attached or detached by the inserting or pulling operation, the exchanging work can be promptly performed.

By exchanging the power circuit cartridge 202, the absorber circuit parts which easily deteriorate can be also simultaneously exchanged, so that the life becomes long and the high reliability is obtained.

Further, the connecting state of the load terminals 6 does not need to be changed, so that the exchanging work can be promptly performed and there is no fear of occurrence of the erroneous wiring upon repair, or the like.

Particularly, the vertically standing printed circuit board 227 is enclosed into the enclosing portion 221c formed in a housing 330 of the control circuit block 210. The enclosing portion 221c is fitted into one groove portion 296 formed on the base portion front surface 203c of the radiator 203. On the other hand, the terminal enclosing portion 269 of the power circuit cartridge 202 is fitted into the other groove portion 296 formed on the base portion front surface 203c of the radiator 203. Therefore, the space at the front surface 203c of the radiator 203 can be effectively used and the relay can be miniaturized and can be made thin. Moreover, by merely inserting the enclosing portion 221c of the control circuit block 210 and the terminal enclosing portion 269 of the power circuit cartridge 202 into the groove portions 296, they are positioned to the radiator 203, so that they can be easily assembled. Further, the housing 330 of the control circuit block 210 and the power circuit cartridge 202 can be stably held.

In addition, the printed circuit board 227 enclosed in the enclosing portion 221c and the power circuit cartridge 202 are electrically isolated and arranged, so that there is an advantage such that the electrical insulative performance can be improved.

The above embodiment has been described with respect to the example in which two groove portions 296 are formed on the base portion front surface 203c of the radiator 203. However, the number of groove portions can be increased as necessary.

Figure 31:
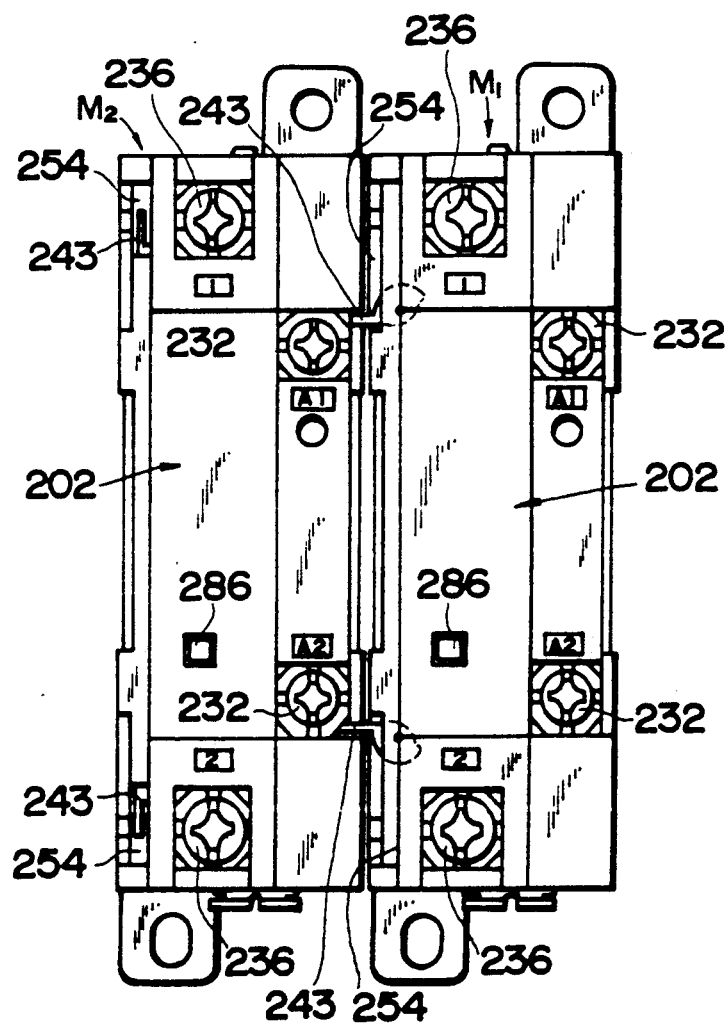
FIG. 31 is an explanatory diagram in the case where a plurality of solid state relays are arranged and used.

In the case of arranging a plurality of solid state relays $M_1$ and $M_2$ and using them as shown in FIG. 31, the pair of coupling terminal members 243 of the solid state relay $M_1$ are pulled out and projected to the side from the output/input holes 254 by the rotating operation and are screwed by the pair of input terminal screws 232 of the adjacent solid state relay $M_2$. Thus, the input terminals 5 of the relay $M_1$ are electrically connected in parallel with the input terminals 5 of the adjacent relay $M_2$ through the coupling terminal members 243.

Figure 32:
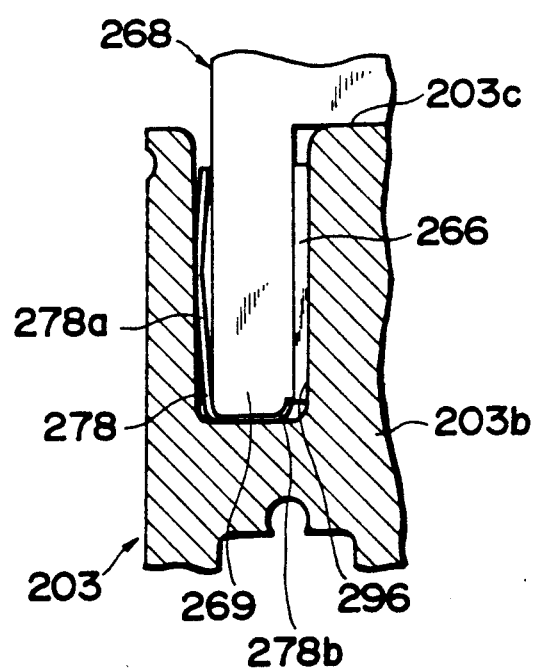
FIG. 32 is an enlarged cross sectional view showing a state in which the power circuit cartridge is attached.

Further, since the heat radiating plate 266 of the power circuit cartridge 202 is vertically arranged for the base portion front surface 203c of the radiator 203, by setting a depth of groove portion 296 of the radiator 203 in correspondence to a length in the front to back direction of the heat radiating plate 266, the whole exposed surface of the heat radiating plate 266 is come into contact with the inner wall of the groove portion 296 as shown in FIG. 32, so that the heat can be effectively radiated due to the wide contact area. In other words, the width dimension W (FIG. 24) of the radiator 203 can be set to a small value. This is advantageous when a plurality of solid state relays $M_1$ and $M_2$ are arranged as shown in FIG. 31 mentioned above and the input terminals 5 are connected in parallel through the coupling terminal members 43. That is, the solid state relays $M_1$ and $M_2$ can be made thin without an anxious about the heat radiating performance, so that the attaching space can be reduced.

On the other hand, since the heat radiating plate 266 is come into pressure contact with the inner wall of the groove portion 296 by the leaf spring 278, even if dusts or the like are deposited on the heat radiating plate 266 or the inner wall of the groove portion 296 when the power circuit cartridge 202 is attached, they can be ground down and eliminated. Therefore, the good contacting state between the heat radiating plate 266 and the inner wall of the groove portion 296 can be assured. Moreover, the shaking in the attaching state of the casing is prevented by the spring force of the leaf spring 278 and the vibration resistant performance is derived. The heat radiating performance can be further improved because of the good contacting state as well.

Further, in the embodiment, since the holding member 278b on the base end side of the leaf spring 278 is come into contact with the heat radiating plate 266, there is an advantage such that the concentration of the stresses of the leaf spring 278 to the casing 268 can be avoided.

In the embodiment, the leaf spring 278 is made of metal. However, the leaf spring can be also integrally formed to the casing 268 made of a synthetic resin. In this case, the number of parts is reduced.

Further, a U-shaped heat radiating plate can be also used as the heat radiating plate 266 so as to be exposed to both surfaces of the casing 268. In this case, the heat radiating performance can be further improved and there is also an advantage such that the casing 268 can be protected.

On the other hand, the leaf spring 278 can be also made of a shape storage alloy material or bimetal material which is deformed so as to increase the pressing spring force to the heat radiating plate 266 when the temperature becomes high.

Although the embodiment has been described with respect to an example in which the power circuit cartridge 202 and the control circuit block 210 are separately constructed, the invention is not limited to this structure.

Particularly, in the assembly of the power circuit cartridge 202, by constructing the triac block 274 consisting of the triac 11, heat radiating plate 266, etc., by merely inserting the block 274 into the casing 268, it is set in a state in which the heat radiating plate 266 is exposed from the exposed hole (opening) 271, so that the power circuit cartridge 202 can be easily assembled to the casing 268. Moreover, in the inserting state of the triac block 274 into the casing 268, the connecting blade members 261, 262 and 263 connected to the $T_1$, $T_2$ and gate terminals 258, 259 and 260 of the triac 11 are projected as the external connecting terminal members from the opening edge portion of the casing 268 to the outside as shown in FIG. 34. Therefore, a work to connect separate external lead-out connecting conductors to the terminals is eliminated and the assembling work can be efficiently executed.

Further, in this embodiment, the gap 275 is formed between the periphery of the heat radiating plate 266 and the periphery of the insulative plate 267 by the convex portion 266a of the heat radiating plate 266. This gap 275 is fitted and guided into the bridge-shaped portion 273 of the casing 268 as shown in FIG. 33. Therefore, the triac block 274 is set to the proper position and the insulation distance between the triac 11 and the heat radiating plate 266 becomes large due to the bridge-shaped portion 273 and the insulating performance can be improved.

On the other hand, since the bridge-shaped portion 273 is inserted into the gap 275, there is also an advantage such that the leakage of the silicon rubber 277 injected into the casing 268 to the side of the heat radiating plate 266 can be certainly blocked by the bridge-shaped portion 273. The guiding means of the triac block 274 is not limited to the means by the gap 275 and bridge-shaped portion 273 but other modification structures can be also used.

Further, in the assembly of the power circuit cartridge 202, the connecting blade members 261, 262 and 263 coupled with the $T_1$, $T_2$ and gate terminals 258, 259 and 260 of the triac 11 are projected to the side of the casing 268 and inserted into the notched grooves 282 and 283 of the printed circuit board 279 and into the notched portion 284 as shown in FIG. 35. Due to this, in a state in which each root of the connecting blade members 261, 262 and 263 is positioned, the connecting blade members can be soldered to the printed circuit board 279. That is, the connecting blade members 261, 262 and 263 are electrically connected to the absorber 12 at proper positions. The triac block 274 and the printed circuit board 279 are mechanically coupled.

Further, since the printed circuit board 279 is sandwiched by the casing 268 and the cover 285 due to the coupling therebetween, they can be easily assembled without using any special fixing member of the printed circuit board 279.

On the other hand, in this example, in the coupling state of the casing 268 and the cover 285, as shown in FIGS. 36a and 36b, the positions in the plate thickness direction of the connecting blade members 261, 262 and 263 are restricted by the first, second and third slits 293, 294 and 295 on the side of the cover 285, respectively. Therefore, the connecting blade members 261, 262 and 263 can be also smoothly connected to the sockets 238, 239 and 241.

Figure 37:
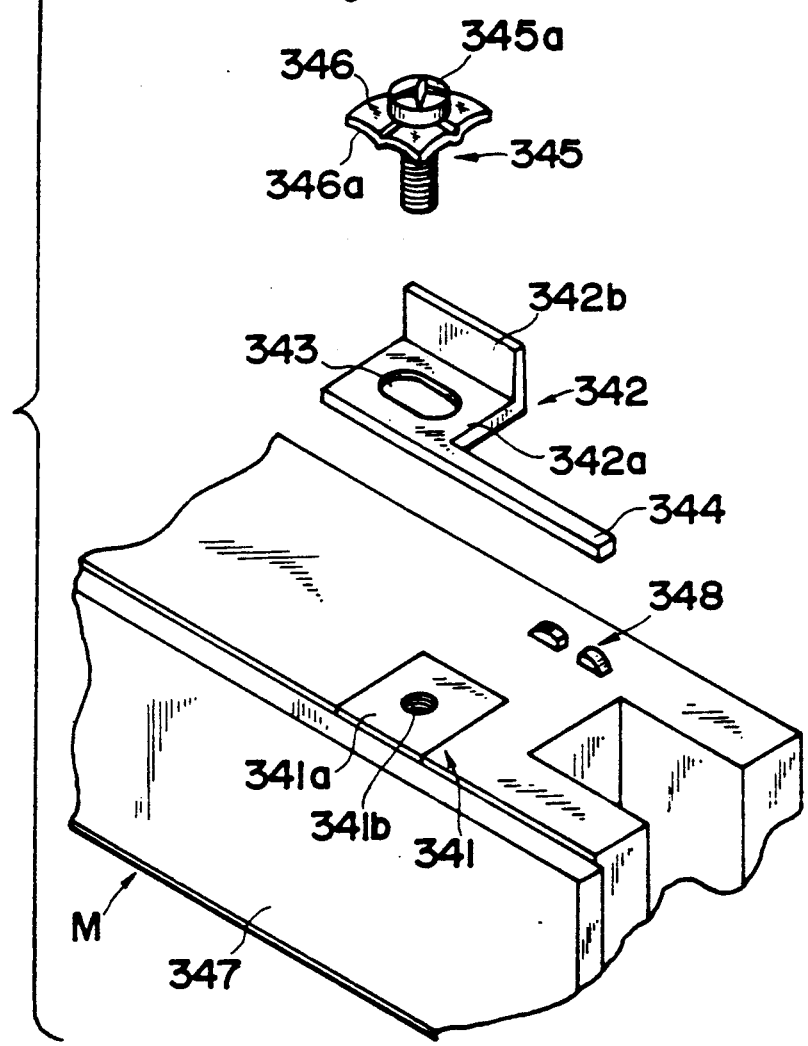
FIG. 37 is an exploded perspective view of a terminal apparatus according to the invention.
Figure 38A:
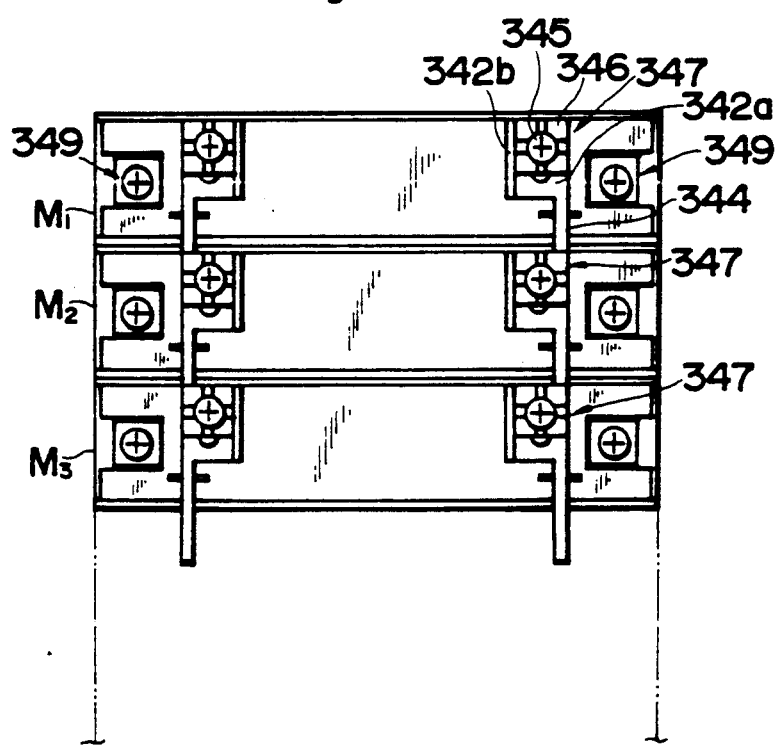
FIGS. 38a and 38b are a plan view and a partial enlarged diagram showing a connecting wiring state of apparatuses having terminal apparatuses.
Figure 38B:
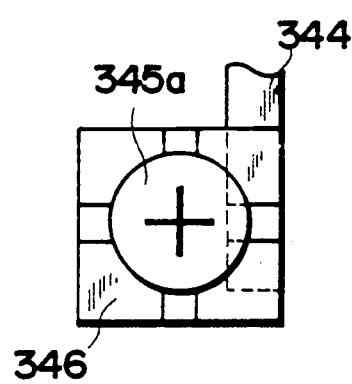

FIGS. 37, 38a and 38b show a terminal apparatus according to the invention. This terminal apparatus relates to the development of the apparatus including the foregoing coupling terminal members 43 and 243.

FIG. 37 is an exploded perspective view of the terminal apparatus. In the diagram, reference numeral 341 denotes a terminal member.

The terminal member 341 is electrically connected to an electric circuit (not shown) included in an apparatus M such as a solid state relay. A flat surface portion 341a is exposed to the upper surface of a terminal base 347 provided over the apparatus M and a screw hole 341b is also opened. A coupling terminal 342 has a flat plate portion 342a capable of being joined to the flat surface portion 341a of the terminal member 341 and also has a guide surface 342b which is vertically formed from one side of the flat plate portion 342a. The coupling terminal 342 is formed like an angle steel.

On the other hand, an adjusting long hole 343 is formed in the flat plate portion 342a. A connecting arm 344 is projected and formed from the other side of the flat plate portion 342a so as to have a length such that it can be joined with a terminal of a distant apparatus.

Reference numeral 345 denotes a terminal screw. A terminal washer 346 is freely rotatably attached to a lower portion of a screw head 345a of the terminal screw 345.

The terminal washer 346 is formed like a square whose one side is close to the guide member 342b of the coupling terminal 342. Concave portions 346a each having a width adapted to be come into engagement with the connecting arm 344 are formed in a lower surface corner portion of the washer 346.

In this terminal apparatus, the terminal screw 345 is screwed into the screw hole 341b of the terminal member 341 by piercing the adjusting long hole 343 of the coupling terminal 342. Due to this, the coupling terminal 342 is rotatably attached to the terminal member 341.

That is, since the adjusting long hole 343 is formed in the coupling terminal 342, the connecting arm 344 is movable forward and backward by the adjusting long hole 343 by the rotating operation. By adjusting the front edge portion of the connecting arm 344, the arm can be freely joined to the terminal of the distant apparatus. The coupling terminal 342 can be easily operated by using the standing guide member 342b.

Therefore, according to the terminal apparatus, when the apparatuses are electrically connected, they can be connected without attaching other separate parts such as crossover or the like to the terminals, so that the number of wiring steps and an amount of wiring material or the like can be reduced and the cost can be remarkably reduced.

A practical example in the case where such a terminal apparatus is used for the apparatus will now be described with reference to FIGS. 38a and 38b.

A circuit section is included in the casing of the apparatus $M_1$ and the terminal base 347 is attached over the apparatus.

A terminal apparatus consisting of the terminal member 341, coupling terminal 342, and terminal screw 345 is mounted on the upper surface of the terminal base 347.

Further, another pair of terminal bases 349 are mounted on both end portions of the upper surface of the terminal base 347.

The internal circuits of the other apparatuses $M_2$ and $M_3$ are changed as necessary and the terminal bases 347 of the same structure as that of the apparatus $M_1$ are provided.

Therefore, when electrically connecting these apparatuses, the coupling terminal 342 of the apparatus $M_1$ is first operated and the connecting arm 344 is fixed between guides 348 of the terminal bases 347. Further, the front edge portion of the arm 344 is inserted into the coupling terminal 342 of the apparatus $M_2$.

By threadably operating the terminal screw 345 of the apparatus $M_1$, the coupling terminal 342 is fastened and fixed to the terminal member 341 by the terminal washer 346.

On the other hand, by threadably operating the terminal screw 345 of the apparatus $M_2$, the lower surface concave portion 346a of the terminal washer 346 covers the front edge portion of the extended connecting arm 344 projected from the apparatus $M_1$. The coupling terminal 342 is fastened and fixed to the terminal member 341. In this manner, by operating the pair of right and left terminal apparatuses on the terminal bases 347, the apparatuses $M_1$ and $M_2$ can be electrically connected. Further, the apparatuses $M_2$ and $M_3$ can be sequentially electrically connected.

A power source apparatus which can be used as a power source apparatus of a solid state relay will now be described with reference to FIGS. 39 to 41.

Figure 39:
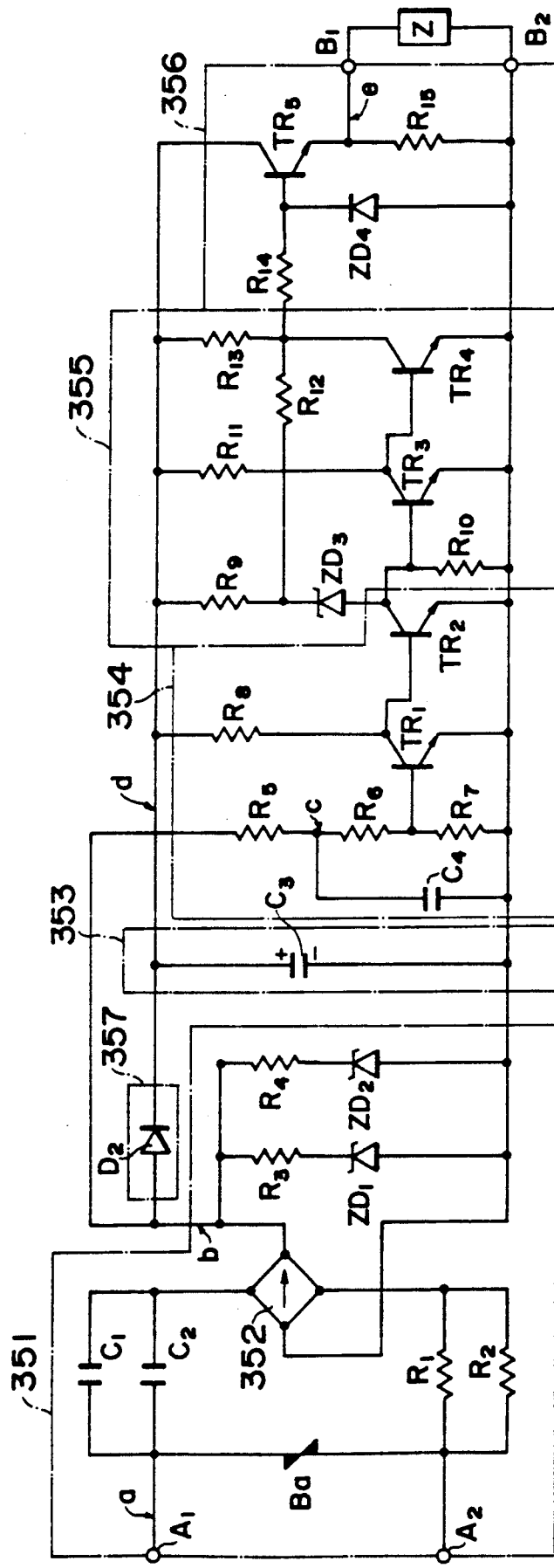
FIG. 39 is a circuit diagram showing an embodiment of a power source apparatus according to the invention.

FIG. 39 is a circuit diagram of the power source apparatus.

In the diagram, reference numeral 351 denotes a rectifier; 352 is a diode bridge circuit; 353 a smoothing circuit; 354 a voltage detecting circuit; 355 a switching circuit; 356 an output circuit; and 357 a separating circuit. The separating circuit 357 consists of a diode $D_2$ and shuts out a reverse current from the smoothing circuit 353 to the voltage detecting circuit 354 That is, a smoothing capacitor $C_3$ constituting the smoothing circuit 353 is connected in parallel between output terminals of the rectifier 351 through the diode $D_2$ in the forward direction.

In the voltage detecting circuit 354, a time constant circuit consisting of a series circuit of a resistor $R_5$ and a capacitor $C_4$ is connected in parallel between the output terminals of the rectifier 351. The time constant circuit has a time constant smaller than a time constant of the smoothing circuit 353.

A voltage dividing circuit consisting of resistors $R_6$ and $R_7$ is connected in parallel with the capacitor $C_4$. A base of an NPN transistor $TR_1$ is connected to a voltage dividing point of the resistors $R_6$ and $R_7$. A collector of the transistor $TR_1$ is connected to a positive terminal of the smoothing capacitor $C_3$ through the resistor $R_8$. An emitter of the transistor $TR_1$ is connected to a negative terminal of the smoothing capacitor $C_3$. A transistor $TR_2$ functions as an inverter. A base of the transistor $TR_2$ is connected to the collector of the transistor $TR_1$. An emitter of the transistor $TR_2$ is connected to the negative terminal of the capacitor $C_3$.

In the switching circuit 355, a resistor $R_{10}$ is connected between the collector and emitter of the transistor $TR_2$ constituting the voltage detecting circuit 354. A collector of the transistor $TR_2$ is connected to the positive terminal of the smoothing capacitor $C_3$ through a series circuit of a Zener diode $ZD_3$ and a resistor $R_9$ and is also connected to a base of a transistor $TR_3$. Further, a collector of the transistor $TR_3$ is connected to the positive terminal of the smoothing capacitor $C_3$ through a resistor $R_{11}$. An emitter of the transistor $TR_3$ is connected to the negative terminal of the capacitor $C_3$.

A transistor $TR_4$ functions as an inverter. A collector of the transistor $TR_4$ is connected to the positive terminal of the capacitor $C_3$ through a resistor $R_{13}$. An emitter of the transistor $TR_4$ is connected to the negative terminal of the capacitor $C_3$. Further, the collector of the transistor $TR_4$ is also connected to a cathode of the Zener diode $ZD_3$ through a resistor $R_{12}$.

In the output circuit 356, a series circuit of a resistor $R_{14}$ and a Zener diode $ZD_4$ is connected between the collector and emitter of the transistor $TR_4$ constituting the switching circuit 355. A collector of a transistor $TR_5$ is connected to the positive terminal of the capacitor $C_3$. An emitter of the transistor $TR_5$ is connected to the negative terminal of the capacitor $C_3$ through a resistor $R_{15}$. Further, a base of the transistor $TR_5$ is connected to a voltage dividing point of the Zener diode $ZD_4$ and the resistor $R_{14}$. $B_1$ and $B_2$ denote the pair of output terminals connected across the resistor $R_{15}$. The load Z is connected between the output terminals $B_1$ and $B_2$.

Next, the operation of the above arrangement will now be described.

When an AC input voltage $L_a$ of a relatively low level shown in FIG. 40a is applied between the input terminals $A_1$ and $A_2$ at time $t_1$, the AC input voltage $L_a$ is full wave rectified by the rectifier 351 and becomes a rectified output $L_b$ as shown in FIG. 40b. The rectified output $L_b$ is smoothed by the smoothing circuit 353 and by the time constant circuit of the voltage detecting circuit 354, respectively.

As mentioned above, since the time constant of the voltage detecting circuit 354 is smaller than that of the smoothing circuit 353, a voltage $L_c$ across the capacitor $C_4$ becomes a rectified output including the ripple component smaller than the voltage $L_d$ across the capacitor $C_4$ shown in FIG. 40d, as shown in FIG. 40c.

In the rectified output $L_c$ for the AC input $L_a$ of the relatively low level, a conductive voltage $V_{1be}$ between the base and emitter of the transistor $TR_1$ is set such that the lowest value of the voltage $L_c$ across the capacitor $C_4$, that is, the valley of the ripple is set to an on/off level $X_1$ of the transistor $TR_1$ or more. Therefore, the transistor $TR_1$ is turned on and the transistor $TR_2$ of the voltage detecting circuit 354 is turned off.

On the other hand, in a rectified output $L_d$ for the AC input $L_a$ of the relatively low level, a conductive voltage $V_{3be}$ between the base and emitter of the transistor $TR_3$ is set such that the maximum value of the voltage $L_d$ across the capacitor $C_3$, i.e., the mountain of the ripple is not set to an on level $Y_1$ of the transistor $TR_3$ or more. Therefore, the transistor $TR_3$ keeps the OFF state and the transistor $TR_4$ of the switching circuit 355 is turned on.

Due to the turn-on of the transistor $TR_4$ constituting the switching circuit 355, the transistor $TR_5$ of the output circuit 356 keeps the OFF state and an output voltage $L_e$ between the output terminals $B_1$ and $B_2$ is set to 0 V. At this time, a current is supplied to the transistor $TR_4$ through the resistor $R_{13}$.

Next, when an AC input voltage $H_a$ of a relatively high level shown in FIG. 40a is applied between the input terminals $A_1$ and $A_2$ at time $t_2$, the AC input voltage $H_a$ is full wave rectified by the rectifier 351 and becomes the rectified output $H_b$ as shown in FIG. 40b. This rectified output $H_b$ is smoothed by the smoothing circuit 353 and by the time constant circuit of the voltage detecting circuit 354, respectively.

In the rectified output $H_c$ for the AC input $H_a$ of the relatively high level, as shown in FIG. 40c, since the valley of the ripple is set to the on/off level $X_1$ of the transistor $TR_1$ or more, the transistor $TR_1$ keeps the ON state and the transistor $TR_2$ of the voltage detecting circuit 354 keeps the OFF state.

On the other hand, in the rectified output $H_d$ for the AC input $H_a$ of the relatively high level, as shown in FIG. 40d, since the valley of the ripple is set to the on level $Y_1$ of the transistor $TR_3$ or more, the transistor $TR_3$ is turned on and the transistor $TR_4$ of the voltage detecting circuit 354 is turned off. Due to the turn-off of the transistor $TR_4$ constituting the switching circuit 355, the transistor $TR_5$ of the output circuit 356 is turned on and the voltage $H_e$ is output between the output terminals $B_1$ and $B_2$ at time $t_3$.

When the AC input $H_a$ of the relatively high level shown in FIG. 40a applied between the input terminals $A_1$ and $A_2$ is shut off at time $t_4$, the output voltage $H_d$ of the smoothing circuit 353 of a large time constant gradually decreases but the voltage $L_c$ across the capacitor $C_4$ of a small time constant rapidly decreases and becomes the on/off level $X_1$ of the transistor $TR_1$ or less. Thus, the transistor $TR_1$ of the voltage detecting circuit 354 is turned off and the transistor $TR_2$ is turned on.

Due to the turn-on of the transistor $TR_2$ constituting the voltage detecting circuit 354, the transistor $TR_3$ of the switching circuit 355 is turned off and the transistor $TR_4$ is turned on. Due to the turn-on of the transistor $TR_4$, the transistor $TR_5$ of the output circuit 356 is turned off and the output voltage $L_e$ between the output terminals $B_1$ and $B_2$ is returned to 0 V at time $t_5$.

FIG. 41 is a characteristic diagram showing the relation between the AC input voltage and the output voltage after the smoothing. In this diagram, when the AC input voltage is sequentially increased, the smoothed output voltage rises along a load characteristic A by the resistor $R_{13}$. When the input voltage reaches $a_1$ and the transistor $TR_5$ of the output circuit 356 is turned on due to the turn-on of the transistor $TR_4$ of the switching circuit 355, since the resistance value of the resistor $R_{13}$ is set to be smaller than the load impedance at the time of the full load, if the load Z is connected between the output terminals $B_1$ and $B_2$, the smoothed output voltage rises from point D on the load characteristic A due to the resistor $R_{13}$ to point E on a full load characteristic B. An input voltage $a_1$ at this time is the operating voltage of the switching circuit 355.

Next, when the input voltage is decreased and reaches an off level $Y_2$ of the switching circuit 355, the transistor $TR_3$ of the switching circuit 355 is turned off at point F on the full load characteristic B, so that the transistor $TR_4$ of the switching circuit 355 is turned on. The load is switched to the resistor $R_{13}$ of a low resistance value. Thus, the smoothed output voltage rapidly decreases and is returned to point G on the load characteristic A by the resistor $R_{13}$. An input voltage $a_2$ at this time is the return voltage of the switching circuit 355.

On the other hand, if the load Z is not connected between the output terminals $B_1$ and $B_2$, when the input voltage reaches $a_1$, the smoothed output voltage rises from point D on the load characteristic A by the resistor $R_{13}$ to point I on a loadless characteristic H. However, when the voltage detecting circuit 354 is not provided, the input voltage is reduced and if the smoothed output voltage does not reach the off level $Y_2$ of the switching circuit 355, that is, point J on the loadless characteristic H, the switching circuit 355 is not returned unless the smoothed output voltage is not returned to point K on the load characteristic A by the resistor $R_{13}$.

In other words, a return voltage $a_3$ at this time extremely decreases as compared with the return voltage $a_2$. If the return voltage $a_2$ is reduced in order to reduce the current to be consumed by each circuit as small as possible, the return voltage $a_3$ extremely decreases. Thus, there is a drawback such that the switching circuit 355 is returned by a malfunction due to a surge voltage or the like.

However, by providing the voltage detecting circuit 354, when the input voltage decreases until the on/off level $X_1$ of the transistor $TR_1$, the transistor $TR_2$ is turned on and the switching circuit 355 is forcedly returned. Consequently, the smoothed output voltage is returned from point L on the loadless characteristic H to point M on the load characteristic A by the resistor $R_{13}$ and the switching circuit 355 is returned. A return voltage $a_4$ at this time approaches to the return voltage $a_2$ and it is possible to prevent that it remarkably decreases.

In the embodiment, even if the time constant of the voltage detecting circuit 354 is short, a desired object can be accomplished by keeping the voltage of the valley of the ripple at the on/off level $X_1$ of the transistor $TR_1$. However, the ripple of the smoothing circuit 353 needs to be suppressed to a voltage E-F in FIG. 41 or less and a large time constant of a certain degree is required at a full load.

As will be obvious from the above description, since there is provided the switching circuit 355 which outputs when the smoothed output voltage reaches a specified value as shown in FIG. 39, even if a ripple exists in the smoothed output voltage, as shown in FIG. 40e, the output voltage generated between the output terminals $B_1$ and $B_2$ digitally changes. Moreover, since the lower limit value of the return voltage of the switching circuit 355 is determined by the voltage detecting circuit 354, even within an allowable voltage range of the load Z, the operation of the load Z becomes stable. A malfunction or an unexpected accident can be effectively prevented.

On the other hand, since the switching circuit 355 is turned on or off by the voltage detecting circuit 354 of a short time constant, the return time of the switching circuit 355 becomes time $T_1$ in FIG. 40a. As compared with the return time $T_2$ in the case where the voltage detecting circuit 354 is not provided, this return time $T_1$ is fairly reduced. That is, when the voltage detecting circuit 354 is not provided, the return time $T_2$ is determined by the relatively long discharge time constant of the capacitor $C_3$ and the off level $Y_2$ of the switching circuit 355. The return time $T_2$ becomes remarkably long and a high speed response cannot be performed. On the contrary, according to the foregoing construction, the on/off operation can be performed at a high speed.

Further, when the input voltage reaches $a_1$ in FIG. 41, the smoothed output voltage rises from point D on the load characteristic A to point E on the full load characteristic B or point I on the loadless characteristic H. However, the return voltage $a_1$ of the switching circuit 355 is decided by the resistor $R_{13}$ connected to the transistor $TR_4$ and is not influenced by the load impedance, so that the return voltage $a_1$ of the switching circuit 355 is always held constant. Therefore, there is no need to individually measure the response speed of the power source apparatus every load Z to be connected as in the conventional apparatus.

Another embodiment of the invention will be further described.

Figure 42A:
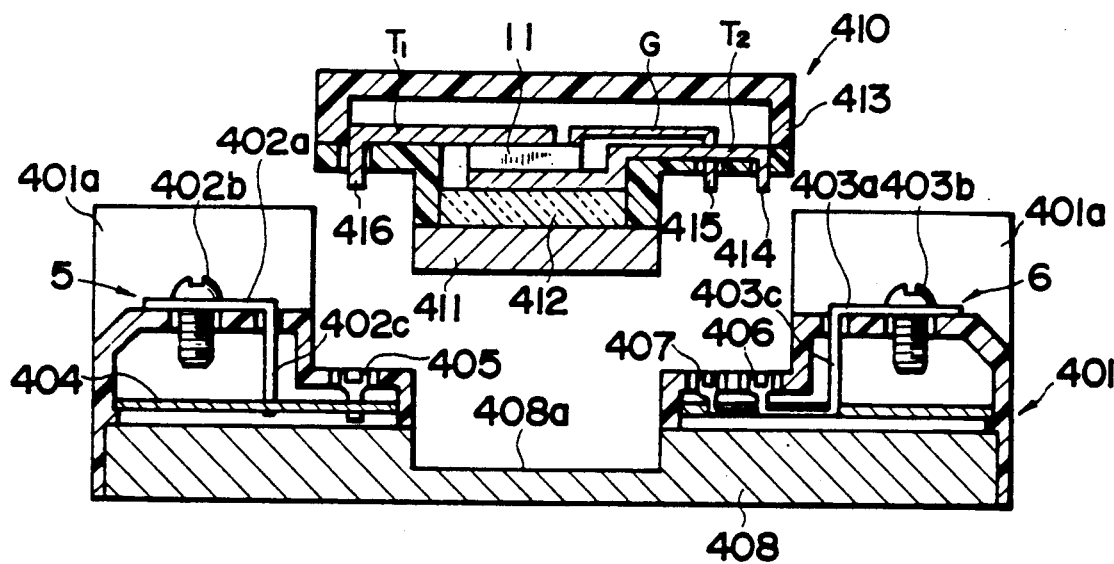
FIG. 42a is an exploded cross sectional view showing another embodiment of a solid state relay according to the invention.
Figure 42B:
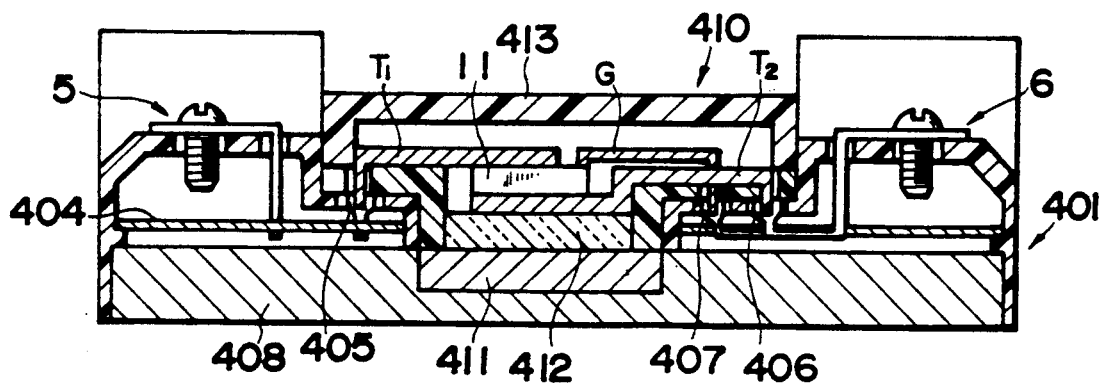
FIG. 42b is a cross sectional view showing a state in which the solid state relay is assembled.

FIG. 42a is an exploded cross sectional view of an embodiment of a solid state relay according to the invention. FIG. 42b is a cross sectional view showing an assembling state.

Figure 53:
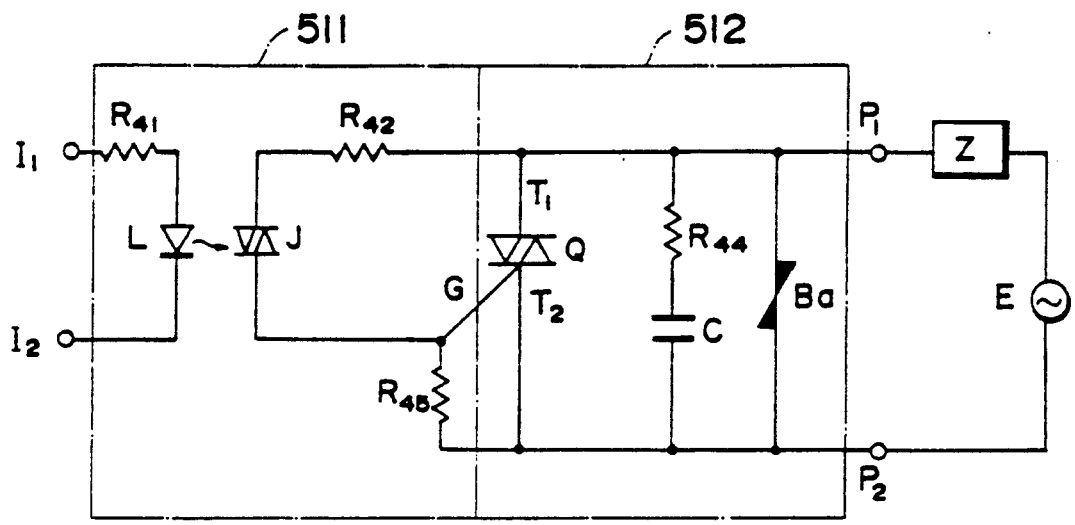
FIGS. 53 and 54 are a circuit diagram and a cross sectional view showing a conventional solid state relay.
Figure 54:
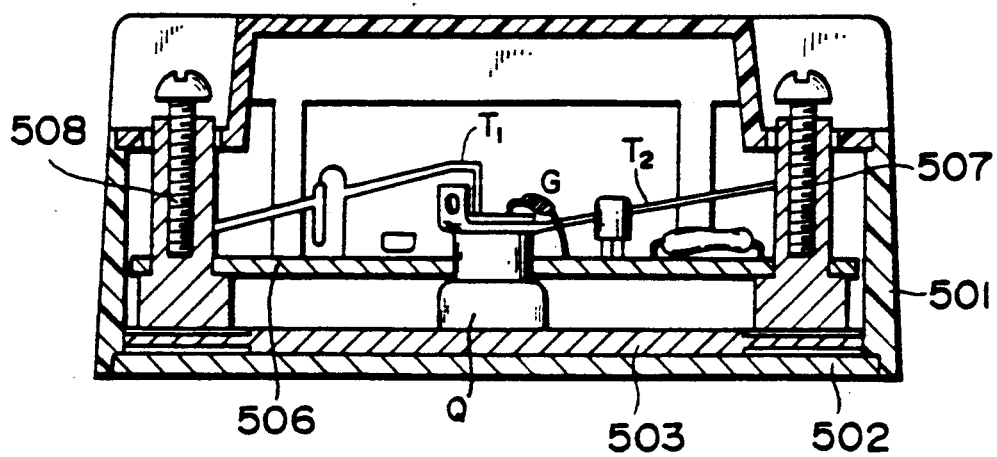
Figure 55:
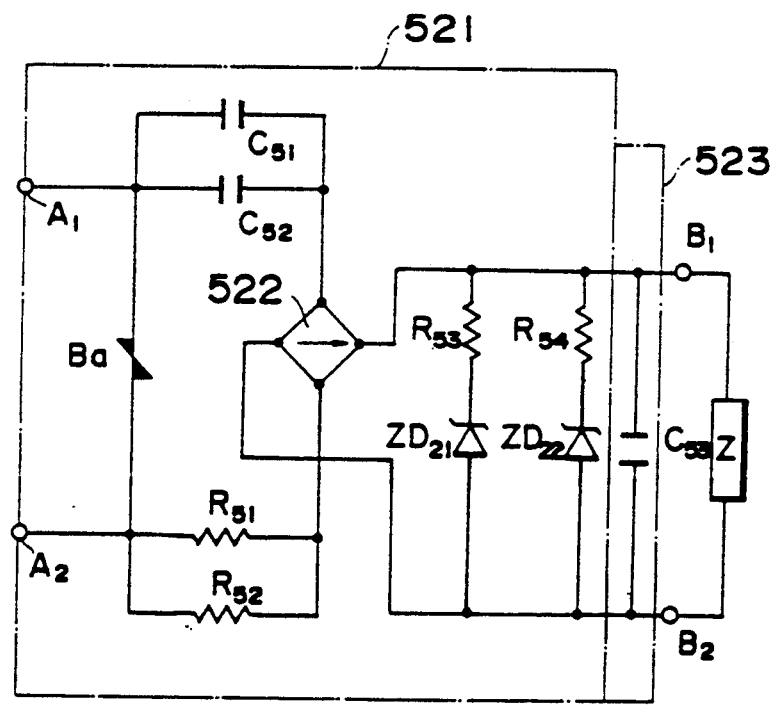
FIG. 55 is a circuit diagram showing an example of a conventional power source apparatus.
Figure 56:
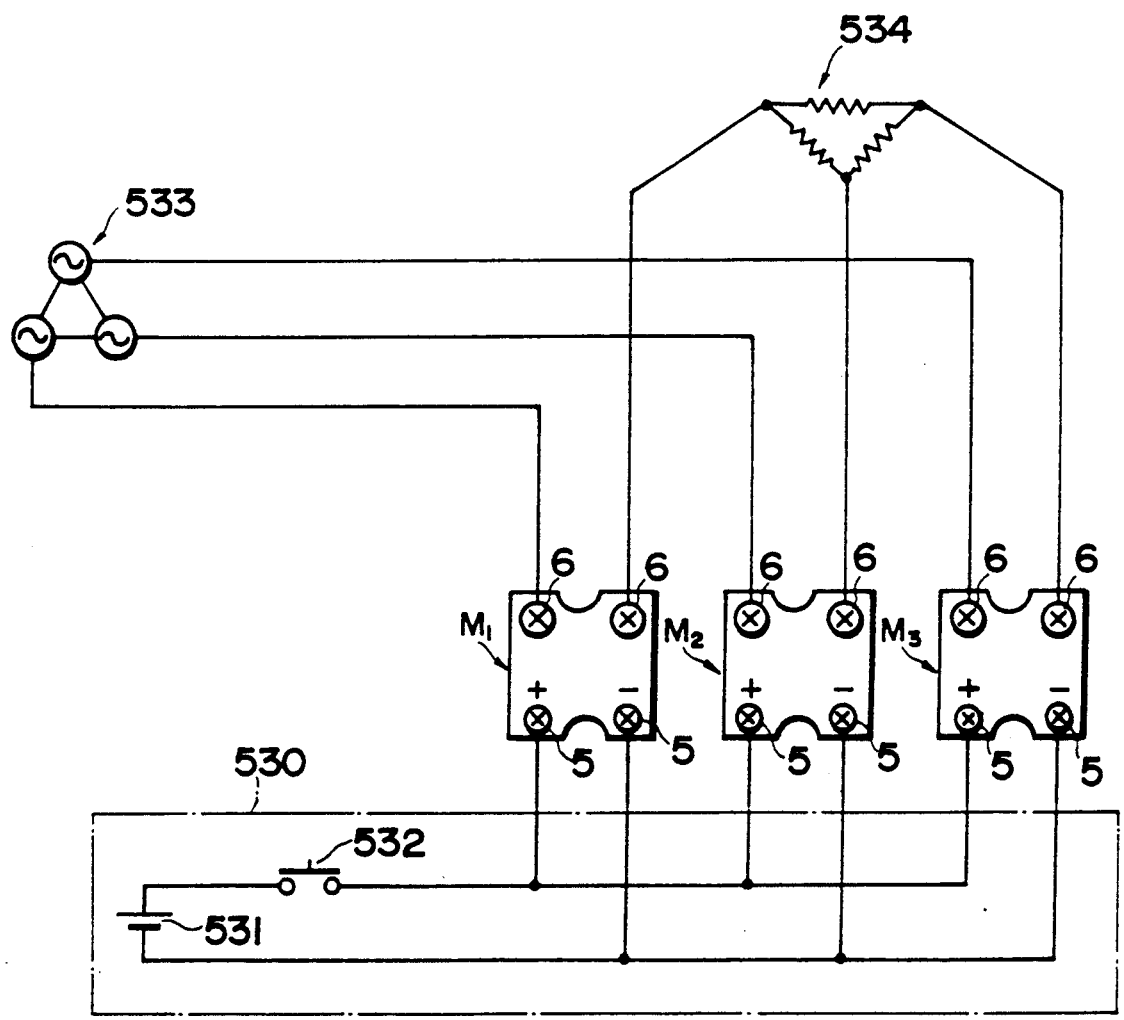
FIGS. 56 and 57 are explanatory diagrams of an example in which a conventional switching apparatus is used.
Figure 57:
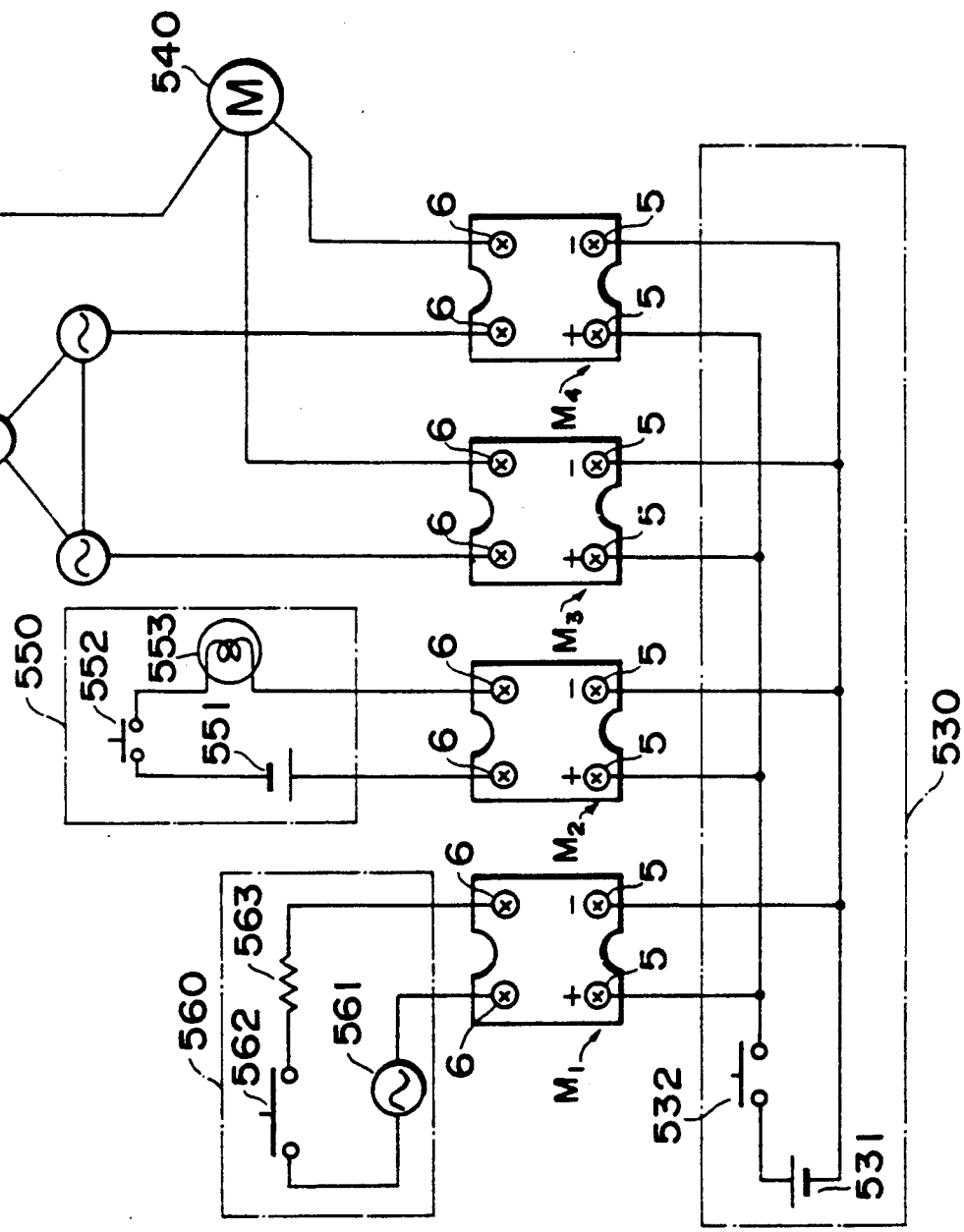
Figure 58:
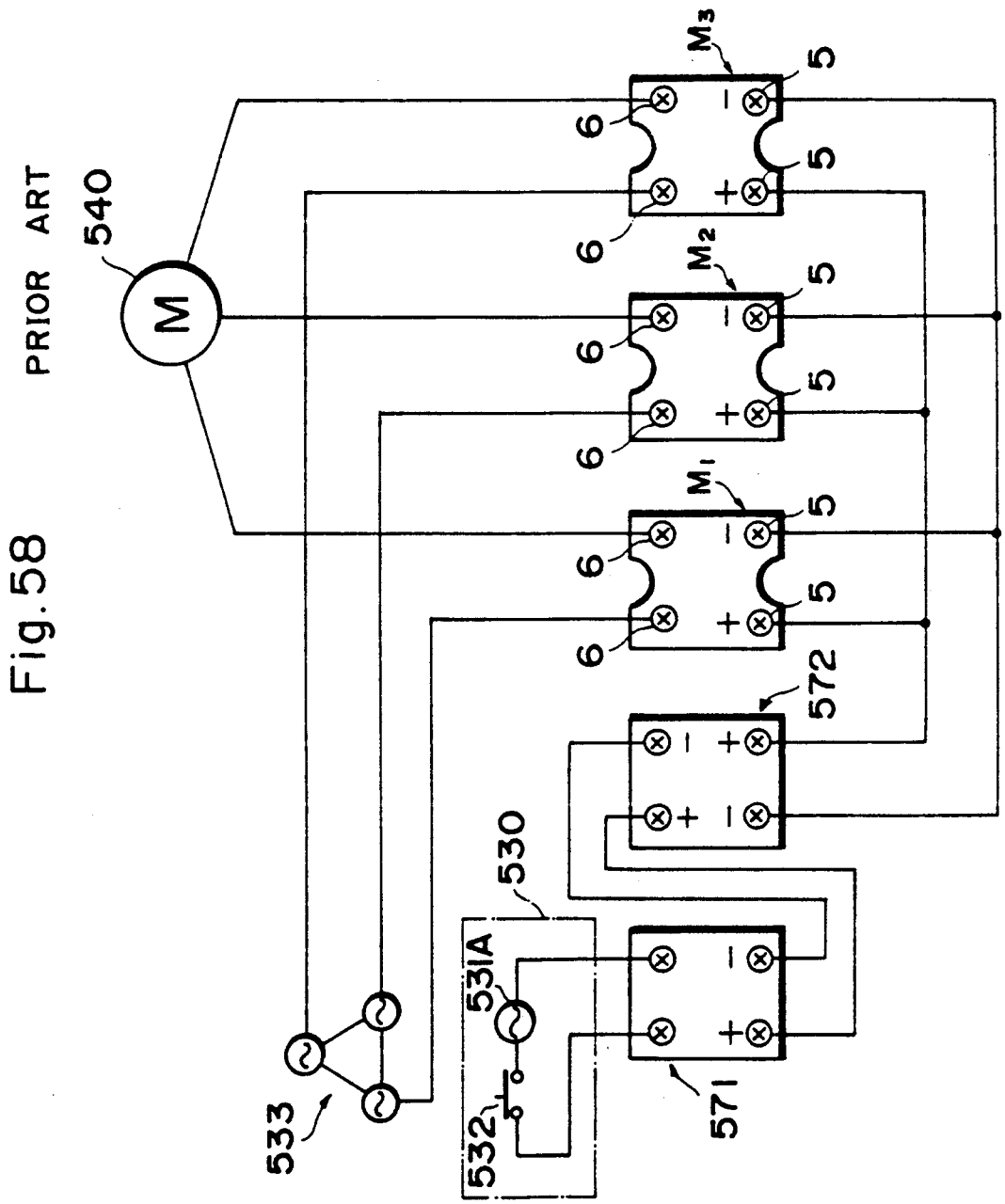
FIG. 58 is an explanatory diagram of another example in which a conventional solid state relay is used.

In the diagram, reference numeral 401 denotes a terminal base having the input terminals 5 and load terminals 6 and including a printed circuit board 404 therein. For instance, the input terminals 5 and load terminals 6 consist terminal members 402a and 403a and screws 402b and 403b, respectively and are set among a plurality of electric insulative barriers 401a. By brazing lead members 402c and 403c of the terminal members 402a and 403a to the wirings of the printed circuit board 404, they are electrically connected to a circuit of the board 404. The control circuit 511 and power circuit 512 (excluding the triac 11) shown in FIG. 53 are assembled on the printed circuit board 404.

Reference numerals 405, 406 and 407 denote connector terminals fixed to the terminal base 401. These connector terminals are pierced into a plurality of terminal holes formed in the terminal base 401, respectively. A heat radiating plate 408 is fixed to the terminal base 401. A concave portion 408a is formed in the central portion of the heat radiating plate 408.

A power element unit 410 has therein a semiconductor power element, e.g., the triac 11 separated from the power circuit 512. That is, reference numeral 411 denotes an auxiliary heat radiating plate which is fitted into the concave portion 408a. The triac 11 is fixed to the plate 411 through an electric insulative plate 412 made of ceramics. Lead terminals 414, 415 and 416 of the first and second electrodes $T_1$ and $T_2$ and a trigger terminal G of the triac 11 are led out to the outside of a casing 413 and are connected to the connector terminals 405, 406 and 407 fixed to the terminal base 401 at their front edges.

The operating of the above construction will now be described.

The load terminals 6 in FIG. 42a are connected to a power source E and a load Z. When fitting the power element unit 410 to the terminal base 401, the lead terminals 414, 415 and 416 of the first and second electrodes $T_1$ and $T_2$ and trigger terminal G of the triac 11 are connected to the connector terminals 405, 406 and 407. Further, the auxiliary heat radiating plate 411 is inserted into the concave portion 408a of the heat radiating plate 408. Thus, the power element unit 410 is fixed to the terminal base 401 as shown in FIG. 42b and the triac 11 is connected to the power circuit.

After completion of the wiring works mentioned above, when an input signal is supplied or shut off between the input terminals 5, a current is supplied or shut off from the power source E to the load Z through the triac 11 by the operation similar to that described in the conventional apparatus.

If the circuit between the load terminals 6 is short-circuited due to an unexpected accident during the current supply to the load Z, an abnormal current flows through the triac 11, so that the triac is broken. On the other hand, even in the rated current supply state, there is a case where the triac 11 deteriorates with an elapse of time and is broken due to the heat generation based on a large current flowing through the triac 11.

In this case, as shown in FIG. 42a, only the power element unit 410 is removed from the terminal base 401 and is exchanged to a new power element unit and this new power element unit is fixed to the terminal base 401. Thus, the other electronic parts and the like constructing the control circuit and power circuit assembled on the terminal base 401 can be effectively used. The number of vain parts can be reduced and the apparatus becomes fairly economical and cheap. Also, the triac 11 can be extremely easily exchanged.

Although the embodiment has been described with respect to the case where the auxiliary heat radiating plate 411 is fitted into the concave portion 408a of the heat radiating plate 408, as shown in FIG. 43a, it is also possible to construct such that a male screw 411a is formed on the outer peripheral surface of the disk-shaped auxiliary heat radiating plate 411 and the plate 411 is screwed into a female screw 408b of the concave portion 408a of the heat radiating plate 408. In this case, the lead terminals 414, 415 and 416 of the first and second electrodes $T_1$ and $T_2$ and trigger terminal G of the triac 11 are come into pressure contact with the connector terminals 405, 406 and 407 and are electrically connected, respectively as shown in FIG. 43b.

On the other hand, in FIGS. 42a to 43b, in order to raise the heat radiating effect, it is recommended that the auxiliary heat radiating plate 411 is made of a material having a coefficient of thermal expansion higher than that of the heat radiating plate 408 and the contact pressure between both of the heat radiating plates 408 and 411 is increased when the triac 11 generates the heat and heat conductivity is improved.

Figure 44A:
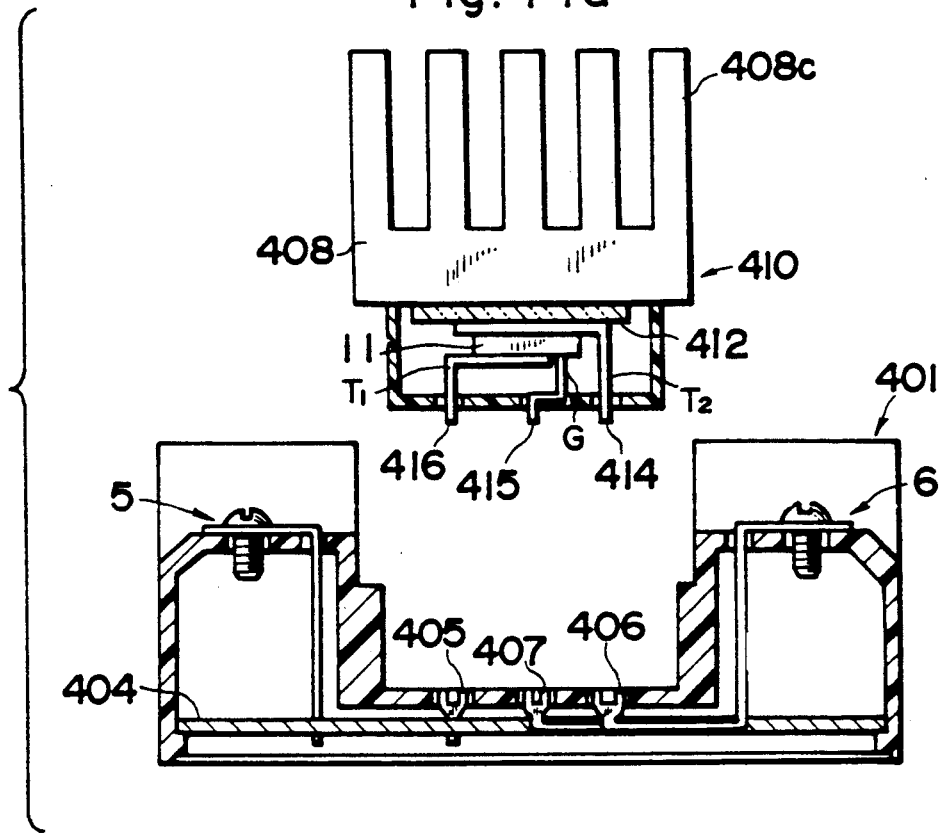
Figure 44B:
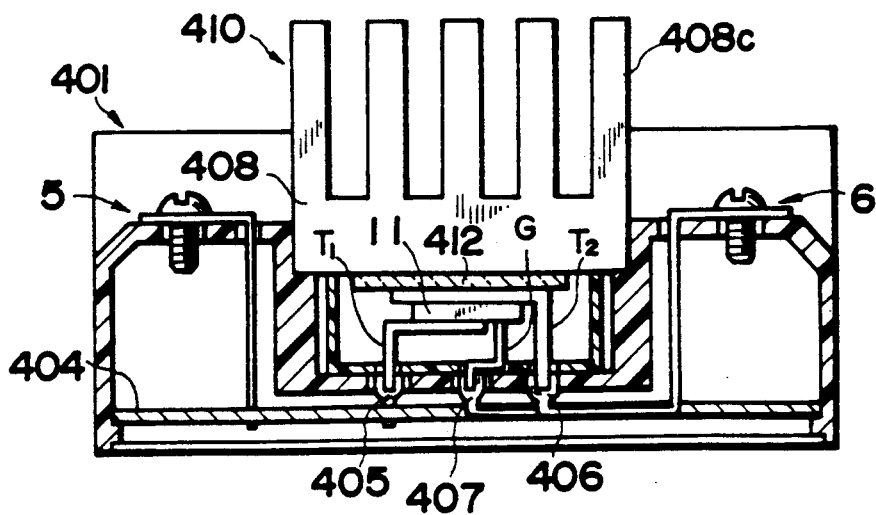

Further, although the embodiment has been described with respect to the case where the heat radiating plate 408 is attached to the terminal base 401, as shown in FIGS. 44a and 44b, it is also possible to construct the power element unit 410 by assembling the triac 11 to the heat radiating plate 408 on which fins 408c are projected and formed.

FIGS. 45 a and 45b show an example in which the switching apparatus according to the invention is applied to a solid state relay.

In the diagrams, reference numeral 421 denotes a rectangular parallelepiped relay main body made of a synthetic resin. Pair of input terminals 5 of the screw fastening type are exposed and provided in the left side portion. Pair of load terminals 6 of the screw fastening type are provided in the upper and lower side portions of the relay main body 421. For example, as shown in FIG. 2, the relay main body 421 includes the control circuit 9 having the input circuit 7 and trigger circuit 8 and the power circuit 13 having the power semiconductor element 11 and absorber 12.

A pair of coupling terminals 433 are formed on the right side surface of the relay main body 421. The coupling terminals 433 are connected to the input terminals 5 through lead wires 435, respectively. A U-shaped notched portion 433a is formed at each front edge of the coupling terminals 433 and is detachably fastened and connected to the input terminal 5 of another solid state relay.

Figure 46:
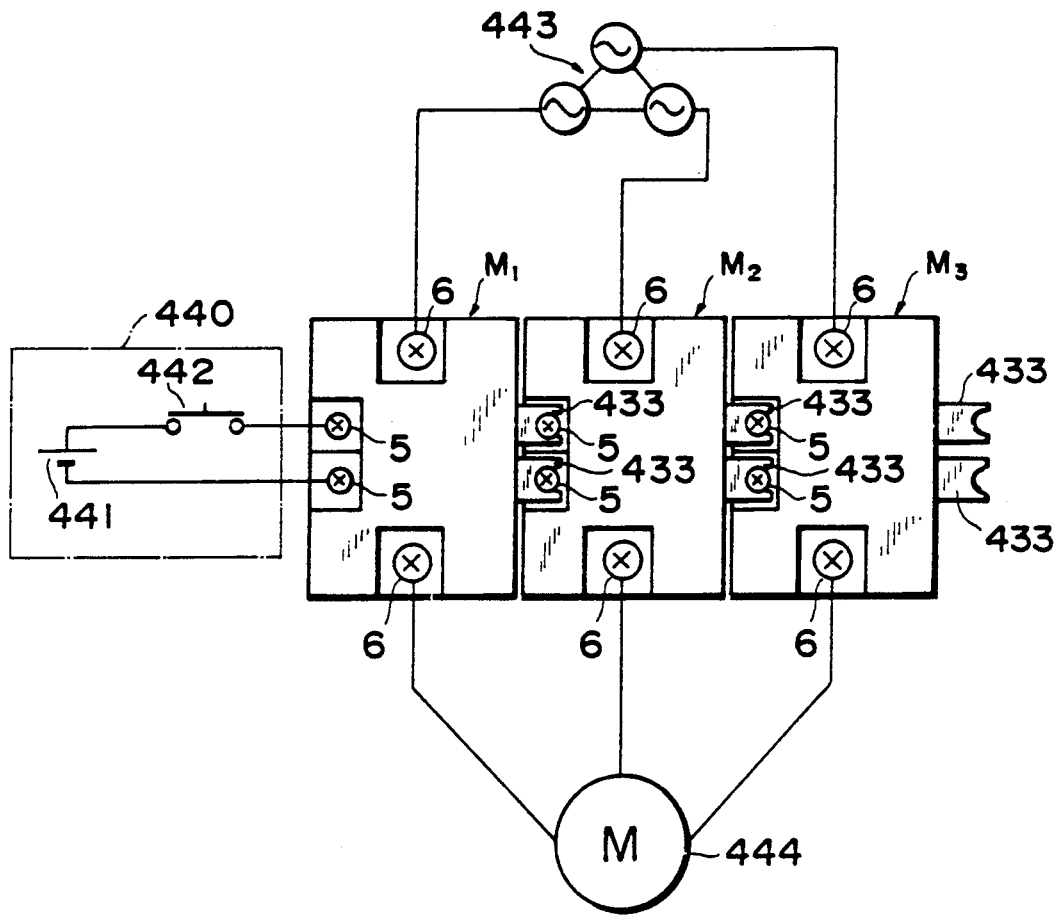
FIG. 46 is an explanatory diagram showing an example in which a solid state relay is used.

An example of using the solid state relay will now be described with respect to the case of on/off switching a three-phase AC motor. First, as shown in FIG. 46, three solid state relays $M_1$, $M_2$ and $M_3$ are prepared. The front edges of the pair of coupling terminals 433 of the first solid state relay M1 are inserted into the pair of input terminals 5 of the second solid state relay $M_2$ and are respectively coupled by screwing and fastening. Similarly, the pair of coupling terminals 433 of the second solid state relay $M_2$ are connected to the pair of input terminals 5 of the third solid state relay $M_3$, respectively. Each phase of a 3-phase power source 443 is connected to one load terminal 6 of each of the solid state relays $M_1$ to $M_3$. A motor 444 is connected to the other load terminals 6. An input operating circuit 440 consisting of a DC power source 441 and an operating switch 442 is connected to the pair of input terminals 5 of the first solid state relay $M_1$. By turning on the switch 442, the motor 444 can be on/off controlled through the first to third solid state relays $M_1$ to $M_3$.

That is, by connecting the input operating circuit 440 to the input terminals 5 of the first solid state relay $M_1$, the input terminals 5 of the solid state relays $M_1$ to $M_3$ are connected through the coupling terminals 433. In other words, the input terminals 5 are connected in parallel with the input operating circuit 440. Thus, the complicated wiring works of this portion can be omitted and those component parts can be easily installed. The space for wiring is also reduced.

Figure 47A:
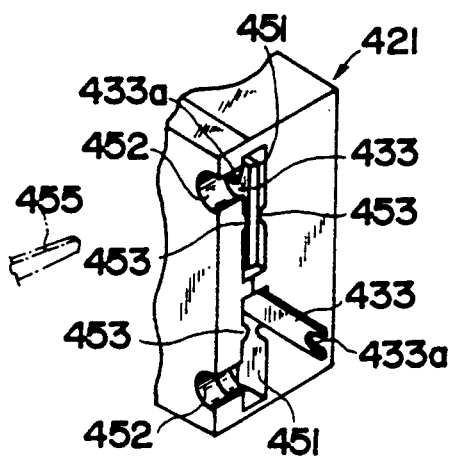
FIGS. 47a and 47b are a partial perspective view and a partial front view showing a modified structure of the main section of the switching apparatus of the invention, respectively.
Figure 47B:
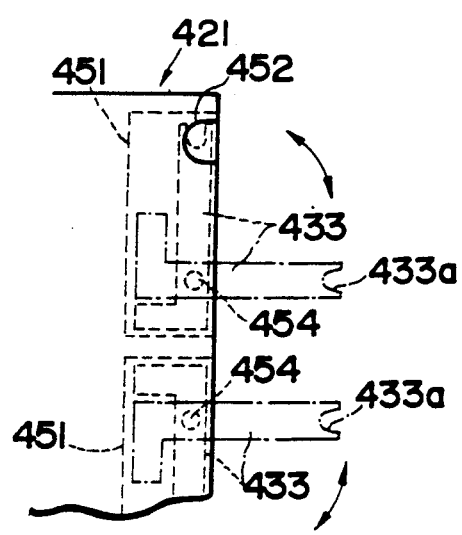

FIGS. 47a and 47b show a modified structure of the main section of the invention. In the diagrams, reference numeral 451 denotes a coupling terminal enclosing concave portion formed on the left side surface of the relay main body 421. The coupling terminals 433 are enclosed in the concave portion 451 and each base end side is pivotally supported to the relay main body 421 by a pin 454. Reference numeral 452 denotes a groove portion formed on the relay main body 421 in correspondence to the notched portion 433a at each front edge of the coupling terminals 433 in the enclosing state. By hooking a tool 455 like a driver to the notched portions 433a through the groove portions 452 and opening it, the coupling terminals 433 are pulled out of the concave portions 451 and are projected to the left side surface of the relay main body 421. Reference numeral 453 denotes projections which are come into pressure contact with the coupling terminals 433 when enclosing.

In this case, the invention can be also applied to the use example mentioned above and the coupling terminals 433 can be enclosed into the concave portions 451 when they are not used, so that they can be easily handled and there is no fear of breakage. On the other hand, when the coupling terminals 433 are unnecessary as in the third solid state relay $M_3$ shown in FIG. 46 these coupling terminals 433 can be enclosed, so that the occurrence of an unexpected short-circuit accident or the like can be prevented.

Although the above embodiment has been described with respect to the example in which the switching apparatus is used as the solid state relay, the invention can be applied to not only the contact type relay but also other switching apparatuses. The use example of these switching apparatuses is not limited to the case shown in FIG. 46. Further, as a coupling structure between the coupling terminals 433 of the relay main body 421 and the input terminals 5 of another relay main body 421, other connecting means such as a socket type can be also properly used.

Figure 48:
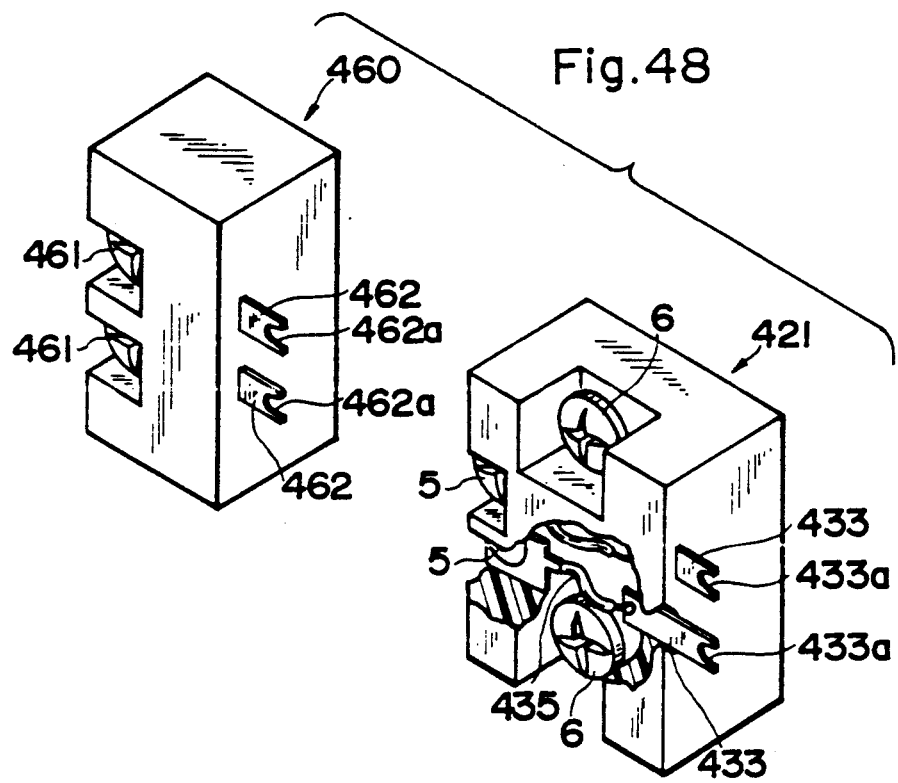
FIG. 48 is a perspective view showing an example in which the switching apparatus according to the invention is applied to a solid state relay.

FIG. 48 shows an example in which still another switching apparatus according to the invention is applied to a solid state relay.

In the diagram, the construction of the relay main body 421 is the same as that shown in FIGS. 45a and 45b.

Reference numeral 460 denotes a functional circuit unit, e.g., a voltage detecting circuit unit. This unit has a pair of input terminals 461 of the screw fastening type in the left side portion and a pair of output terminals 462 in the right side portion. U-shaped notched portions 462a are formed at the front edges of the output terminals 462 and are constructed as couplings terminals which can be fastened and connected to the pair of input terminals 5 of the relay main body 421 or to the input terminals of another functional circuit unit. For example, as shown in FIG. 49, the voltage detecting circuit unit 460 has therein a voltage detecting circuit 465.

Figure 49:
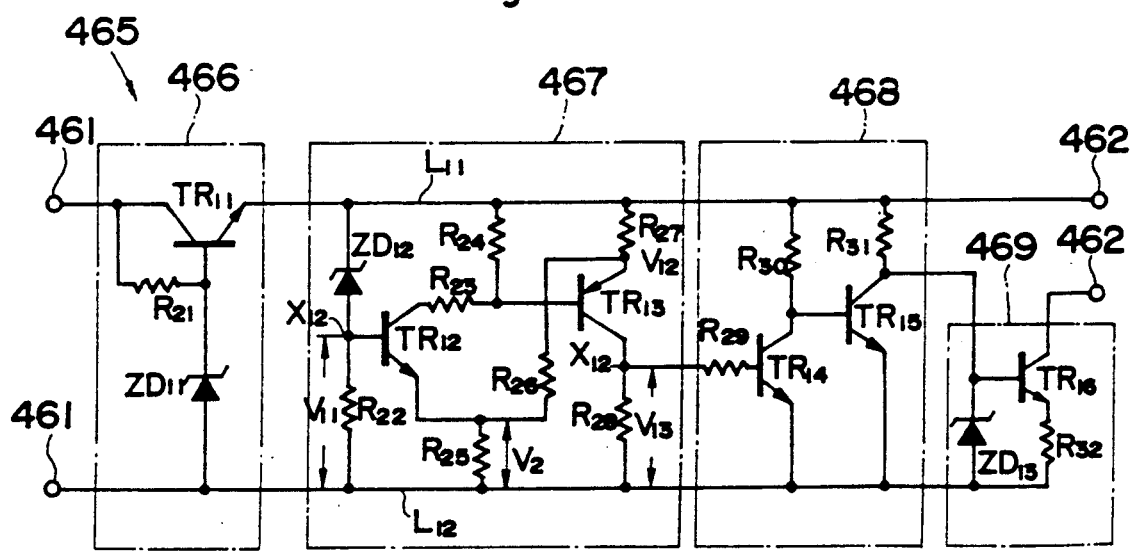
FIG. 49 is a circuit diagram showing an example of a voltage detecting circuit in a functional circuit unit which is connected to the solid state relay.

In FIG. 49, reference numeral 466 denotes a constant voltage circuit connected to the pair of input terminals 461. The constant voltage circuit 466 has a transistor $TR_{11}$, a resistor $R_{21}$, and a Zener diode $ZD_{11}$. A Schmitt circuit 467 is connected at the post stage of the constant voltage circuit 466 and has transistors $TR_{12}$ and $TR_{13}$, a Zener diode $ZD_{12}$, and resistors $R_{22}$ to $R_{27}$. A series circuit of the Zener diode $ZD_{12}$ and resistor $R_{22}$ is connected between output lines $L_{11}$ and $L_{12}$ of the constant voltage circuit 466. An amplifier 468 has transistors $TR_{14}$ and $TR_{15}$ and resistors $R_{29}$ to $R_{31}$. A constant current circuit 469 has a transistor $TR_{16}$, a Zener diode $ZD_{13}$, and a resistor $R_{32}$. When an input signal current which is applied between the input terminals 461 gradually increases to a rated value, when a potential $V_{11}$ at a node $X_{11}$ of the Schmitt circuit 467 is smaller than an emitter potential $V_{12}$ of the transistor $TR_{13}$, the transistors $TR_{12}$ and $TR_{13}$ are non-conductive and an output from a node $X_{12}$ is zero. However, when the potential $V_{11}$ exceeds the potential $V_{12}$, the transistors $TR_{12}$ and $TR_{13}$ are instantaneously made conductive, so that a steep potential $V_{13}$ is generated at the node $X_{12}$. The output potential $V_{13}$ from the Schmitt circuit 467 is amplified, the constant current circuit 469 is made operative, and a square wave-shaped output is sent to the output terminals 462.

Figure 50:
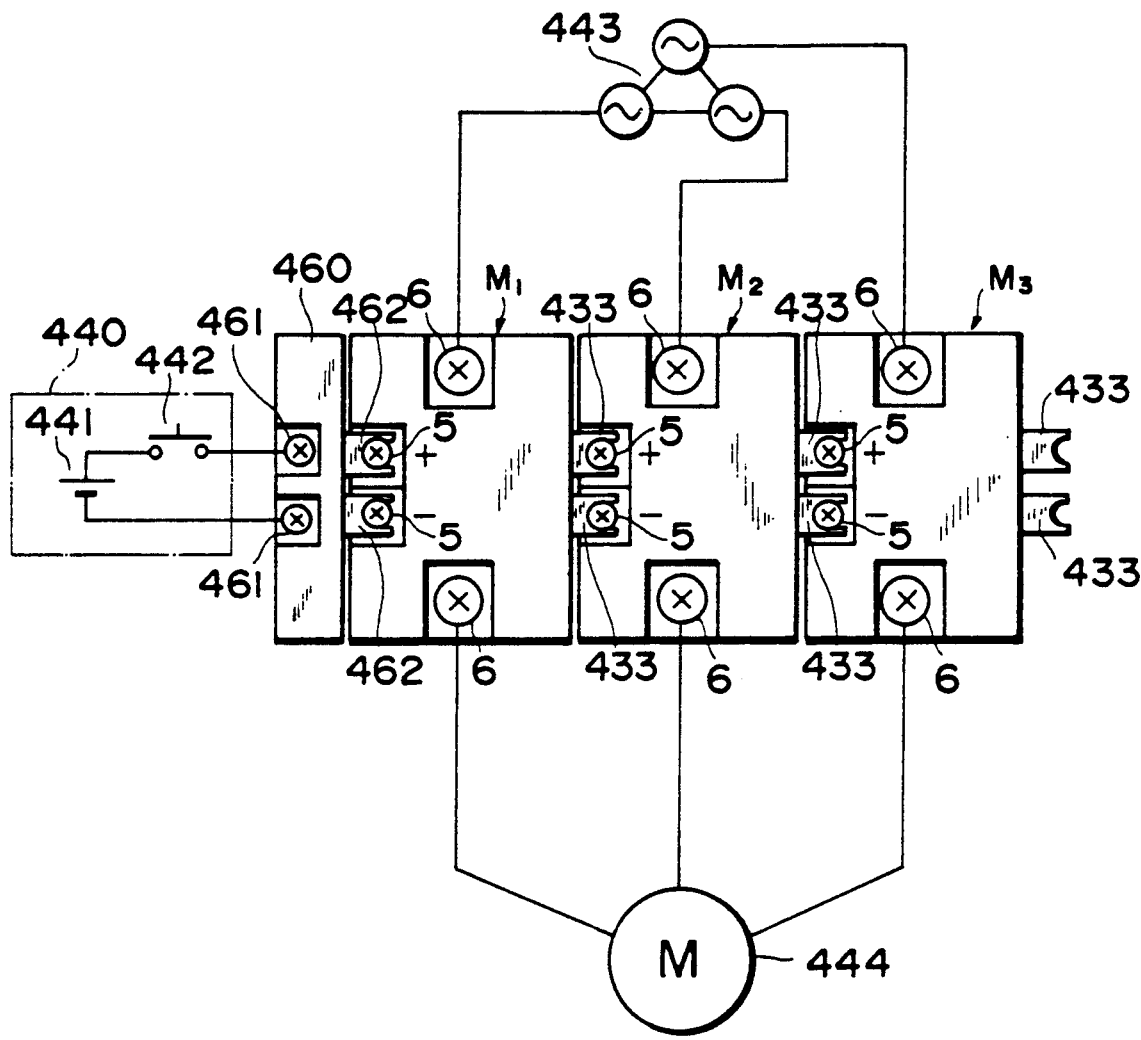
FIG. 50 is an explanatory diagram of an example in which the solid state relay of the invention is used.

An example of use of the foregoing solid state relay will now be described with respect to the case of on/off controlling the 3-phase AC motor with reference to FIG. 50. The mutual connection among the three solid state relays $M_1$, $M_2$ and $M_3$ using the coupling terminals 433 and the connection among these relays, the power source 443 and the motor 444 are the same as those shown in FIG. 46.

On the other hand, the pair of output terminals 462 of the voltage detecting circuit unit 460 are inserted into the pair of input terminals 5 of the relay main body 421 of the first relay $M_1$ and are fastened and coupled. Further, the input operating circuit 440 having the DC power source 441 and operating switch 442 is connected to the pair of input terminals 461 of the voltage detecting circuit unit 460. By turning on the operating switch 442 of the input operating circuit 440, the voltage detecting circuit 465 in the voltage detecting circuit unit 460 operates. A square wave-shaped output signal is simultaneously applied from the voltage detecting circuit 465 to the input terminals 5 of the first to third relays $M_1$ to $M_3$. Thus, the motor 444 is on/off controlled through the relay circuits of the relays $M_1$ to $M_3$.

Since the voltage detecting circuit 465 is not included in the relay main body 421 but is constructed as the independent unit 460, the user or the like can select the use of the voltage detecting circuit unit 460 in accordance with the necessity of the voltage detecting circuit 465. On the other hand, since the output terminals 461 of the unit 460 can be detachably coupled with the relay main bodies 421 ($M_1$ to $M_3$), the wiring works can be reduced, the working time upon installation can be decreased, and the installation space also decreases.

Figure 51:
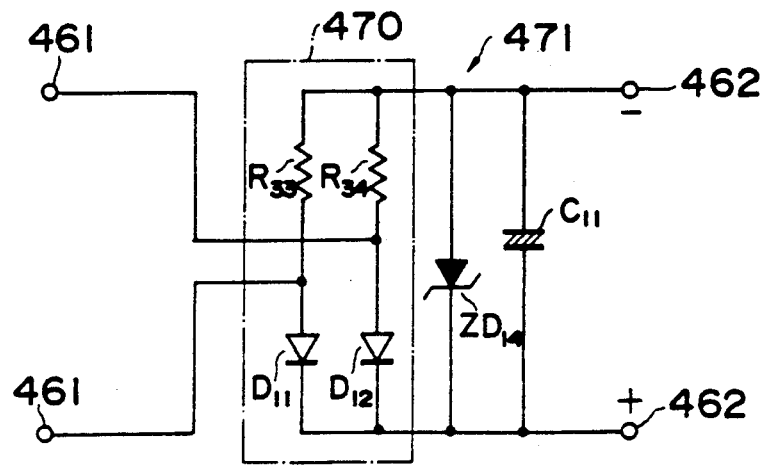
FIG. 51 is a diagram showing an example of another circuit of a functional circuit unit which is connected to the solid state relay.
Figure 52:
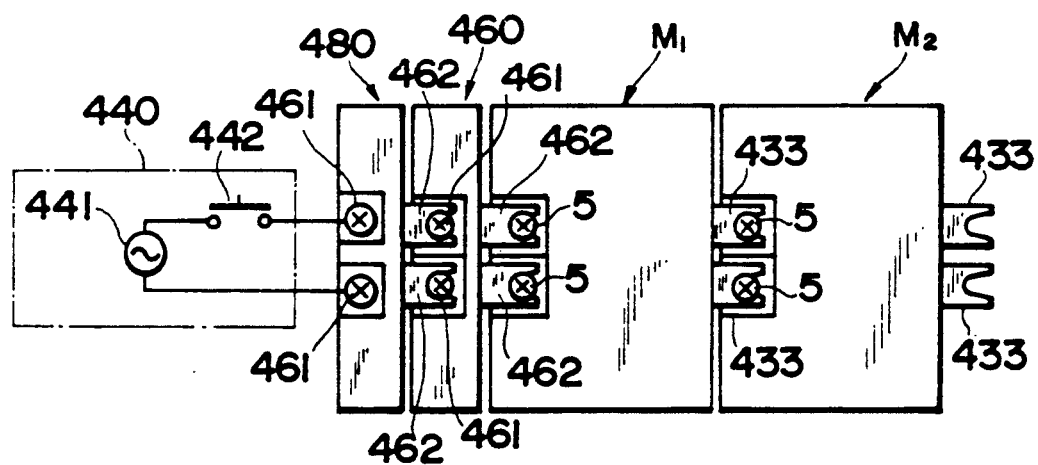
FIG. 52 is an explanatory diagram of an example in which different kinds of functional circuit unit and relay main body are combined.

Although the embodiment has been described with respect to the example in which the voltage detecting circuit unit 460 is used a functional circuit unit, the invention is not limited to this example. For instance, as shown in FIG. 51, an AC/DC converter 471 comprising a half wave rectifier 470 having resistors $R_{33}$ and $R_{34}$ and rectifying diodes $D_{11}$ and $D_{12}$, a Zener diode $ZD_{14}$ for voltage regulation, and a smoothing capacitor $C_{11}$ can be also constructed as a functional circuit unit (AC/DC converter unit) 480. In this case, as shown in FIG. 52, the AC/DC converter unit 480 to which the input operating circuit 440 having the AC power source 441 and operating switch 442 is connected and the foregoing voltage detecting circuit unit 460 are coupled. Further, the voltage detecting circuit unit 460 and the relay main body $M_1$ are coupled. Due to this, a solid state relay with a voltage detecting function for AC input can be easily prepared.

The coupling structure of the output terminals 462 of the functional circuit units 460 and 480 and the relay main body 421 and the like is not limited to the foregoing example but other means such as a socket structure or the like can be also used. It is also possible to construct such that the output terminals 462 are set to be rotatable and enclosing concave portions for the output terminals 462 are formed in the unit 460 or 480.

What is claimed is:

1. A solid state relay comprising:
   a radiator having a base portion and a plurality of fins extending from this base portion;
   a control circuit block which has a pair of input terminals and a pair of load terminals (6) and is attached to a front surface of the base portion of said radiator; and
   a power circuit cartridge including therein a power semiconductor element which is turned on or off by a control circuit in said control circuit block, an absorber which is connected between said pair of load terminals, and a heat radiating plate to radiate heat of said power semiconductor element, said power circuit cartridge being detachably attached to the control circuit block so as to be electrically connected thereto,
   wherein a through space is formed in the control circuit block so as to pierce from a front surface of the control circuit block to the front surface of the base portion of the radiator, the power circuit cartridge is inserted into said through space, and the heat radiating plate of the power circuit cartridge is joined to a portion of the base portion front surface of the radiator.

2. A relay according to claim 1, wherein an attaching device is attached to the first edge side of said plurality of fins of said radiator.

3. A relay according to claim 1, wherein a ventilating groove is formed on outer surfaces on both sides of said control circuit block so as to provide cooling to reach from a front surface thereof to said radiator.

4. A relay according to claim 1, wherein holes to fix attaching members which extend in the surface direction of said fins are formed on both edge surfaces of said base portion of the radiator.

5. A relay according to claim 1, wherein a coupling member formed integrally with said plurality of fins is provided in order to couple the front edges of the plurality of fins of the radiator.

6. A relay according to claim 1, further comprising:
   a pair of rib walls formed along a pulling-out molding direction of said radiator so as to be located at both ends in a width direction in a front edge portion of said fins;
   grooves formed on opposite surfaces of said rib walls, respectively;
   an attaching base plate which is inserted into said grooves and is fixed to the radiator by caulking means; and
   attaching members which are projected and formed on both ends in said pulling-out molding direction of said attaching base plate.

7. A relay according to claim 6, wherein said attaching base plate is fixed to the radiator by caulking both of said rib walls inwardly.

8. A relay according to claim 1, further comprising:
   a setting wall for attaching which is formed integrally with said plurality of fins and couples the front edges of the plurality of fins of said radiator;
   a pair of rib walls formed along a longitudinal direction so as to be located on both sides in a width direction of said attaching setting wall;
   grooves formed on opposite surfaces of said rib walls;
   an attaching base plate made of metal which is inserted into said grooves and caulked to the radiator and in which attaching members are respectively projected and formed on both ends in a longitudinal direction and the other end portion side is formed like a stairway;
   a pair of vertical wall members which are bent and formed on both sides in a width direction so as to be located on one end side in the longitudinal direction of said attaching base plate and have an inserting groove into which one rail member portion of a rail member is inserted and a supporting projecting portion to support said rail member portion at a position remote from said rib walls and are vertically standing for said setting wall surface;
   a notched hole formed in the stairway portion of said attaching base plate;
   a metal fixture rail having an almost U-shaped cross sectional view which is enclosed in a space between the other end portion of the attaching base plate and said setting wall and is provided so as to be movable forward and backward in the longitudinal direction of the attaching base plate;

an engaging portion which is formed on one end side of said fixture rail and is projected from said notched hole and engages with the other rail member portion of said rail member;

a supporting member which is formed on the attaching base plate and supports the other rail member portion at a position remote from the rib walls;

a spring seat member which is formed on a bottom wall of said fixture rail by being cut and bent upward;

a restricting member which is bent and formed at the other end in the longitudinal direction of the attaching base plate and comes into contact with an edge surface of said setting wall;

a coil spring which is interposed between said spring seat member and said restricting member and applies a spring force in a progressing direction of the fixture rail;

a long hole which is formed in the bottom wall of the fixture rail and pierces said restricting member and guides the forward/backward movement of the fixture rail; and an operating member which is formed at the other end of the fixture rail, for disengaging said rail member portion.

9. A relay according to claim 1, further comprising:
a pair of coupling terminal members which are respectively electrically connected to said pair of input terminals and are rotatably pivotally supported to said control circuit block and are enclosed such that they can be projected from a side surface in a width direction of the control circuit block; and a terminal cover which is detachably attached to the control circuit block and keeps said coupling terminal members at enclosed positions.

10. A relay according to claim 1, having a concave or convex engaging portion formed on the base portion of said radiator and a convex or concave groove engaging portion formed on a casing of the control circuit block, and wherein said control circuit block is detachably attached to the radiator due to these engaging portions.

11. A relay according to claim 1, wherein said control circuit block comprises:
a base made of a synthetic resin having a pair of load terminal setting boss portions which are projected and formed like base plates;

a casing made of a synthetic resin which engages with said base;

a printed circuit board which is enclosed between said base and said casing and is arranged near said boss portions;

concave portions formed on upper surfaces of the boss portions;

a pair of load terminal nuts which are respectively inserted and held in said concave portions;

a pair of terminal plates for a trigger signal which have lead members and are respectively arranged on upper surface of the boss portions and are electrically joined and fixed to said printed circuit board through said lead members;

a pair of load terminals which are formed by a pair of opposite hooks so as to have an almost U-shape and are arranged on the upper surfaces of the boss portions so as to ride over the boss portions and are exposed from a pair of load terminal exposed windows formed in said casing;

projections which are formed on side surfaces of the boss portions and engage with said hooks; and a pair of load terminal screws which pierce said load terminals and are threadably inserted into said nuts.

12. A solid state relay in which a relay main body having therein a control circuit which receives an input signal and controls a power semiconductor element is adapted to be attached to a front surface of a base portion of a radiator having a fin portion,
wherein ventilating grooves are provided in the middle portion of sidewalls on both sides of said relay main body so as to provide cooling to said radiator.

13. A solid state relay in which a relay main body having therein a control circuit which receives an input signal and drives and controls a power semiconductor element is adapted to be attached to a front surface of a base portion of a radiator having a fin portion,
wherein front edges of a plurality of fins constructing said fin portion are coupled by a coupling member having a flange portion wherein said coupling member is formed integrally with said fins.

14. A solid state relay comprising:
a relay main body having a pair of input terminals and a pair of load terminals; and a pair of coupling terminal members which are respectively electrically connected to said pair of input terminals and are rotatably pivotally supported to said relay main body and are disposed such that they can be projected from a side surface of the relay main body, wherein a terminal cover (14) to keep said pair of coupling terminal members at an enclosed position is detachably attached to the relay main body.

15. A solid state relay comprising:
a radiator having a base portion and fins extending from this base portion;

a control circuit block including a printed circuit board having a pair of input terminals, a pair of load terminals, and a control circuit, said control circuit block being attached to a front surface of a base portion of said radiator; and a power circuit cartridge including therein a power semiconductor element which is turned on or off by the control circuit in said control circuit block, an absorber which is connected between said pair of load terminals and a heat radiating plate to radiate heat of said power semiconductor element said power circuit cartridge being detachably attached to the radiator so as to be electrically connected to the control circuit block, wherein said control circuit block has a box-shaped enclosing portion to enclose the printed circuit board, at least two groove portions are formed on the front surface of the base portion of said radiator, said box-shaped enclosing portion in inserted into one of said groove portions and in this inserting state, said printed circuit board is vertical to the base portion front surface, and said power circuit cartridge is inserted into the other groove portion.

16. A relay according to claim 15, wherein an attaching device is provided at front edges of the fins of said radiator.

17. A relay according to claim 15, wherein holes to fix attaching members which extend in the surface direction of said fins are formed on both end surfaces of the base portion of the radiator.

18. A relay according to claim 15, wherein in the state in which said power circuit cartridge is inserted into the other groove portion, said heat radiating plate is vertical to the base portion front surface of the radiator and is exposed from a casing of the power circuit cartridge, so that the heat radiating plate comes into contact with an inner wall of the groove portion and transfers the heat of the power semiconductor element to the radiator.

19. A relay according to claim 18, wherein a leaf spring to press the heat radiating plate to an inner wall of the groove portion so as to come into contact therewith is attached to the casing.

20. A relay according to claim 15, wherein said power circuit cartridge comprises:

an electrical insulative almost box-shaped casing having an opening to expose the heat radiating plate;

a power semiconductor element block comprising said power semiconductor element, a plurality of terminals for this power semiconductor element, said heat radiating plate, and an insulative plate arranged between the power semiconductor element and an inner surface of the heat radiating plate, when said power semiconductor element block is enclosed into said casing, the heat radiating plate being exposed from said exposing opening; and external connecting terminal members which are continuously formed to said plurality of terminals and are led out to positions where they are projected from the casing to the outside.

21. A relay according to claim 20, wherein a gap is formed between the periphery of said heat radiating plate and the periphery of said insulative plate and a bridge-shaped portion which is inserted into said gap to guide is formed integrally with said casing.

22. A relay according to claim 15, wherein a housing of said power circuit cartridge is constructed by a casing in which said power semiconductor element block is enclosed and a cover attached to this casing, connecting blade members which are connected to sockets of said control circuit block are respectively continuously formed to a plurality of terminals of the power semiconductor elements, said connecting blade members are arranged by being projected from an opening of the casing to the outside, roots of the connecting blade members are inserted into inserting portions formed on the printed circuit board for setting an absorber and are electrically connected and fixed to said printed circuit board by soldering, and the printed circuit board is sandwiched by the casing and the cover.

23. A relay according to claim 22, wherein slits to position said connecting blade members when said cover is attached to the casing are formed in said cover.

* * * * *